United States Patent
Yokokawa et al.

(10) Patent No.: US 8,209,581 B2
(45) Date of Patent: Jun. 26, 2012

(54) RECEIVING APPARATUS AND METHOD AND PROGRAM FOR RECEIVING AND DECODING A LOW DENSITY PARITY CHECK CODE

(75) Inventors: Takashi Yokokawa, Kanagawa (JP); Satoshi Okada, Tokyo (JP); Osamu Shinya, Tokyo (JP)

(73) Assignee: Sony Corporation, Tokyo (JP)

( * ) Notice: Subject to any disclaimer, the term of this patent is extended or adjusted under 35 U.S.C. 154(b) by 922 days.

(21) Appl. No.: 12/253,347

(22) Filed: Oct. 17, 2008

(65) Prior Publication Data

US 2009/0106622 A1    Apr. 23, 2009

(30) Foreign Application Priority Data

Oct. 19, 2007 (JP) ................ P2007-272518

(51) Int. Cl.
*G06F 11/00* (2006.01)
(52) U.S. Cl. .................. 714/752; 714/801; 714/804
(58) Field of Classification Search ............ 714/752, 714/801, 804
See application file for complete search history.

(56) References Cited

U.S. PATENT DOCUMENTS

| | | | | | |
|---|---|---|---|---|---|
| 6,757,122 | B1 * | 6/2004 | Kuznetsov et al. | ............ | 360/53 |
| 7,055,090 | B2 * | 5/2006 | Kikuchi et al. | ............ | 714/801 |
| 7,281,192 | B2 * | 10/2007 | Shen et al. | ............ | 714/757 |
| 7,590,914 | B2 * | 9/2009 | Kim et al. | ............ | 714/752 |
| 8,028,216 | B1 * | 9/2011 | Yeo et al. | ............ | 714/755 |
| 2004/0194007 | A1 * | 9/2004 | Hocevar | ............ | 714/801 |
| 2005/0204271 | A1 * | 9/2005 | Sharon et al. | ............ | 714/801 |
| 2007/0011573 | A1 * | 1/2007 | Farjadrad et al. | ............ | 714/760 |
| 2007/0198896 | A1 * | 8/2007 | Paumier et al. | ............ | 714/774 |
| 2009/0013237 | A1 * | 1/2009 | Lin et al. | ............ | 714/758 |

FOREIGN PATENT DOCUMENTS

| | | |
|---|---|---|
| JP | 2000 4265 | 1/2000 |
| JP | 2000-115003 | 4/2000 |
| JP | 2002 247003 | 8/2002 |
| JP | 2002 359607 | 12/2002 |
| JP | 2004 228853 | 8/2004 |
| JP | 2007-174027 | 7/2007 |

* cited by examiner

*Primary Examiner* — Robert Beausoliel, Jr.
*Assistant Examiner* — Elmira Mehrmanesh
(74) *Attorney, Agent, or Firm* — Frommer Lawrence & Haug LLP; William S. Frommer; Thomas F. Presson

(57) ABSTRACT

A receiving apparatus including, an LDPC decoder configured to decode both of the data signal and the transmission control signal, a data signal input buffer arranged before the LDPC decoder and configured to hold the received data signal and a transmission control signal input buffer arranged before the LDPC decoder and configured to hold the received transmission control signal, and a controller configured to select one of the data signal held in the data signal input buffer and the transmission control signal held in the transmission control signal input buffer as a signal subject to decoding and transmit the selected signal to the LDPC decoder to make the LDPC decoder decode the signal subject to decoding.

28 Claims, 27 Drawing Sheets

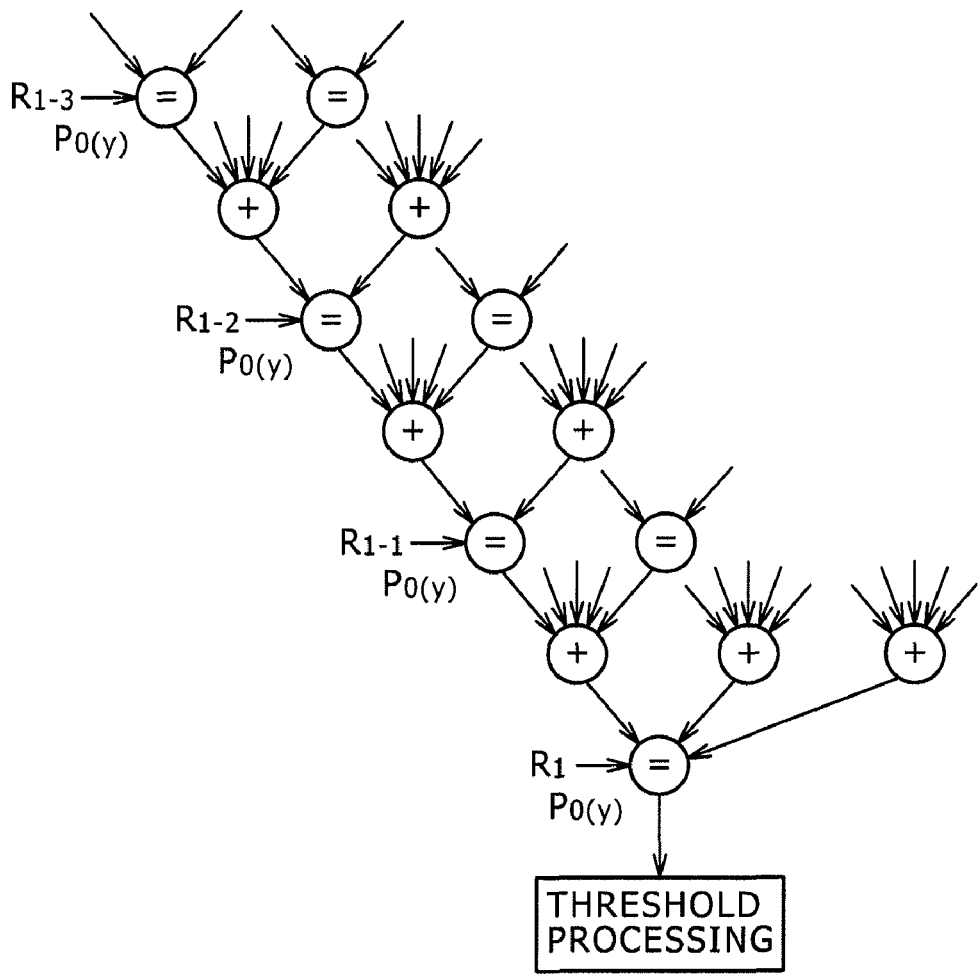

FIG. 12

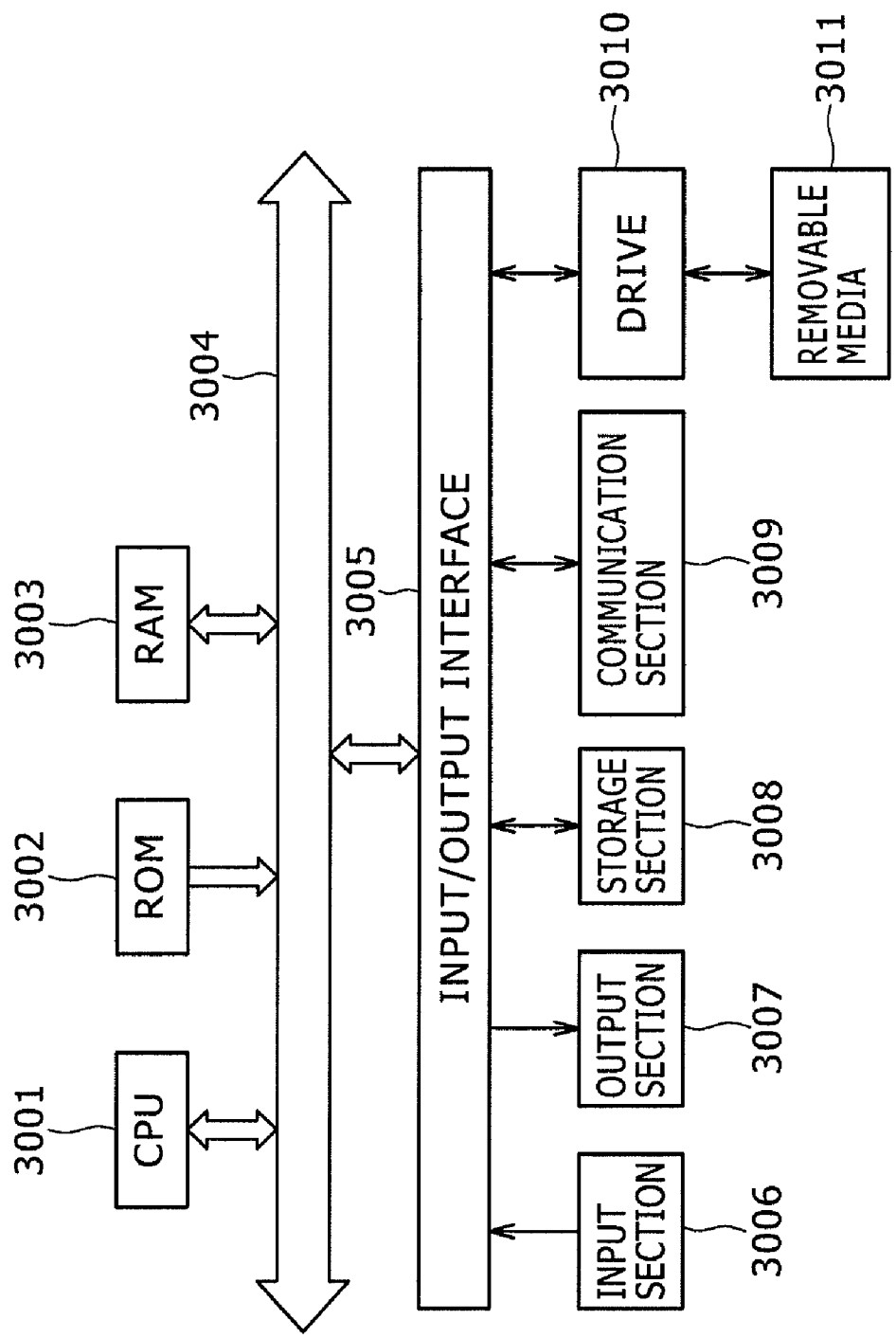

RECEIVING APPARATUS AND METHOD AND PROGRAM FOR RECEIVING AND DECODING A LOW DENSITY PARITY CHECK CODE

CROSS REFERENCES TO RELATED APPLICATIONS

The present invention contains subject matter related to Japanese Patent Application JP 2007-272518 filed in the Japanese Patent Office on Oct. 19, 2007, the entire contents of which being incorporated herein by reference.

BACKGROUND OF THE INVENTION

1. Field of the Invention

The present invention relates to a receiving apparatus and method and a program and, more particularly, to a receiving apparatus and method and a program that are configured to reduce the circuit scale of the receiving apparatus more than ever while maintaining the decoding performance of the receiving apparatus.

2. Description of the Related Art

In communication system, reliable communication over communication channels having noise is assured by use of coding. For example, with a wireless system, such as an satellite network, there are many noise sources due to geographical and environmental factors. These communication channels are representative of fixed capacities and specify a theoretical upper limit known as the Shannon limit that can represent bits per symbol in a certain signal-to-noise ratio (SNR). As a result, the purpose of coding designs is to achieve rates that close in on this Shannon limit. Especially, this purpose is closely related with bandwidth-restrictive satellite systems.

In recent years, coding techniques having performances close to the Shannon limit have been developed, such as PCCC (Parallel Concatenated Convolution Codes) and SCCC (Serially Concatenated Convolution Codes), for example, which are referred to as so-called turbo coding. Along with the development of these turbo coding techniques, LDPC (Low Density Parity Check codes) that have been known since a long time ago are attracting attention.

The LDPC coding was first proposed in "Low Density Parity Check Codes," Cambridge, Mass.; M.I.T. Press, 1963 by R. G. Gallager and subsequently attracted attention again in "Good error correcting codes based on very parse matrices," Submitted to IEEE Trans. Inf. Theory, IT-45, pp. 399-431, 1999 by D. J. C. MacKay and "Analysis of low density codes and improved designs using irregular graphs," in Proceedings of ACM Symposium on Theory of Computing, pp. 249-258, 1998 by M. G. Luby, M. Mitzenmacher, M. A. Shokrollahi and D. A. Spileman and the like.

Recent studies indicate that, like the turbo coding, the LDPC coding provides a performance close to the Shannon limit as code length is increased. Also, since the LDPC coding has a property that minimum distance is proportional to code length, the LDPC coding is good in block error probability characteristic and involves little error floor phenomenon that is observed in the decoding characteristic of turbo codes and so on.

The following specifically describes the LDPC coding. It should be noted that the LDPC coding is linear coding and need not always be binary but, in the following description, the LDPC coding is assumed to be binary.

The greatest characteristic of the LDPC coding is that a parity check matrix for defining a particular LDPC code is sparse. A sparse matrix is a matrix in which the number of "1s," a component of the matrix, is very small. Let a sparse parity check matrix be H, then such a parity check matrix H includes one in which a hamming weight (the number of "1s") of each row is "3" and a hamming weight of each column is "6"), for example.

Thus, the LDPC coding defined by parity check matrix H with the hamming weights of rows and columns being constant is referred to as regular LDPC coding. On the other hand, the LDPC coding defined by parity check matrix H with the hamming weights of rows and columns being not constant is referred to as irregular LDPC coding.

The above-mentioned coding by the LDPC coding is realized by generating a generator matrix G on the basis of the parity check matrix H and multiplying a binary information message by the obtained generator matrix G to generate a code word. To be more specific, a coding apparatus for executing coding based on he LDPC coding first calculates a generator matrix G in which equation $GH^T=0$ is established with a transposed matrix $H^T$ of the parity check matrix H. Here, if the generator matrix G is a k×n matrix, the coding apparatus multiplies the generator matrix G by a k-bit information message (vector u) to generate an n-bit code word c (=uG). With the code word generated by the coding apparatus, a code bit having value "0" is mapped to "+1," a code bit having value "1" is mapped to "−1," and so on. The mapped code word is transmitted to a receiving side through a predetermined communication path.

On the other hand, the decoding of LDPC codes is an algorithm proposed by Gallager as probabilistic decoding, which can be executed a message passing algorithm based on belief propagation on the so-called Tanner graph that is made up of a variable node (also referred to as a message node) and a check node. In what follows, the variable node and the check node will be generically referred to simply as a node.

However, in the probabilistic decoding, a message transferred between nodes is a real value, so that an analytical solution requires the tracing of the probabilistic distribution itself of a message that takes continuous values, which is very difficult to execute. Therefore, Gallager proposed algorithm A or algorithm B as an LDPC-code decoding algorithm.

The decoding of LDPC codes is executed by a following procedure shown in FIG. 2, for example. It is assumed that receive data i of an LDPC code having a length of code length be $U_0(u_{0i})$, message j (a message outputted from edge j connected to the check node) outputted from the check node be $u_j$, and message i (a message outputted from edge i connected to the variable node) outputted from the variable node be $v_j$. It should be noted that a message denotes a real value representative of a so-called log likelihood ratio and so on indicative of "0" likelihood of a value.

First, in the decoding of LDPC codes, as shown in FIG. 2, receive data $U_0(u_{0i})$ is received in step S11, message $u_j$ is initialized to "0," and variable k that takes an integer as a repetitive processing counter is initialized to "0," upon which the procedure goes to step S12. In step S12, message $v_j$ is obtained by executing the operation of a variable node indicated in equation (1) below by use of receive data $U_0(u_{0i})$ and, by use of this message $v_j$, message $u_j$ is obtained by computing a check node indicated in equation (2) below.

[Equation 1]

$$v_i = u_{0i} + \sum_{j=1}^{d_v-1} u_j \quad (1)$$

[Equation 2]

$$\tanh\left(\frac{u_j}{2}\right) = \prod_{i=1}^{d_c-1} \tanh\left(\frac{v_i}{2}\right) \quad (2)$$

In equation (1) and equation (2) above, $d_v$ and $d_c$ are selectable parameters indicative of the number of "1s" in the vertical (or column) direction and the horizontal (or row) direction, namely, a column weight (or hamming weight) and a row weight, of parity check matrix H, respectively. For example, in the case of (3, 6) code, $d_v=3$ and $d_c=6$.

It should be noted that, in the operation of equation (1) or equation (2), a message entered from the edge from which a message is to be outputted is not used as an object of sum or product operation, so that a range of sum or product operation is 1 to $d_v-1$ or 1 to $d_c-1$. The operation indicated by equation (2) can be executed by creating a table of function $R(v_1, v_2)$ indicated in equation (3) below for obtaining 1 for two inputs $v_1, v_2$ in advance and using this table recursively as shown in equation (4) below.

[Equation 3]

$$x = 2\tanh^{-1}\left\{\tanh\left(\frac{v_1}{2}\right)\tanh\left(\frac{v_2}{2}\right)\right\} \quad (3)$$
$$= R(v_1, v_2)$$

[Equation 4]

$$x = 2\tanh^{-1}\left\{\tanh\left(\frac{v_1}{2}\right)\tanh\left(\frac{v_2}{2}\right)\right\} \quad (4)$$
$$= R(v_1, v_2)$$

In step S12, variable k is incremented by "1" and the procedure goes to step S13. In step S13, it is determined whether variable k is greater than predetermined repetitive decoding count N. If variable k is found not greater than N in step S13, then the procedure returns to step S12 to repeat the processing therefrom.

If variable k is found to be greater than N in step S13, then the procedure goes to step S14, in which message v as a decoding result to be finally outputted by executing the operation indicated in equation (5) below is obtained and message v thus obtained is outputted, upon which the LDPC code decoding comes to an end.

[Equation 5]

$$v = u_{0i} + \sum_{j=1}^{d_v} u_j \quad (5)$$

Unlike the operation of equation (1), the operation of equation (5) is executed by use of message $u_j$ from all edges connected to the variable node.

In this LDPC code decoding, in the case of code (3, 6) for example, messages are transferred between nodes as shown in FIG. 3. It should be noted that, in FIG. 3, each node indicated by "=" (equal) denotes a variable node, in which variable node operation indicated by equation (1) is executed. Each node indicated by "+" (plus) in FIG. 3 denotes a check note, in which check node operation indicated by equation (2) is executed. Especially, in algorithm A, a message is binarized, an exclusive OR operation of $d_c-1$ input messages (messages $v_i$ to be entered in check nodes) is executed at the check nodes indicated by "+K" and, if all of dv-1 input messages (messages $u_j$ to be entered in variable nodes) have different bit values for receive data R at the variable nodes indicated by "=," the messages are outputted with signs inverted.

Recently, studies of methods of mounting LDPC code decoding have also been being carried out. Before explaining mounting methods, the decoding of LDPC codes will be described in a schematic manner.

Referring to FIG. 4, there is shown an example of parity check matrix H of LDPC code (coding ratio=1/2, code length=12) of code (3, 6). Parity check matrix H of LDPC codes may be written as shown in FIG. 5 by use of the Tannar graph. Referring to FIG. 5, each node indicated by "+" is a check node and each node indicated by "=" is a variable node. The check nodes and the variable nodes correspond to the row and the column of parity check matrix H, respectively. Each of the connections between the check nodes and the variable nodes is an edge, being equivalent to "1" of parity check matrix H. Namely, if the component of j row, i column of parity check matrix H is 1, then, in FIG. 5, i variable node (node indicated by "=") from top and j check node (node indicated by "+") from top are interconnected by an edge. An edge denotes that the bit of an LDPC code (of receive data) corresponding to a variable node has a constraint condition corresponding to a check node. It should be noted that FIG. 5 shows the Tannar graph representation of parity check matrix H shown in FIG. 4.

The sum product algorithm, an LDPC code decoding algorithm, repetitively executes the operation of variable nodes and the operation of check nodes.

At variable nodes, the variable node operation shown in equation (1) is executed as shown in FIG. 6. Namely, in FIG. 6, message $v_i$ corresponding to i edge among the edges connected to the variable nodes is computed by use of messages $u_1$ and $u_2$ from the remaining edges connected to the variable nodes and receive data $u_{0i}$. The messages corresponding to other edges are computed in the similar manner.

Before explaining the operation of check nodes, equation (2) is rewritten to equation (6) by use of a relation of $a \times b = \exp\{\ln(|a|)+\ln(|b|)\} \times \text{sign}(a) \times \text{sign}(b)$, where $\text{sign}(X)$ is 1 (logical 0) when $x>0$ and $-$(logical 1) when $x<0$.

[Equation 6]

$$u_j = 2\tanh^{-1}\left(\prod_{i=1}^{d_c-1} \tanh\left(\frac{v_i}{2}\right)\right) \quad (6)$$
$$= 2\tanh^{-1}\left[\exp\left\{\sum_{i=1}^{d_c-1} \ln\left(\left|\tanh\left(\frac{v_i}{2}\right)\right|\right)\right\} \times \prod_{i=1}^{d_c-1} \text{sign}\left(\tanh\left(\frac{v_i}{2}\right)\right)\right]$$
$$= 2\tanh^{-1}\left[\exp\left\{-\left(\sum_{i=1}^{d_c-1} -\ln\left(\tanh\left(\frac{|v_i|}{2}\right)\right)\right)\right\} \times \prod_{i=1}^{d_c-1} \text{sign}(v_i)\right]$$

Further, if nonlinear function $\phi(X)=-\ln(\tan h(x/2))$ is defined with $x \geq 0$, inverse function $\phi^{-1}(X)$ is expressed in $\phi^{-1}(X)=2\tan h^{-1}(e^{-x})$, so that equation (6) can be written as equation (7).

[Equation 7]

$$u_j = \phi^{-1}\left(\sum_{i=1}^{d_c-1} \phi(|v_i|)\right) \times \prod_{i=1}^{d_c-1} \text{sign}(v_i) \qquad (7)$$

At each check node, the operation of check node indicated by equation (7) is executed as shown in FIG. 7. Namely, In FIG. 7, message $u_j$ corresponding to j edge among the edges connected to the check nodes is computed by use of messages $v_1, v_2, v_3, v_4, v_5$ from the remaining edges connected to check nodes. The messages corresponding to the other edges are computed in the similar manner.

It should be noted that function $\phi(X)$ can be expressed as $\phi(X)=\ln((e^x+1)/(e^x-1))$. When $x>0$, $\phi(X)=\phi^{-1}(X)$, namely, an operation result of nonlinear function $\phi(X)$ is the same as an operation result of inverse function $\phi^{-1}(X)$ thereof. In installing functions $\phi(X)$ and $\phi^{-1}(X)$ on hardware, the installation may be made by use of a LUT (Look Up Table), which is common to both the functions.

It should also be noted that the variable node operation indicated by equation (1) can be divided into equation (5) and equation (8).

[Equation 8]

$$v_i = v - u_{d_v} \qquad (8)$$

Therefore, repetitive execution of the operations of equation (5) and equation (8), and equation (7) can execute the repetitive execution of the operation of variable nodes of equation (1) and the operation of check nodes of equation (7).

In this case, as shown in FIG. 8, a result of the operation of equation (5) among variable node operations of equation (5) and equation (8) can be used as a final decoding result as it is.

If the sum product algorithm is installed on hardware to provide a decoding apparatus, it is necessary to repetitively execute variable node operations expressed in equation (1), equation (5) or equation (8) and check node operations expressed in equation (7) in a proper circuit scale and with a proper operating frequency.

The following describes, a decoding apparatus installation example, a method of installing full serial decoding for simply decoding the operations of nodes one by one sequentially.

Referring to FIG. 9, there is shown an exemplary configuration of a decoding apparatus for executing LDPC code decoding.

In the decoding apparatus shown in FIG. 9, a message corresponding to one edge is computed for every operation clock.

To be more specific, the decoding apparatus shown in FIG. 9 has a message calculating block 101, a message memory 104, a received value memory 105, and a control block 106. The message calculating block 101 is made up of a variable node calculator 102 and a check node calculator 103.

In the decoding apparatus shown in FIG. 9, messages are read from the message memory 104 to the message calculating block 101 one by one. In the message calculating block 101, by use of these messages, a message corresponding to a desired edge is computed, Then, the message obtained by this computation is stored in the message memory 104. In the decoding apparatus shown in FIG. 9, this processing executed repetitively. Namely, so-called repetitive decoding is executed.

To be more specific, the received value memory 105 is supplied with receive data (LDPC code) D100 that is logarithmic likelihood ratio indicative of likelihood of 0 (or 1) of a code that is obtained by receiving a transmitted LDPC code and the received value memory 105 stores this receive data D100.

At the time of a variable node operation, the received value memory 105 reads the stored receive data in accordance with a control signal supplied from the control block 106 and supplies the read receive data to the variable node calculator 102 of the message calculating block 101 as receive data D101.

Also, at the time of a variable node operation, the message memory 104 reads stored message (check node message $u_j$) D102 in accordance with a control signal supplied from the control block 106 and supplies the read receive data to the variable node calculator 102. By use of the message D102 supplied from the message memory 104 and the receive data D101 supplied from the received value memory 105, the variable node calculator 102 executes the variable node operation of equation (1) and supplies message (variable node message) $v_i$ obtained as a result of this variable node operation to the message memory 104 as message D103.

Next, the message memory 104 stores the message D103 supplied from the variable node calculator 102.

On the other hand, at the time of a check node operation, the message memory 104 reads stored variable node message $v_j$ as message D104 in accordance with a control signal supplied from the control block 106 and supplies the read message to the check node calculator 103.

By use of the message D104 supplied from the message memory 104, the check node calculator 103 executes the check node operation of equation (7) and supplies message (check node message) $u_j$ obtained by this check node operation to the message memory 104 as message D105.

Then, the message memory 104 stores the message D105 supplied from the check node calculator 103.

The message D105 supplied by the check node calculator 103 from the message memory 104, namely, check node message $u_j$ is read as a message D102 at the time of a next variable node operation to be supplied to the variable node calculator 102.

Referring to FIG. 10, there is shown an exemplary configuration of the variable node calculator 102 shown in FIG. 9 that executes variable node operations one by one.

The variable node calculator 102 has two input ports P101 and P102 as inputs ports to which a message (data) is supplied (inputted) from the outside and one output port P103 as a port for supplying (outputting) a message to the outside. By use of messages entered through the input ports P101 and P102, the variable node calculator 102 executes the variable node operation of equation (1) and outputs a message obtained as a result of the operation from the output port P103.

To be more specific, the receive data D101 read from the received value memory 105 is supplied to the input port P101. The message D102 (check node message $u_j$) read from the message memory 104 is supplied to the input port P102.

In the variable node calculator 102, messages D102 (message $u_j$) from the check nodes corresponding to the rows of the parity check matrix are read from the input port P102 one by one to be supplied to an ALU (Arithmetic and Logic Unit) 151 and a FIFO memory 155. Also, in the variable node calculator 102, the receive data D101 is read from the received value memory 105 via the input port P101 one by one to be supplied to an ALU 157.

The ALU 157 adds the message D102 (message $u_j$) to a value D151 stored in a register 152 to integrate the message D102 and stores a resultant integrated value into the register 152 again. It should be noted that, when messages D102 from all edges over one column of the parity check matrix are integrated, the register 152 is set to 0.

If the messages D102 over one column of the parity check matrix are read one by one and an integrated value obtained by the integration of messages D102 for one column is stored in the register 152, namely, if an integrated value ($\Sigma u_j$ from j=1 to $d_v$) obtained by integrating messages D102 (messages $u_j$) from all edges over one column of the parity check matrix is stored in the register 152, a selector 153 selects the value stored in the register 152, namely, integrated value D151 ($\Sigma u_j$ from j=1 to $d_v$) obtained by integrating messages D102 (message $u_j$) from all edges over one column of the parity check matrix and stores the selected value into a register 154.

The register 154 supplies the stored value D151 to the selector 153 and an ALU 156 as value D152. Up to the point of time immediately before the value obtained by integrating messages D102 for one column is stored in the register 152, the selector 153 selects the value D152 supplied from the register 154 and stores the selected value into the register 154 again. Namely, until messages D102 (message $u_j$) from all edges over one column of the parity check matrix have been integrated, the register 154 supplies the value obtained by the last integration to the selector 153 and the ALU 156.

On the other hand, a FIFO (First In First Out) memory 155 delays the message D102 from check nodes until a new value D152 ($\Sigma u_j$ from j=1 to $d_v$) is outputted from the register 154 and then supplies the new value D152 to the ALU 156 as a value D153. The ALU 156 subtracts the value D153 supplied from the FIFO memory 155 from the value D152 supplied from the register 154. To be more specific, the ALU 156 subtracts messages $u_j$ from edges to be obtained from the integrated value ($\Sigma u_j$ from j=1 to $d_v$) of messages D102 (message $u_j$) of all edges over one column of the parity check matrix to obtain a subtracted value ($\Sigma u_j$ from j=1 to $d_v-1$), thereby supplying the obtained subtracted value to the ALU 157.

The ALU 157 adds the receive data D101 from the input port P101 to the subtracted value ($\Sigma u_j$ from j=1 to $d_v$) from the ALU 156 and outputs a resultant added value from the output port P103 as message D103 (message $v_i$).

As described above, in the variable node calculator 102, the variable node operation ($v_i=u_{0i}+\Sigma u_j$) of equation (1) is executed and messages (variable node messages) $v_i$ obtained as a result of this operation are outputted from the output port P103.

Referring to FIG. 11, there is shown an exemplary configuration of the check node calculator 103 shown in FIG. 9 that executes check node operations one by one.

The check node calculator 103 has one input port P111 through which messages (data) are supplied (entered) from the outside and one output port P112 through which messages are supplied (outputted) to the outside. By use of messages entered through the input port P111, the check node calculator 103 executes the check node operation of equation (7), outputting messages obtained as a result of this operation from the output port P112.

Namely, the message D104 (variable node message $v_i$) read from the message memory 104 is supplied to the input port P111.

In the check node calculator 103, messages D104 (messages $v_i$) from the variable nodes corresponding to columns of the parity check matrix are read from the input port P111 one by one and the low-order bits except for the most significant bit, namely, absolute value D122 ($|v_i|$) of message D104 is supplied to the LUT 121 and the most significant bit, namely, the sign bit (indicative of plus or minus) D121 of message D104 to an EXOR circuit 129 and a FIFO memory 133.

The LUT 121 outputs an operation result of nonlinear function $\phi(X)$ in the check node operation of equation (7) with a value entered in the LUT 121 being argument x. More particularly, the LUT 121 reads operation result D123 ($\phi(|v_i|)$) obtained by operating nonlinear function $\phi(|v_i|)$ for the supply of absolute value D122 ($|v_i|$) and supplies this operation result to an ALU 122 and a FIFO memory 127.

The ALU 122 adds the operation result D123 ($\phi(|v_i|)$) to the value D124 stored in a register 123 to integrate the operation result D123 ($\phi(|v_i|)$) and stores an integrated value obtained as a result of this integration into the register 123 again. It should be noted that, when the operation results D123 ($\phi(|v_i|)$) for the absolute values D122 ($|v_i|$) of the messages D104 from all edges over one row of the parity check matrix have been integrated, then the register 123 is reset to 0.

When the messages D104 over one row of the parity check matrix have been read one by one and an integrated value obtained by integrating operation results D123 for one row is stored in the register 123, then a selector 124 selects the value stored in the register 123, namely, the integrated value D124 ($\Sigma\phi(|v_i|)$ from i=1 to $d_c$) with $\phi(|v_i|)$ obtained from messages D104 (messages $v_i$) from all edges over one row of the parity check matrix integrated and then stores the selected integrated value D124 into a register 125 as a value D125. The register 125 supplies the stored value D125 to the selector 124 and an ALU 126 as a value D126.

Up to the point of time immediately before the integrated value obtained by integrating the operation results D123 for one row is stored in the register 123, the selector 124 selects the value D126 supplied from the register 125 and stores this value into the register 125 again. Namely, until $\phi(|v_i|)$ obtained from the messages D104 (messages $v_i$) from all edges over one row of the parity check matrix is integrated, the register 125 supplies the integrated value of $\phi(|v_i|)$ integrated last to the selector 124 and the ALU 126.

On the other hand, the FIFO memory 127 delays the operation result D123 ($\phi(|v_i|)$) outputted from the LUT 121 until a new value D126 ($\Sigma\phi(|v_i|)$ from j=1 to $d_c$) is outputted from the register 125 and then supplies the new value D126 to the ALU 126 as a value D172. The ALU 126 subtracts the value D127 supplied from the FIFO memory 127 from the value D126 supplied from the register 125 and supplies a subtraction result to a LUT 128 as a subtracted value D128. To be more specific, the ALU 126 subtracts $\phi(|v_i|)$ obtained from messages (messages $v_i$ with i=$d_c$) form edges to be obtained from the integrated value ($\Sigma\phi(|v_i|)$ from j=1 to $d_c$) of $\phi(|v_i|)$ of the messages D104 (message $v_i$) of all edges over one row of the parity check matrix, thereby supplying the obtained subtracted value ($\Sigma\phi(|v_i|)$ from i=1 to $d_c-1$) to the LUT 128 as a subtracted value D128.

The LUT 128 outputs an operation result of inverse function $\phi^{-1}(X)$ of nonlinear function $\phi(X)$ in the check node operation of equation (7) with the value entered in the LUT 128 being argument X. More particularly, the LUT 128 outputs operation result D129 ($\phi^{-1}(\Sigma\phi(|v_i|))$) obtained by operating inverse function $\phi^{-1}(\Sigma\phi(|v_i|))$ on the supply of subtracted value D128 ($\Sigma\phi(|v_i|$ from i=1 to $d_c-1$)) from the ALU 126.

It should be noted that, as described above, since the operation result of nonlinear function $\phi(X)$ and the operation result of inverse function $\phi^{-1}(X)$ for the same argument X are equal, the LUT 121 and the LUT 128 have the same configuration.

Concurrently with the above-mentioned processing, the EXOR circuit 129 executes an exclusive OR operation between the value D131 stored in a register 130 and the sign bit D121 to make a multiplication between the sign bits of the message D104, storing a multiplication result in the register 130 again. It should be noted that when the sign bits D121 of messages D104 from all edges over one row of the parity check matrix have been multiplied, the register 130 is reset.

When the operation result D130 ($\Pi$ sign($v_i$) from i=1 to $d_c$) obtained by multiplying sign bits D121 of messages D104 from all edges over one row of the parity check matrix has been stored in the register 130, a selector 131 selects the value stored in the register 130, namely, the value D131 ($\Pi$ sign($v_i$) from i=1 to $d_c$) obtained by multiplying the sign bits D121 of the messages D104 from all edges over one row of the parity check matrix and stores the selected value into a register 132 as a value D132. The register 132 supplies the stored value D132 to the selector 131 and an EXOR circuit 134 as a value D133.

Up to the point immediately before the multiplication result D130 ($\Pi$ sign($v_i$) from i=1 to $d_c$) obtained by multiplying the sign bits D121 of the messages D104 from all edges over one row of the parity check matrix is stored in the register 130, the selector 131 selects the value D133 supplied from the register 132 and stores this value in the register 132 again. Namely, until the sign bits D121 of the messages D104 from all edges over one row of the parity check matrix are multiplied, the register 132 supplies the value stored last to the selector 131 and the EXOR circuit 134.

On the other hand, the FIFO memory 133 delays the sign bit D121 until a new value D133 ($\Pi$ sign($v_i$) from i=1 to $d_c$) is supplied from the register 132 to the EXOR circuit 134 and then supplies the delayed bit to the EXOR circuit 134 as 1-bit value D134. The EXOR circuit 134 executes an exclusive OR operation between the value D133 supplied from the register 132 and the value D134 supplied from the FIFO memory 133 to divide the value D133 by the value D134, outputting a division result as a value D135. Namely, the EXOR circuit 134 divides the multiplied value of the sign bits D121 (sign ($v_i$)) of the messages D104 from all edges over one row of the parity check matrix by the sign bit D121 (sign ($v_i$)) of the message D104 from an edge to be obtained, outputting the divided value ($\Pi$ sign($v_i$) from i=1 to $d_c$−1) as a divided value D135.

Then, in the check node calculator 103, a bit string with the operation result D129 outputted from the LUT 128 being the least significant bit and the divided value D135 outputted from the EXOR circuit 134 being the most significant bit (sign bit) is outputted from the output port P112 as a message D105 (message $u_j$).

As described above, in the check node calculator 103, the operation of equation (7) is executed to obtain the message (check node message) $u_j$.

It should be noted that, although not shown, in the decoding apparatus shown in FIG. 9, the operation of equation (5) is executed instead of the variable node operation of equation (1) at the final decoding stage (for example, a variable node operation that is executed last of the variable node operations and the check node operations that are executed by predetermined repetitive decoding count N, a result of this operation being outputted as the final decoding result.

According to the decoding apparatus shown in FIG. 9, the LDPC codes of various parity check matrices can be decoded as long as the message memory 104 (FIG. 9), the FIFO memory 155 of the variable node calculator 102 (FIG. 10), and the FIFO memory 127 and the FIFO memory 133 of the check node calculator 103 (FIG. 11) have the sizes large enough for decoding.

If decoding is made by repetitively using the decoding apparatus shown in FIG. 9, check not computation and variable node computation needs to be executed alternately, so that a clock count twice the number of message is required for one operation of decoding. However, in the case of LDPC codes having a structure of parity check matrix, providing P node calculators can execute decoding by a clock count of 1/P.

The following describes a decoding apparatus configured to decode LDPC codes having a structure for executing node operations in parallel with each LDPC constituting matrix. It should be noted that this operation will be hereafter referred to partly parallel decoding.

LDPC codes subject to partly parallel decoding can be expressed in a matrix made up of combinations of two or more constituent matrices. The constituent matrix includes a P×P identity matrix, a matrix with one or more of is that are components of this identity matrix being 0 (hereafter appropriately referred to as a quasi-identity matrix), a matrix obtained by cyclically shifting identity matrix or quasi-identity matrix (hereafter appropriately referred to as a shift matrix), a sum of two or more (plural) of identify matrix, quasi-identity matrix, and shift matrix (hereafter appropriately referred to as a sum matrix), and a P×P 0 matrix. It should be noted that the parity check matrix having the above-mentioned structure is referred to as a P×P structured parity check matrix and the LDPC code that is expressed in the P×P structured parity check matrix are referred to as "P-code."

In decoding a P-code, P check node operations and P variable node operations can be executed at the same time.

For example, referring to FIG. 12, there is shown an example of P×P structured parity check matrix H with P=6. To be more specific, parity check matrix H shown in FIG. 12 is indicative of one example of a matrix made up of combinations of two or more constituent matrices that are 6×6 identity matrix, 6×6 quasi-identity matrix, 6×6 shift matrix, 6×6 sum matrix, and 6×6 0 matrix. It should be noted that this code has a coding ratio of 2/3 and a code length 108.

Further, the following describes the partly parallel decoding as an example in which both check node operation and variable node operation can be processed alternately by one circuit instead of using separate variable node calculator and check node calculator.

Referring to FIG. 13, there is shown an exemplary configuration of a decoding apparatus that executes partly parallel decoding by use of six node calculators in "P=6 code" decoding. It is assumed in this example of FIG. 13 that the above-described code shown in FIG. 12 be decoded as "P=6 code."

The decoding apparatus shown in FIG. 13 has a received-value memory 200, a message memory 201, a message calculating block 202 including a P=6 node calculators 210-1 through 210-6, a control block 203, a shift block 204, and a decoding result memory 205.

It should be noted that the node calculators 210-1 through 210-6 will hereafter be generically referred to as a node calculator 210 unless otherwise required.

Receive data (LDPC code) D200 that is a logarithmic likelihood ratio indicative of the likelihood of 0 (or 1) of code obtained by receiving transmitted LDPC codes is supplied to the received-value memory 200 that stores this data D200.

At the time of a variable node operation, the received-value memory 200 reads the stored receive data in accordance with a control signal supplied from the control block 203 and supplies the receive data to the node calculator 210 of the message calculating block 202 as received data D201.

The message memory 201 stores or reads message data as required under the control of the control block 203. To be more specific, the message memory 201 appropriately supplies messages D202, D203 to the node calculator 210 and appropriately stores message D205 supplied from the shift block 204. The message memory 201 is configured by two or more independently controllable memories so as to simultaneously read two pieces of message data.

Each node calculator 210 of the message calculating block 202 can execute processing by switching between variable node operation and check node operation.

To be more specific, at the time of a variable node operation, the node calculator 210 executes a variable node operation in accordance with equation (1) for example by use of messages D202, D203 supplied from the message memory 201 and receive data D201 supplied from the received-value memory 200 and supplies message (variable node message) $v_i$ obtained as a result of this variable node operation to the shift block 204 as message D204.

At the time of a check node operation, the node calculator 210 executes a check node operation in accordance with equation (7) for example by use of messages D202, D203 supplied from the message memory 201 and supplies message (check node message) $u_j$ to the shift block 204 as message D204.

If message D204 is supplied from the message calculating block 202, information indicative how many identity matrices for example providing the source in the parity check matrix shown in FIG. 12 were cyclically shifted by the edge corresponding to message D204 is supplied from the control block 203 to the shift block 204. On the basis of the supplied information, the shift block 204 executes a cycle shift operation so as to sort message D204 and supplies a result of this operation to the message memory 201 as message D204.

In FIG. 13, in order to operate six variable nodes per constituent matrix in parallel, P=6 node calculators 210-1 through 210-6 are arranged. For example, if the number of bits m per item of receive data is 6, then the size of the constituent matrix becomes 6×6, so that the received-value memory 200 is made up of a RAM of 36 bits per word, for example. Because node operations are executed in parallel for each constituent matrix, the data for the constituent matrix are simultaneously transmitted from the received-value memory 200 to the node calculators 210-1 through 210-6.

Referring to FIG. 14, there is shown an exemplary configuration of the node calculator 210 shown in FIG. 13 that alternately executes a variable node operation in accordance with equation (1) and a check node operation in accordance with equation (7).

The node calculator 210 has three input ports P301, P302, P303 through which messages (data) are supplied from the outside and two output ports P304, P305 through which messages (data) are outputted to the outside.

To be more specific, the input port P301 is supplied with receive data read from the received-value memory 200 shown in FIG. 13. The input ports P302, P303 are supplied with messages D202, D203 read from the message memory 201, respectively. A message D321 to be described later is outputted through the output port P304 to be supplied to the message memory 201 as an output message D204. At the final stage of the decoding, a message D308 to be described later is outputted through the output port P305 to be supplied to the decoding result memory 205 as a decoding result.

The node calculator 210 shown in FIG. 14 has selectors 301, 311, 316. If these selectors 301, 311, 316 select the "v" side, the node calculator 210 shown in FIG. 14 executes a variable node operation. On the other hand, if these selectors select the "c" side, the node calculator 210 shown in FIG. 14 executes a check node operation.

First, the node calculator 210 shown in FIG. 14 will be described from the viewpoint of processing to be executed for a variable node operation.

Messages D202 from check nodes corresponding to one column of the parity check matrix supplied from the message memory 201 are entered, one by one, through the input port P302 as messages D301 (messages $u_j$) and entered in an adder 302 through the selector 301 as message D306. In the adder 302, the data D307 stored in a register 303 is added to the message D306 and a resultant added value is stored in the register 303 again. Thus, the data D307 becomes an integrated value of messages D301 (messages $u_j$).

When messages D301 (messages $u_j$) for one column have been integrated, a resultant integrated value D307 ($\Sigma u_j$ from j=1 to $d_v$) is stored in a register 305 through the selector 304.

At the same time, the same value as the messages D301 (messages $u_j$) entered in the port P302 is read from the message memory 201 again as message D203 to be entered again through the input port P303 as a delay input message D302.

The delay input message D302 passes a selector 311 to be subtracted in a subtractor 312 from the integrated message D308 stored in the register 305 and the subtracted value D316 ($\Sigma u_j$ from j=1 to $d_v-1$) is supplied to an adder 313. The adder 313 is also supplied with receive data D201 ($u_{0i}$) from the received-value memory 200 through the input port P301 as received data D300. In the adder 313, the supplied receive data D300 ($u_{0i}$) is added to the subtracted value D316 ($\Sigma u_j$ from j=1 to $d_v-1$) and resultant added value D317 (($\Sigma u_j + u_{0i}$ from j=1 to $d_v-1$) provides a message D321 through the selector 316. This message D321 is outputted from the output port P304 as an output message D204 to be supplied to the shift block 204.

In other words, the node calculator 210 shown in FIG. 14 realizes the operation of equation (1) by calculating the messages to the edges to be obtained by subtracting the messages from the check nodes to be obtained from a sum of the messages from all check nodes connected to the variable nodes and the receive data.

The following describes the node calculator 210 shown in FIG. 14 from the viewpoint of processing to be executed for a check node operation.

Messages D202 from the variable nodes corresponding to one row of the parity check matrix supplied from the message memory 201 are entered, one by one, through the input port P302 as messages D301 (messages $v_i$) and absolute value D303 ($|v_i|$) thereof is supplied to a LUT 300.

By use of the value entered therein as argument X, the LUT 300 outputs an operation result of nonlinear function φ(X) in the check node operation of equation (7). To be more specific, the LUT 300 reads operation result D305 (φ($|v_i|$)) obtained by executing nonlinear function φ($|v_i|$) on the supply of absolute value D303 ($|v_i|$).

This operation result D305 (φ($|v_i|$)) is entered in the adder 302 through the selector 301 as a message D306. In the adder 302, data D307 stored in the register 303 is added to this message D306 and a resultant added value is stored in the register 303 again. Thus, the data D307 becomes the integrated value of operation result D305 (φ($|v_i|$)).

When the operation results D305 (φ($|v_i|$)) of the messages D301 (message $v_i$) for one row have been integrated, resultant integrated value D307 ($\Sigma u_j$ from i=1 to $d_c$) passes the selector 304 to be stored in the register 305.

The same value as the messages D301 (messages $v_i$) entered through the port P302 is read again from the message memory 201 as message D203 to be entered again through the input port P303 as a delay input message D302.

Like the operation of the LUT 300 on the input message D301, an LUT 310 executes an operation of nonlinear function φ(|v$_i$|) on the supply of the absolute value D312 (|v$_i$|) of the delay input message D302 and an operation result D314 (φ(|v$_i$|)) thereof is read.

This operation result (φ(|v$_i$|)) is entered in the subtractor 312 through the selector 311 as a message D315.

In the subtractor 312, the message D315 is subtracted from the integrated message D308 stored in the register 305 and a resultant subtracted value (Σφ(|v$_i$|) from i=1 to d$_c$−1) is supplied to a LUT 314.

By use of the value entered therein as argument X, the LUT 314 outputs an operation result of inverse function φ$^{-1}$(X) of nonlinear function φ(X) in the check node operation of equation (7). To be more specific, the LUT 314 outputs operation result D381 (φ$^{-1}$(Σφ(|v$_i$|))) obtained by execution an operation of inverse function φ$^{-1}$(Σφ(|v$_i$|)) on the supply of subtracted value D316 (Σφ(|v$_i$|) from i=1 to d$_c$−1) from the subtractor 312.

Concurrently with the above-mentioned processing, an exclusive OR operation is executed in an EXOR circuit 306 between the sign bit D304 (sign(v$_i$)) indicative of plus or minus of each message D301 and the value D310 stored in a register 307 and an operation result D309 of this operation is stored in the register 307 again.

When the sign bits for one row have been integrated in the register 307, a resultant integrated value D310 (Π sign(v$_i$) from i=1 to d$_c$) is stored in a register 309 through a selector 308.

The value D304 (sign(v$_i$)) used for the integration is entered from the input port P303 again as a sign bit 313 of a delay input message to be supplied to an EXOR circuit 315. Then, an exclusive OR operation is executed in the EXOR circuit 315 between this sign bit D313 and an integrated value D311 in the register 309 and an operation result, namely, Π sign(v$_i$) from i=1 to d$_c$−1 is outputted as a sign bit D319.

Finally, a value D320 obtained by adding this sign bit D319 to the operation result D318 (φ$^{-1}$(Σφ(|v$_i$|))) of the LUT 314 becomes a message D321. This message D312 is outputted from the output port P304 to the shift block 204 as an output message D204.

In other words, the node calculator 210 shown in FIG. 14 realizes the operation of equation (7) by subtracting the messages from variable nodes to be obtained from a sum of the messages from all variable nodes connected to the check nodes.

Also, in the node calculator 210 shown in FIG. 14, at the final stage of decoding (for example, the variable node operation to be executed last among the variable node operations and the check node operations that are repetitively executed by predetermined repetitive decoding count N), the operation of equation (5) is executed instead of the variable node operation of equation (1) and an operation result thereof, namely, the output data D308 from the register 305, is outputted from the output port P305 as a decoding result to be supplied to the decoding result memory 205.

Meanwhile, the variable node operation (equation (1)) and the check node operation (equation (7)) can be replaced by u'$_j$=φ(|u$_j$|)×sign(u$_j$) to be rewritten to equation (9) and equation (10) below, respectively.

[Equation 9]

$$v_i = u_{0i} + \sum_{j=1}^{d_v-1} (\phi^{-1}(|u'_j|) \times \text{sign}(u'_j)) \quad (9)$$

[Equation 10]

$$u'_j = \sum_{i=1}^{d_c-1} \phi(|v_i|) \times \prod_{i=1}^{d_c-1} \text{sign}(v_i) \quad (10)$$

It should be noted that φ(X)=φ$^{-1}$(X). To be more specific, in each of the variable node operation (equation (9)) and the check node operation (equation (10)), operation φ(X) is executed on the absolute value of input data. Therefore, in the case of the check node operation, absolute values are integrated and an output message can be calculated by multiplying a resultant integrated value by a sign obtained separately. On the other hand, in the case of the variable node operation, an addition is executed by also including sign bits, to which receive data is added to provide an output message.

Referring to FIG. 15, there is shown an exemplary configuration of the node calculator 210 shown in FIG. 13 that alternately executes the variable node operation according to equation (9) and the check node operation according to equation (10).

The node calculator 210 has three input ports P601, P602, P603 in which messages (data) are entered from the outside and two output ports P604, P605 from which messages (data) are supplied (outputted) to the outside.

To be more specific, the receive data D201 read from the received-value memory 200 shown in FIG. 13 is supplied to the input port P601. Messages D602, D603 read from the message memory 201 are supplied to the input ports P602, P603. Then, a message D622 to be described later is outputted from the output port P604 as an output message D204 to be supplied to the message memory 201. In the final stage of decoding, a message D609 to be described later is outputted from the output port P605 to be supplied to the decoding result memory 205.

The node calculator 210 shown in FIG. 15 has selectors 601, 611, 615. If these selectors 601, 611, 615 select the "v" side, the node calculator 210 shown in FIG. 15 executes a variable node operation. On the other hand, if the selectors 601, 611, 615 select the "c" side, the node calculator 210 shown in FIG. 15 executes a check node operation.

First, the node calculator 210 shown in FIG. 15 will be described from the viewpoint of the execution of a variable node operation.

Messages D202 from check nodes corresponding to one column of the parity check matrix supplied from the message memory 201 are entered one by one through the input port P602 as messages D601 (messages u'$_j$). A LUT 600 executes an operation of φ$^{-1}$(X) with absolute value (|u'$_j$|) thereof being argument X and supplies a value D606 (message u$_j$) obtained by multiplying an operation result D605 (|u$_j$|) by sign bit D604 (sign(u$_j$)) to an adder 602 through the selector 601 as a value D607. This value D607 is added in the adder 602 to the data D608 stored in a register 603 to be stored in the register 603 again. Thus, the data D608 becomes an integrated value of message D607 (message u$_j$).

When messages D607 (messages u$_j$) for one column have been integrated, a resultant integrated value D608 (Σu$_j$ from j=1 to d$_v$) is supplied to a register 605 through a selector 604.

The same value as the message D601 (message u'$_j$) entered in the port P602 is read from the message memory 201 as a message D203 to be entered again through the input port P603 as a delay input message D602.

Of the delay input message D602, an operation φ$^{-1}$(X) is executed by LUT 610 with absolute value D613 (|u'$_j$|) being argument X and value D616 (message $u_j$) obtained by multiplying an operation result D615 ($|u_j|$) thereof by sign bit D614 (sign($u_j$)) is supplied to a subtractor 612 through the selector 611 as value D617.

In the subtractor 612, the above-mentioned value D617 is subtracted from the integrated message D609 stored in the register 605 and a resultant subtracted value D618 ($\Sigma u_j$ from j=1 to $d_v-1$) is supplied to an adder 613. The adder 613 is also supplied with the receive data D201 ($u_{0i}$) from the received-value memory 200 through the input port P601 as receive data D600. In the adder 613, the receive data 600 ($u_{0i}$) is added to the subtracted value D618 ($\Sigma u_j$ from j=1 to $d_v-1$) and a resultant added value ($\Sigma u_j + u_{0i}$) from j=1 to $d_v-1$) becomes a message D622 through the selector 615. This message D622 is outputted from the output port P604 as an output message D204 to be supplied to the shift block 204.

In other words, the node calculator 210 shown in FIG. 15 realizes the operation of equation (9) by calculating messages to the edges to be obtained by subtracting messages from the check nodes to be obtained from a sum of the messages from all check nodes connected to variable nodes and the receive data.

The following describes the node calculator 210 shown in FIG. 15 from the viewpoint of the execution of a check node operation.

Messages D202 from the variable nodes corresponding to one column of the parity check matrix supplied from the message memory 201 are entered one by one through the input port P602 as messages D601 (messages Vi) and absolute value ($|v_i|$) thereof is supplied to the LUT 600. The LUT 600 executes an operation $\phi(X)$ with this absolute value ($|v_i|$) being an argument X and supplies an operation result ($\phi|v_i|$) thereof to the adder 602 through the selector 601 as a value D607. This value D607 is added in the adder 602 to data D608 stored in the register 603 to be stored in the register 603 again. Thus, the data D608 becomes an integrated value of operation result D607 ($\phi(|v_i|)$).

When operation results D607 of the messages D601 (messages $v_i$) for one row have been integrated, the integrated value ($\Sigma \phi(|v_i|)$ from i=1 to $d_c$) is stored in the register 605 through the selector 604.

The same value as the message D601 (message vi) entered in the port P602 is read from the message memory 201 as a message D203 to be entered again through the input port P603 as a delay input message D602.

Like the operation by the LUT 600 on the input message D601, a LUT 610 executes an operation of $\phi(X)$ on the delay input message D602 with the absolute value D613 ($|v_i|$) being argument X to read out a operation result D615 ($\phi(|v_i|)$) thereof.

This operation result D615 ($\phi(|v_i|)$) is entered in the subtractor 612 through the selector 611 as a message D617.

In the subtractor 612, the message D617 is subtracted from the integrated message D609 stored in the register 605 and a resultant subtracted value D618 ($\Sigma \phi(|v_i|)$ from i-1 to $d_c-1$) is outputted.

Concurrently with the above-mentioned processing, an exclusive OR operation is executed by an EXOR circuit 606 between the sign bit D604 (sign($v_i$)) indicative of the plus or minus of each message D601 and the value D611 stored in a register 607 and an operation result D610 thereof is stored in the register 607 again.

When the sign bits for one row have been integrated in the register 607, a resultant integrated value D611 ($\Pi$ sign ($v_i$) from i=1 to $d_c$) is stored in a register 609 through a selector 608.

The value D604 (sign($v_i$)) used for the integration is entered from the input port P603 again as a sign bit D614 of the delay input message into an EXOR circuit 614. An exclusive OR operation is executed by the EXOR circuit 614 between this sign bit D614 and the integrated value in the register 609. A result of this operation, namely, $\Pi$sign($v_i$) from i=1 to $d_c-1$, is outputted as a sign bit D620.

Finally, a value D621 obtained by adding this sign bit D620 to subtracted value D618 ($\Sigma \phi(|v_i|)$ from i=1 to $d_c-1$) from the subtractor 612 becomes a message D622 through the selector 615. This message D622 is outputted from the output port P604 as an output message D204 to be supplied to the shift block 204.

In other words, the node calculator 210 shown in FIG. 15 realizes the operation of equation (10) by subtracting messages from the variable nodes to be obtained from a sum of messages from all variable nodes connected to check nodes.

Also, in the node calculator 210 shown in FIG. 15, at the final stage of decoding (for example, the variable node operation to be executed last among the variable node operations and the check node operations that are repetitively executed by predetermined repetitive decoding count N), an operation in accordance with an equation obtained by rewriting equation (5) like the equation (9) is executed instead of the variable node operation of equation (9) and a result of this operation, namely, output data D609 from the register 605, is outputted from the output port P605 as a decoding result to be supplied to the decoding result memory 205 shown in FIG. 13.

Further, the variable node operation (equation (1)) and the check node operation (equation (7)) can be rewritten to equation (12) and equation 13) below, respectively, by replacing $v'_i = \phi(|v_i|) \times \text{sign}(v_i)$. It should be noted that, in order to simplify the comparison with equation (12), equation (11) has been obtained by rewriting equation (1) again.

[Equation 11]
$$v_i = u_{0i} + \sum_{j=1}^{d_v-1} u_j \quad (11)$$

[Equation 12]
$$v'_i = \phi(|v_i|) \times \text{sign}(v_i) \quad (12)$$

[Equation 13]
$$u_j = \phi^{-1}\left(\sum_{i=1}^{d_c-1} |v'_i|\right) \times \prod_{i=1}^{d_c-1} \text{sign}(v'_i) \quad (13)$$

In the above equations, $\phi(X) = \phi^{-1}(X)$. Namely, in each of the variable node operation (equation (12)) and the check node operation (equation (13)), an operation of $\phi(X)$ is executed on the absolute value of input data. Therefore, in the case of the check node operation, an output message can be calculated by integrating the absolute values of input data, executing an operation of $\phi(X)$ on the result of the integration, and then multiplying the result of this operation by a sign bit obtained separately. On the other hand, in the case of the variable node operation, the input data is integrated including also a sign bit, the receive data is added to the result of the integration, an operation of $\phi(X)$ is executed on the absolute value thereof, and the result of this operation is multiplied by the sign bit to provided an output message.

Referring to FIG. 16, there is shown an exemplary configuration of the node calculator 210 shown in FIG. 13 in which a variable node operation according to equation (12) and a check node operation according to equation (13) are alternately executed.

The node calculator 210 has three input ports P701, P702, P703 in which messages (data) are entered from the outside and two output ports P704, P705 from which messages (data) are supplied (outputted) to the outside.

To be more specific, the receive data D201 read from the received-value memory 200 shown in FIG. 13 is supplied to the input port P701. The messages D702 and D703 read from the message memory 201 are supplied to the input ports P702 and P703, respectively. Message D722 to be described later is outputted from the output port P704 as output message D204 to be supplied to the message memory 201. In the final stage of decoding, a message D707 to be described later is outputted from the output port P705 as a result of the decoding to be supplied to the decoding result memory 205.

The node calculator 210 shown in FIG. 16 has selectors 700, 705, 712, 715. If these selectors 700, 705, 712, 715 select the "v" side, the node calculator 210 shown in FIG. 16 executes a variable node operation. On the other hand, if the selectors 700, 705, 712, 715 select the "c" side, the node calculator 210 shown in FIG. 16 executes a check node operation.

First, the node calculator 210 shown in FIG. 16 will be described from the viewpoint of the execution of a variable node operation.

Messages D202 from the check nodes corresponding to one column of the parity check matrix supplied from the message memory 201 are entered one by one through the input port P702 as messages D701 (messages $u_j$) to be entered in an adder 701 through the selector 700 as a message D705. In the adder 701, data D706 stored in a register 702 is added to the message D705 to be stored in the register 702 again. Thus, the data D706 becomes an integrated value of the messages D701 (messages $u_j$).

When the messages D701 (messages $u_j$) for one column have been integrated, a resultant integrated value D706 ($\Sigma u_j$ from j=1 to $d_v$) is stored in a register 704 through the selector 703.

The same value as the message D701 (message $u_j$) entered in the port P702 is read again from the message memory 201 as a message D203 to be entered through the input port P703 as a delay input message D702.

The delay input message D702 passes the selector 705 to be subtracted in a subtractor 710 from the integrated message D707 and a resultant subtracted value D714 ($\Sigma u_j$ from j=1 to $d_v-1$) is supplied to an adder 711. Also, the receive data D201 ($u_{0i}$) from the received-value memory 200 is supplied to the adder 711 through the input port P701 as receive data D700. Therefore, in the adder 711, the receive data D700 ($u_{0i}$) is added to the subtracted value D714 ($\Sigma u_j$ from j=1 to $d_v-1$) and the absolute value D716 ($|v_i|$) of a resultant added value ($\Sigma u_j + u_{0i} = v_i$ from j=1 to $d_v-1$) is becomes an absolute value D718 ($|v_i|$) through the selector 712 to be supplied to a LUT 713. In the LUT 713, an operation of $\phi(X)$ is executed with argument X being the absolute value D718 ($|v_i|$) and a result of this operation D719 ($\phi|v_i|$) is outputted.

Concurrently with the above-mentioned processing, the sign bit D717 (sign($v_i$)) of the added value D715 ($v_i$) from the adder 711 becomes a sign bit D721 through the selector 715. This sign bit D721 is multiplied by the operation result D719 ($\phi|v_i|$) of the LUT 713 to provide a message D722 ($\phi|v_i|\times$sign ($v_i$)). This message D722 is outputted from the output port P704 as an output message D204 to be supplied to the shift block 204.

In other words, the node calculator 210 shown in FIG. 16 realizes the operation of equation (12) by calculating messages to the edges to be obtained by subtracting messages from the check nodes to be obtained from a sum of the messages from all check nodes connected to variable nodes and the receive data.

The following describes the node calculator 210 shown in FIG. 16 from the viewpoint of the execution of a check node operation.

Messages D202 from the variable nodes corresponding to one row of the parity check matrix supplied from the message memory 201 are entered one by one through the input port P702 as messages D701 (messages $v'_i$) and the absolute value D703 ($|v'_i|$) is entered in the adder 701 through the selector 700 as the absolute value D705. In the adder 701, the data D706 stored in the register 702 is added to this absolute value D705 to be stored in the register 702 again. Thus, the data D706 becomes an integrated value of absolute value D703 ($|v'_i|$).

When the absolute values D703 ($|v'_i|$) of the messages D701 (message $v'_i$) for one row have been integrated, a resultant integrated value D706 ($\Sigma|v+_i|$ from i=1 to $d_c$) is stored in the register 704 through the selector 703.

The same value as the message D701 (message v'i) entered in the port P702 is read from the message memory 201 as a message D203 to be entered again through the input port P703 as a delay input message D702.

The absolute value D711 ($|v'i|$) of the delay input message D702 passes the selector 705 to be subtracted in the subtractor 710 from the integrated message D707 stored in the register 704 and a resultant subtracted value D714 ($\Sigma|v'_i|$ from i-1 to $d_c-1$) is supplied to a LUT 713 through the selector 712 as a subtracted value D718. In the LUT 713, an operation of $\phi^{-1}(X)$ is executed with the subtracted value D718 ($\Sigma|v'_i|$ from i-1 to $d_c-1$) being argument X and an operation result D719 ($\phi^{-1}(\Sigma|v'_i|$ from i=1 to $d_c-1$) is read.

Concurrently with the above-mentioned processing, an exclusive OR operation is executed in an EXOR circuit 706 between the sign bit D704 (sign($v'_i$) indicative of plus or minus of each message D701 and the value D709 stored in a register 707. An operation result D708 thereof is stored in the register 707 again.

When the sign bits for one row have been integrated in the register 707, a resultant integrated value D709 ($\Pi$ sign($v'_i$) from i=1 to $d_c$) is stored in a register 709 through the selector 708.

The value D704 (sign(v'i)) used for the integration is entered again from the input port P703 as the sign bit D712 of the delay input message into an EXOR circuit 714. An exclusive OR operation is executed by the EXOR circuit 714 between this sign bit D712 and the integrated value D710 in the register 709 and a result of this operation, namely, $\Pi$ sign($v'_i$) from i=1 to $d_c-1$, is outputted as a sign bit D720. This sign bit D720 becomes a sign bit D721 through the selector 715.

Finally, a value obtained by adding this sign bit D721 to the operation result D719 ($\phi-1(\Sigma|v'_i|)$ from i=1 to $d_c-1$) provides a message D722. This message D722 is outputted through the output port P704 as an output message D204 to be supplied to the decoding result memory 205.

In other words, the node calculator 210 shown in FIG. 16 realizes the operation of equation (13) by subtracting the messages from the variable nodes to be obtained from a sum of all variable nodes connected to check nodes.

Also, in the node calculator 210 shown in FIG. 16, at the final stage of decoding (for example, the variable node operation to be executed last among the variable node operations and the check node operations that are repetitively executed by predetermined repetitive decoding count N), an operation in accordance with an equation obtained by rewriting equation (5) like the equation (12) is executed instead of the variable node operation of equation (12) and a result of this operation, namely, output data D707 from the register 704, is outputted from the output port P705 as a decoding result to be supplied to the decoding result memory 205 shown in FIG. 13.

SUMMARY OF THE INVENTION

Recently, the research and development of systems in which an LDPC-coded data signal and a TMCC (Transmission and Multiplexing Configuration Control) signal are transmitted in a multiplexed manner are being carried out. However, few receiving apparatuses suitable for such systems are currently available.

Therefore, the present invention addresses the above-identified and other problems associated with related-art methods and apparatuses and solves the addressed problems by providing a receiving apparatus that is applicable to systems in which a LDPC-coded data signal and a TMCC signal are transmitted in a multiplexed manner.

According to one embodiment of the present invention, there is provided a first receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as the predetermined parity check matrix or different from the predetermined parity check matrix come as multiplexed, both of the data signal and the transmission control signal and decode the received data signal and the received transmission control signal. The above-mentioned first receiving apparatus has an LDPC decoder configured to decode both of the data signal and the transmission control signal; a data signal input buffer arranged before the LDPC decoder and configured to hold the received data signal and a transmission control signal input buffer arranged before the LDPC decoder and configured to hold the received transmission control signal; and a controller configured to select one of the data signal held in the data signal input buffer and the transmission control signal held in the transmission control signal input buffer as a signal subject to decoding and transmit the selected signal to the LDPC decoder to make the LDPC decoder decode the signal subject to decoding.

In the above-mentioned first receiving apparatus, a received value of the transmission control signal is reduced in the number of quantized bits as compared with the data signal and a resultant value is held in the transmission control signal input buffer.

In the above-mentioned first receiving apparatus, the transmission control signal is an LDPC-coded sequence in which a known signal is added to predetermined control information and is transmitted to the receiving apparatus as a signal with the known signal deleted and the transmission control signal is added with a value denoting that, relative to the signal received by the receiving apparatus, if the known signal is 0, a probability of being 0 is 1 and, if the known signal is 1, a probability of 1 is 1, the resultant transmission control signal being held in the transmission control signal input buffer.

In the above-mentioned first receiving apparatus according, the transmission control signal is an LDPC-coded sequence in which a known signal is added to predetermined control information and is transmitted to the receiving apparatus as a signal with the known signal deleted, the transmitted signal is received by the receiving apparatus to be held in the transmission control signal input buffer, and, if the transmission control signal is selected as the signal subject to decoding, a signal obtained by adding a value denoting that, if the known signal 0, a probability being 0 is 1 and, if the known signal is 1, a probability being 1 is 1 to the signal held in the transmission control signal input buffer is transmitted to the LDPC decoder as the transmission control signal.

In the above-mentioned first receiving apparatus, the transmission control signal is of a series LDPC-coded with a known signal added to predetermined control information and the LDPC decoder handles the known signal of the decoding of the transmission control signal as a value denoting that, if a known signal is 0, a probability being 0 is 1 and, if a known signal is 1, a probability being 1 is 1 with a message of an edge linking to a bit of the known signal.

In the above-mentioned first receiving apparatus, the transmission control signal has a form in which all of the known signals are made up of 0's and the LDPC decoder omits an operation of one of a variable node and a check node of an edge linking to a bit of the known signal with the known signal of the decoding of the transmission control signal.

In the above-mentioned first receiving apparatus, the controller executes control such that the LDPC decoder decodes the transmission control signal during a period of time in which the decoding of the transmission control signal is executed after the completion of the decoding of a first data signal of the data signal and before the decoding of a second data signal.

In the above-mentioned first receiving apparatus, the data signal and the transmission control signal are multiplexed with each other in a predetermined unit for transmission and the controller executes control such that the LDPC decoder decodes the transmission control signal before the second data signal when the receiving apparatus has received the predetermined unit multiplexed with at least the first data signal, the second data signal, and the transmission control signal.

In the above-mentioned first receiving apparatus, the controller executes control such that, if the decoding of a first data signal of the data signal is successful, the LDPC decoder decodes the transmission control signal during a period after the completion of the decoding of the first data signal and before the start of the decoding of a second data signal.

In the above-mentioned first receiving apparatus, the controller causes the LDPC decoder to decode the transmission control signal before the completion of the reception thereof and the LDPC decoder decodes the transmission control signal by setting an unreceived bit of the transmission control signal to a value denoting that a probability being 0 and a probability being 1 is 0.5.

In the above-mentioned first receiving apparatus, the LDPC decoder determines that the decoding has failed if a sequence obtained by decoding the transmission control signal is a value that is not used in a system where the transmission control signal is transmitted.

According to another embodiment of the present invention, there are provided a first receiving method and a first program that correspond to the above-mentioned first receiving apparatus.

In the above-mentioned first receiving apparatus, receiving method, and program, if a data signal LDPC (Low Density Parity Check)-coded by use of a predetermined parity check matrix for defining an LDPC code and a transmission control signal LDPC-coded by use of a parity check matrix the same as or different from the predetermined parity check matrix come as multiplexed with each other, both of these signals are received and decoded. The above-mentioned first receiving apparatus has an LDPC decoder configured to decode both of the data signal and the transmission control signal and a data signal input buffer arranged before the LDPC decoder and configured to hold the received data signal and a transmission control signal input buffer arranged before the LDPC decoder and configured to hold the received transmission control signal. In this configuration, the following processing is executed. That is, one of the data signal held in the data signal input buffer and the transmission control signal held in the transmission control signal input buffer is selected as a signal subject to decoding and the selected signal is transmitted to the LDPC decoder to be decoded.

According to still another embodiment of the present invention, there is provided a second receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as the predetermined parity check matrix or different from the predetermined parity check matrix come as multiplexed, both of the data signal and the transmission control signal and decode the received data signal and said received transmission control signal. This second receiving apparatus has a data signal LDPC decoder dedicated to the decoding of the data signal and a transmission control signal LDPC decoder dedicated to the transmission control signal.

In the above-mentioned second receiving apparatus, the data signal LDPC decoder and the transmission control signal LDPC decoder are configured as a substantially same decoder.

In the above-mentioned second receiving apparatus, the transmission control signal LDPC decoder is configured as a hard-decision decoder.

In the above-mentioned second receiving apparatus, the transmission control signal LDPC decoder is configured so as to execute operations of a variable node and a check node in serial for every bit.

The above-mentioned second receiving apparatus further has a transmission control signal input buffer that is arranged before the transmission control signal LDPC decoder and holds the received transmission control signal.

In the above-mentioned second receiving apparatus, a received value of the transmission control signal is reduced in the number of quantized bits as compared with the data signal and the resultant received value is held in the transmission control signal input buffer.

In the above-mentioned second receiving apparatus, the transmission control signal is an LDPC-coded sequence in which a known signal is added to predetermined control information and is transmitted to the receiving apparatus as a signal with the known signal deleted and the transmission control signal is added with a value denoting that, relative to the signal received by the receiving apparatus, if the known signal is 0, a probability of being 0 is 1 and, if the known signal is 1, a probability of 1 is 1, the resultant transmission control signal being held in the transmission control signal input buffer.

In the above-mentioned second receiving apparatus, the transmission control signal is an LDPC-coded sequence in which a known signal is added to predetermined control information and is transmitted to the receiving apparatus as a signal with the known signal deleted, the transmitted signal is received by the receiving apparatus to be held in the transmission control signal input buffer, and, if the transmission control signal is selected as the signal subject to decoding, a signal obtained by adding a value denoting that, if the known signal 0, a probability being 0 is 1 and, if the known signal is 1, a probability being 1 is 1 to the signal held in the transmission control signal input buffer is transmitted to the transmission control signal LDPC decoder as the transmission control signal.

In the above-mentioned second receiving apparatus the transmission control signal is of a series LDPC-coded with a known signal added to predetermined control information and the transmission control signal LDPC decoder handles the known signal of the decoding of the transmission control signal as a value denoting that, if a known signal is 0, a probability being 0 is 1 and, if a known signal is 1, a probability being 1 is 1 with a message of an edge linking to a bit of the known signal.

In the above-mentioned second receiving apparatus, the transmission control signal has a form in which all of the known signals are made up of 0's and the transmission control signal LDPC decoder omits an operation of one of a variable node and a check node of an edge linking to a bit of the known signal with the known signal of the decoding of the transmission control signal.

In the above-mentioned second receiving apparatus, the transmission control signal LDPC decoder starts the decoding of the transmission control signal before the completion of the reception thereof and the transmission control signal LDPC decoder decodes the transmission control signal by setting an unreceived bit of the transmission control signal to a value denoting that a probability being 0 and a probability being 1 is 0.5.

In the above-mentioned second receiving apparatus, the transmission control signal LDPC decoder determines that the decoding has failed if a sequence obtained by decoding the transmission control signal is a value that is not used in a system where the transmission control signal is transmitted.

According to yet another embodiment of the present invention, there are provided a second receiving method and a second program that correspond to the above-mentioned second receiving apparatus.

In the second receiving apparatus, receiving method, and program according to the embodiment of the invention, if a data signal LDPC-coded by use of a predetermined parity check matrix for defining an LDPC code and a transmission control signal LDPC-coded by use of a parity check matrix the same as or different from the predetermined parity check matrix come as multiplexed with each other, both of these signals are received and decoded.

According to a different embodiment of the present invention, there is provided a third receiving apparatus configured to receive and decode an LDPC (Low Density Parity Check) code. This third receiving apparatus has a separator configured, if a first signal LDPC-coded by use of a predetermined parity check matrix for defining the LDPC code and a second signal LDPC-coded by use of a parity check matrix that is the same as or different from the predetermined parity check matrix come as multiplexed with each other, to separate the first signal from the second signal; and an LDPC decoder configured to decode the first signal and the second signal separated from each other by the separator.

According to a still different embodiment of the present invention, there are provided a third receiving method and a third program that correspond to the above-mentioned third receiving apparatus.

In the third receiving apparatus, method, and program according the embodiment of the present invention, if a first signal LDPC-coded by use of a predetermined parity check matrix for defining the LDPC code and a second signal LDPC-coded by use of a parity check matrix that is the same as or different from the predetermined parity check matrix come as multiplexed with each other, the first signal is separated from the second signal and the separated first signal and the separated second signal are decoded.

As described and according to the embodiments of the present invention, receiving apparatuses configured to receive LDPC codes and decode the received LDPC codes can be provided. Especially, the present invention can reduce the circuit scale of these receiving apparatuses as compared with related-art receiving apparatuses while maintaining the decoding performance of the received apparatuses.

BRIEF DESCRIPTION OF THE DRAWINGS

FIG. 3 is a schematic diagram illustrating a flow of messages;

FIG. 4 is a schematic diagram illustrating an example of a parity check matrix of (3, 6) LDPC codes;

Figure 12:
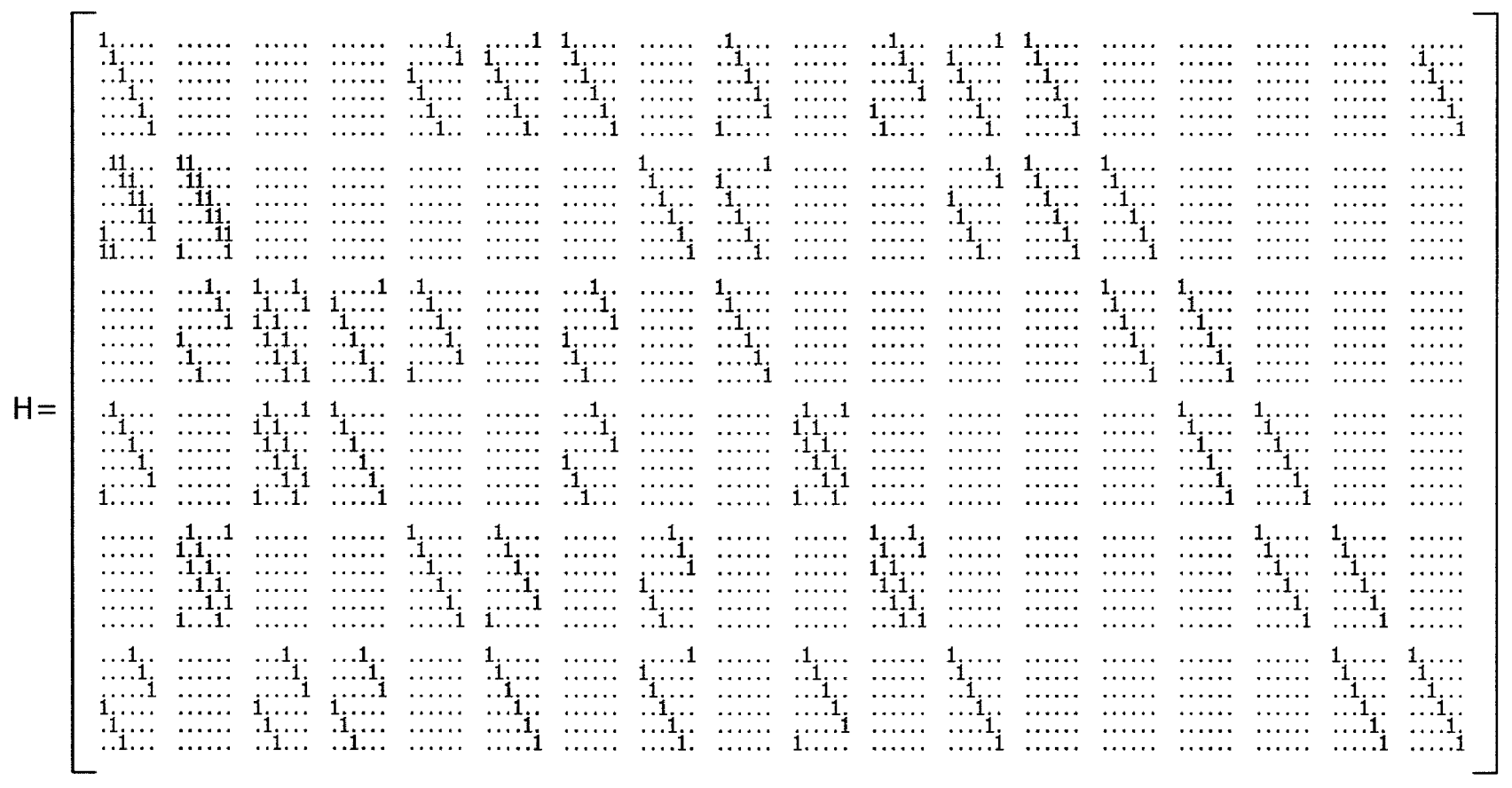

FIG. 12 illustrates an example of a LDPC-code parity check matrix;

FIG. 22 is a block diagram illustrating a first exemplary configuration of a TMCC signal input buffer of the LDPC decoding apparatus shown in FIG. 21 and so on;

FIG. 23 is a block diagram illustrating a second exemplary configuration of the TMCC signal buffer of the LDPC decoding apparatus shown in FIG. 21 and so on;

FIG. 33 is a block diagram illustrating an exemplary configuration of a computer practiced as another embodiment of the decoding apparatus to which the present invention is applied.

DETAILED DESCRIPTION OF THE PREFERRED EMBODIMENTS

This invention will be described in further detail by way of example with reference to the accompanying drawings. The invention described herein and the embodiments thereof have the following correlation. The description hereof is intended to make sure of the fact that the embodiments supporting the invention described herein are described herein. Therefore, if there is any embodiment that, although described in the description of the preferred embodiment, is not described herein as corresponding to the invention, this does not denote in any manner that such an embodiment does not corresponding to the present invention. Conversely, if any embodiment is described herein as corresponding to the invention, it does not denote in any manner that such an embodiment does not corresponding to other inventions than the present invention.

Further, the description hereof does not denote the entire invention described herein. In other words, the existence of any invention described herein and not claimed herein will not deny the existence of any inventions that may be filed as a divisional application, emerge as a result of amendment, or added hereto in the future.

Figure 17:
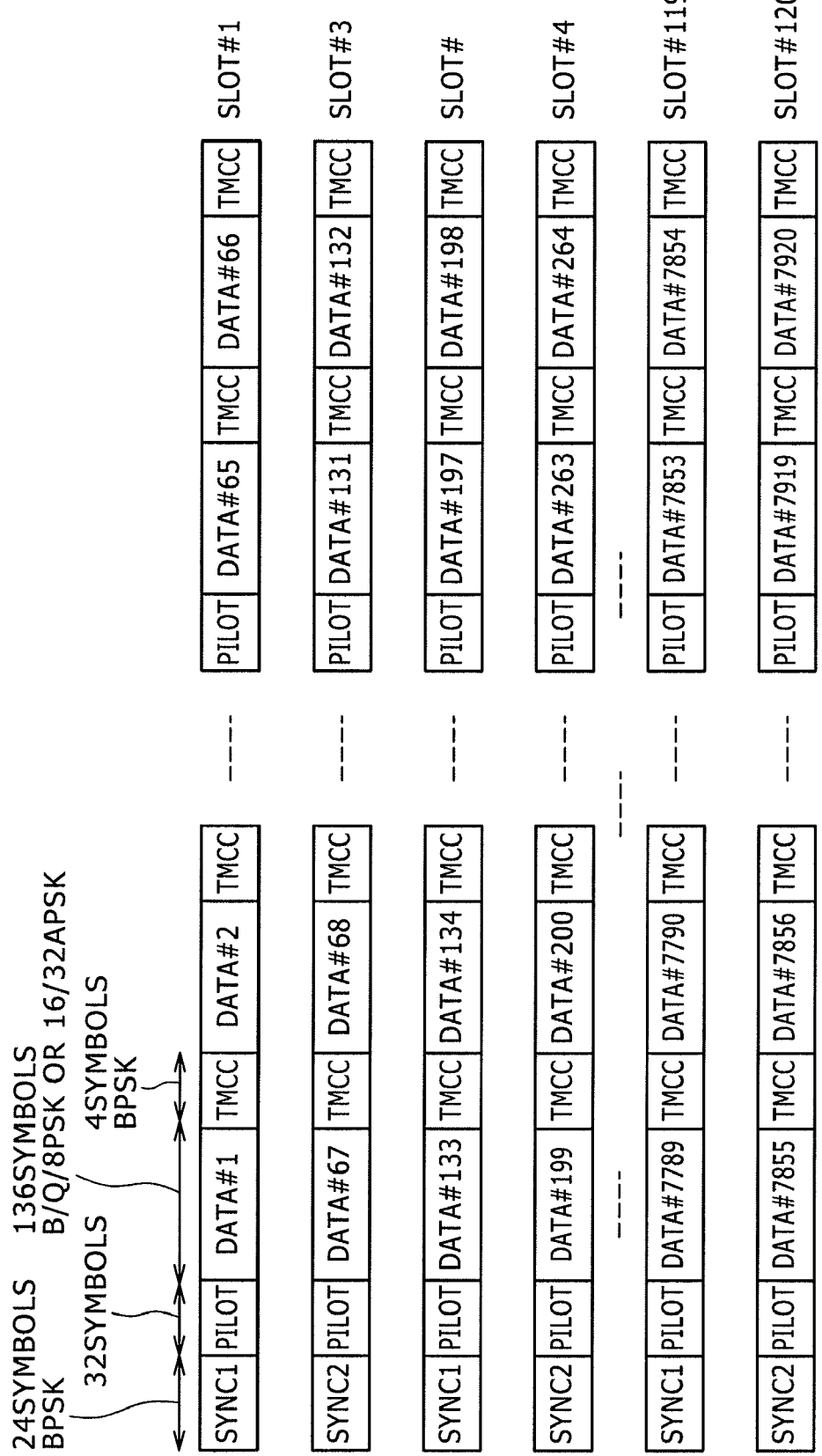
FIG. 17 is a schematic diagram illustrating an example of a signal format for transmitting a data signal and a TMCC signal.

The first receiving apparatus (a LDPC decoding apparatus 804 shown in FIG. 19 for example) is configured to receive both a data signal LDPC (Low Density Parity Check)-coded by use of a predetermined parity check matrix for defining an LDPC code and a transmission control signal LDPC-coded by use of a parity check matrix that is the same as or different from the predetermined parity check matrix and decode the received data signal and the received transmission control signal if these signal come as multiplexed with each other (if Data that is one example of data signal and TMCC that is one example of transmission control signal come as multiplexed with each other in the format shown in FIG. 17, for example). The above-mentioned first receiving apparatus has an LDPC decoder (a LDPC decoding section 1504 shown in FIG. 21 for example) configured to decode both of the data signal and the transmission control signal; a data signal input buffer (a data signal input buffer 1502D shown in FIG. 21 for example) arranged before the LDPC decoder and configured to hold the received data signal and a transmission control signal input buffer (a TMCC signal input buffer 1502T shown in FIG. 21 for example) arranged before the LDPC decoder and configured to hold the received transmission control signal; and a controller (a control section 1506 shown in FIG. 21 for example) configured to select one of the data signal held in the data signal input buffer and the transmission control signal held in the transmission control signal input buffer as a signal subject to decoding and transmit the selected signal to the LDPC decoder to make the LDPC decoder decode the signal subject to decoding.

The second receiving apparatus (a LDPC decoding apparatus 804 shown in FIG. 19 for example) is configured to receive both a data signal LDPC (Low Density Parity Check)-coded by use of a predetermined parity check matrix for defining an LDPC code and a transmission control signal LDPC-coded by use of a parity check matrix that is the same as or different from the predetermined parity check matrix and decode the received data signal and the received transmission control signal if these signals come as multiplex with each other (if Data that is one example of data signal and TMCC that is one example of transmission control signal come as multiplexed in the format shown in FIG. 17 for example). This second receiving apparatus has a data signal LDPC decoder dedicated to the decoding of the data signal and a transmission control signal LDPC decoder dedicated to the transmission control signal.

Figure 21:
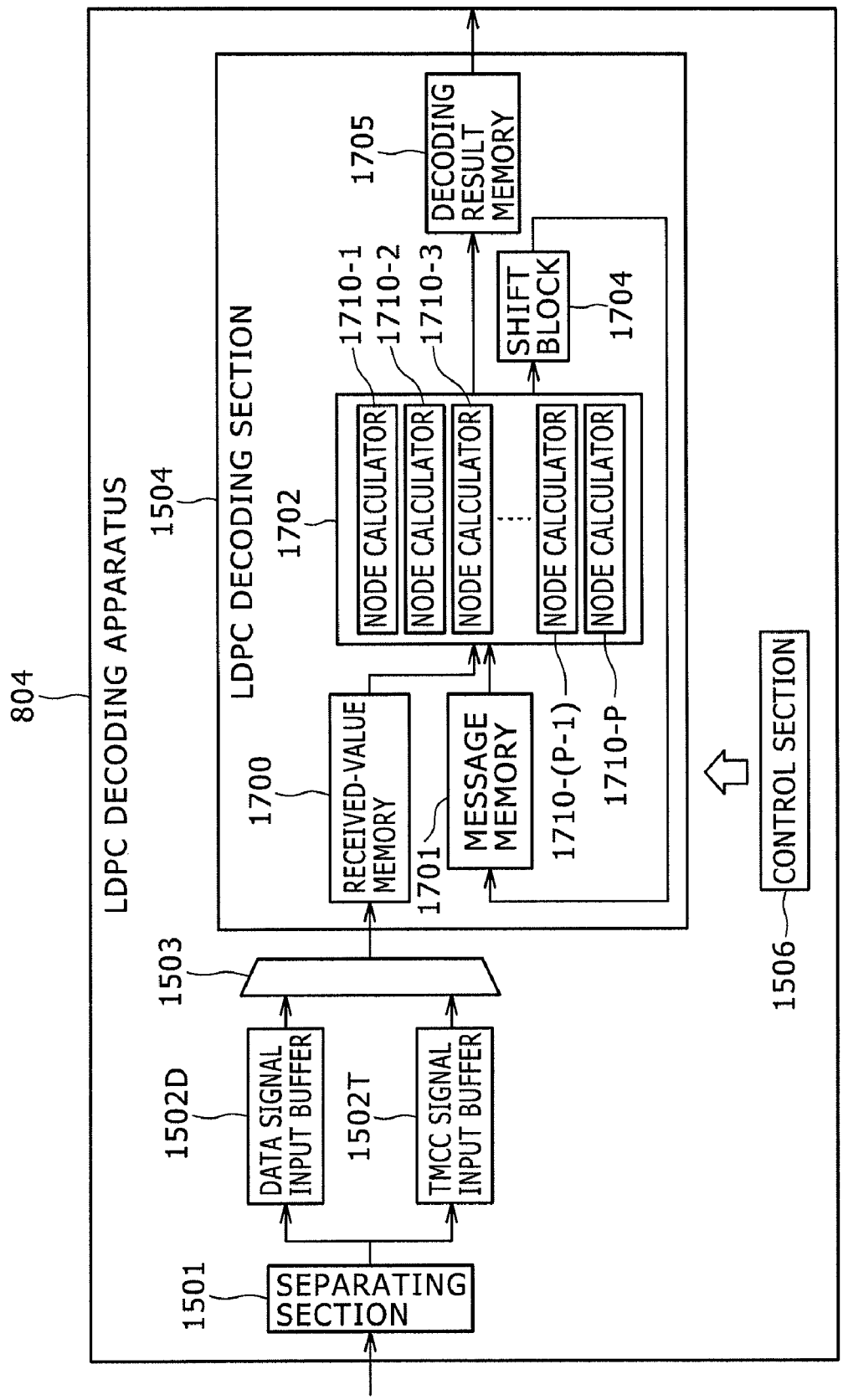
FIG. 21 is a block diagram illustrating a second exemplary configuration of the LDPC decoding apparatus shown in FIG. 19.

In the above-mentioned second receiving apparatus, the data signal LDPC decoder and the transmission control signal LDPC decoder are configured as a substantially same decoder (configured as an LDPC decoding section 1504 in an example shown in FIG. 21, for example).

Figure 26:
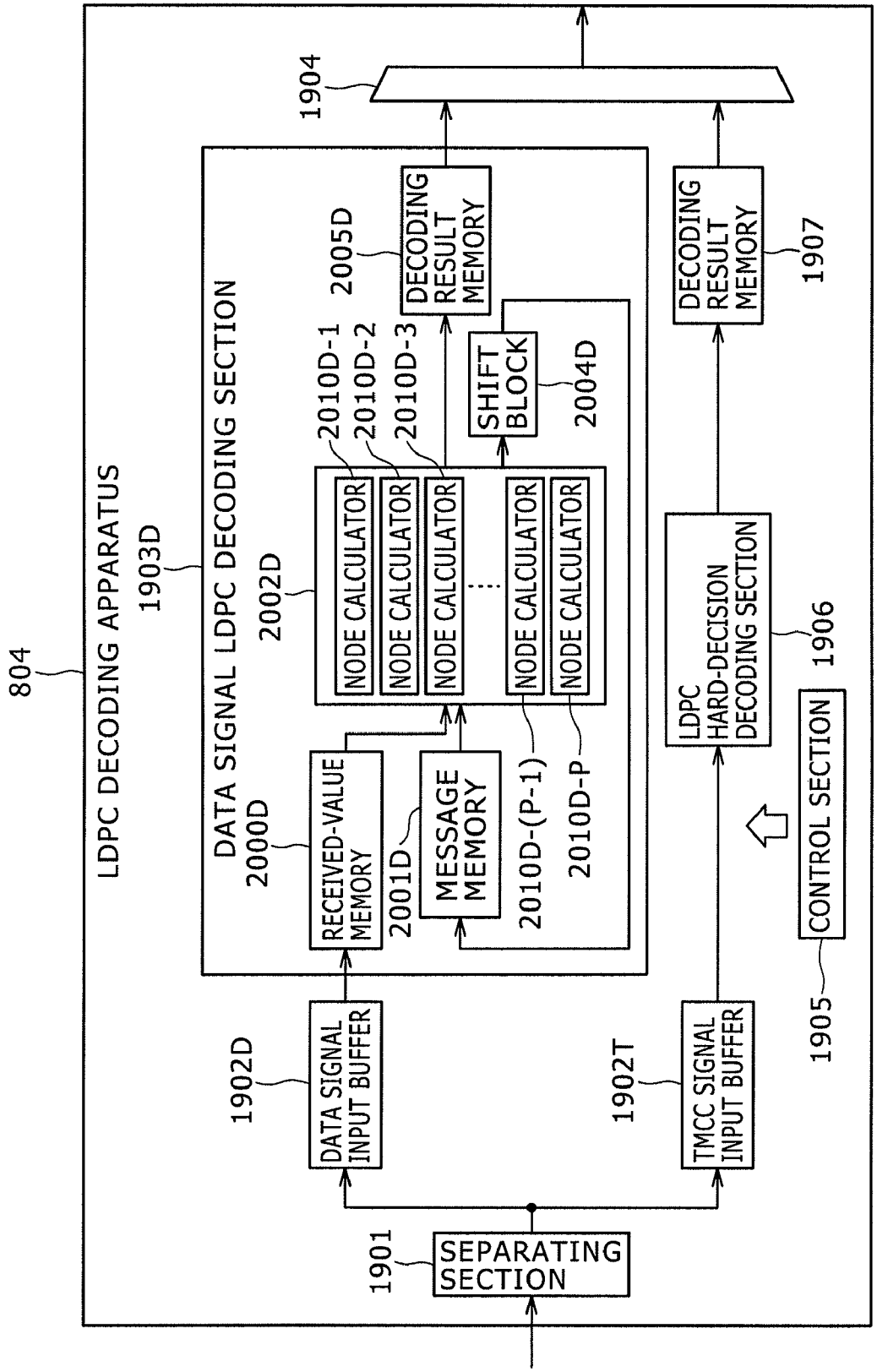
FIG. 26 is a block diagram illustrating a third exemplary configuration of the LDPC decoding apparatus shown in FIG. 19.

In the above-mentioned second receiving apparatus, the transmission control signal LDPC decoder is configured as a hard-decision decoder (configured as an LDPC hard decision decoding block 1906 in an example shown in FIG. 26 for example).

Figure 27:
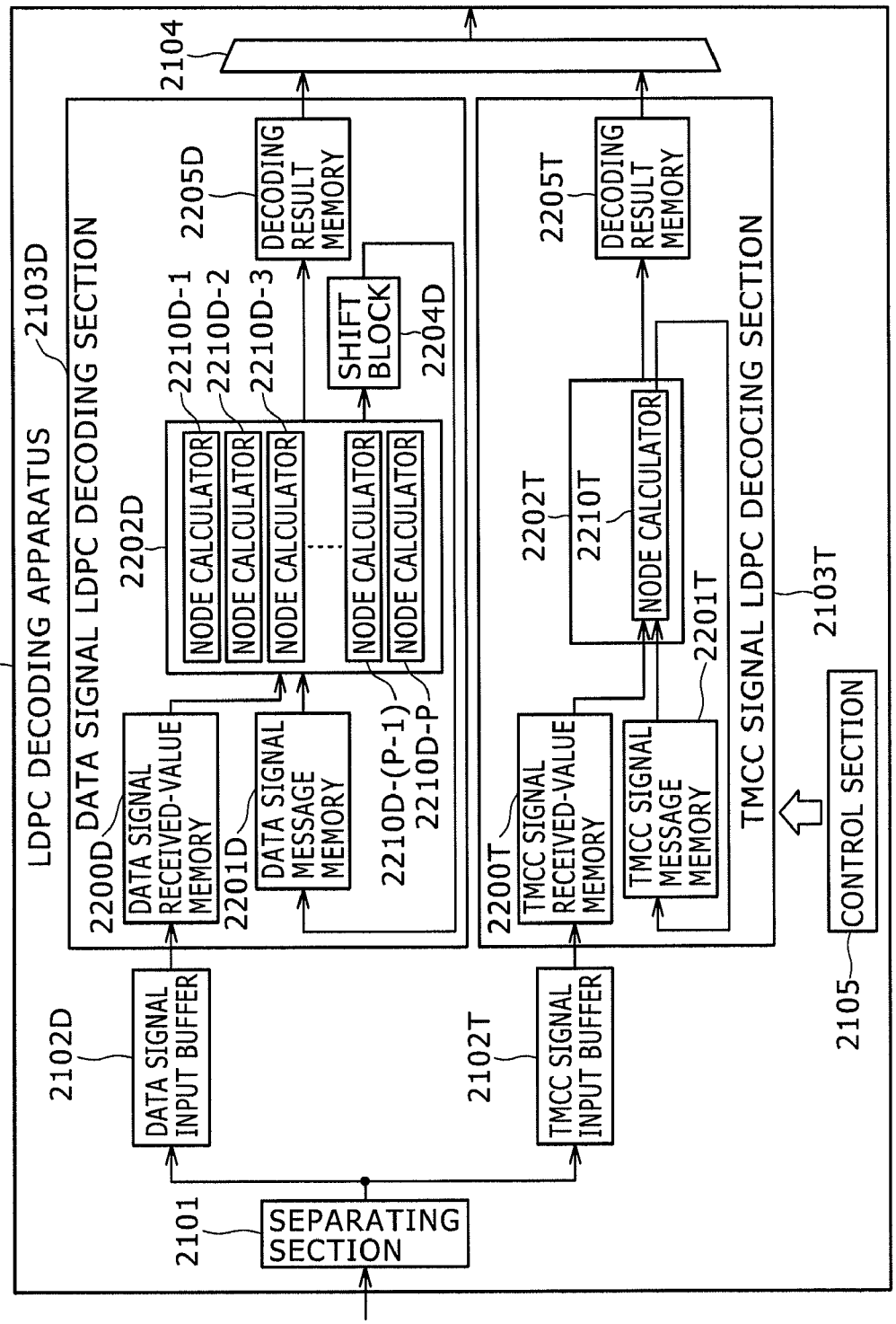
FIG. 27 is a block diagram illustrating a fourth exemplary configuration of the LDPC decoding apparatus shown in FIG. 19.

In the above-mentioned second receiving apparatus, the transmission control signal LDPC decoder is configured so as to execute operations of a variable node and a check node in serial for every bit (configured as a TMCC signal LDPC decoding section 2103T in an example shown in FIG. 27 for example).

The third receiving apparatus (an LDPC decoding apparatus 804 shown in FIG. 19 for example) is configured to receive and decode an LDPC (Low Density Parity Check) code. This third receiving apparatus has a separator (a separating section 1501 shown in FIG. 21 for example) configured, if a first signal LDPC-coded by use of a predetermined parity check matrix for defining the LDPC code and a second signal LDPC-coded by use of a parity check matrix that is the same as or different from the predetermined parity check matrix come as multiplexed with each other (if Data that is one example of a first signal and TCMM that is one example of a second signal come as multiplexed with each other in the format shown in FIG. 17 for example), to separate the first signal from the second signal; and an LDPC decoder (an LDPC decoding section 1504 shown in FIG. 21 for example) configured to decode the first signal and the second signal separated from each other by the separator.

This invention will be described in further detail by way of embodiments thereof with reference to the accompanying drawings.

The present embodiment assumes that a transmission signal to be sent to a receiving apparatus be of a format shown in FIG. 17.

To be more specific, as shown in FIG. 17, in addition to a data signal, a TMCC signal containing a transmission parameter is coded by use of LDPC codes and a signal obtained by time-division-multiplexing each coded data obtained by the coding is sent to the receiving apparatus as a transmission signal.

The unit of transmission signals shown in FIG. 17 is "slot." In what follows, sign #α (α being an integer 1 through 120 in the example shown in FIG. 17) is used to identify each slot.

One slot is made up of Data and TMCC alternately arranged after Sync, Pilot. Data in each slot stores data (hereafter referred to as unit data) obtained by time-dividing an LDPC-coded data signal. On the other hand, TMCC stores unit data obtained by time-dividing an LDPC-coded TMCC signal.

In this case, as shown in FIG. 17, the unit data of data signal and the unit data of TMCC signal are arranged alternately to realize time division multiplexing. It should be noted, however, that, if the LDPC-coded data signal is BPSK, then one LDPC code for data signal is time-division-multiplexed by 5 slots, while one LDPC code for TMCC signal is time-division-multiplexed by 120 slots. In other words, a signal that is obtained by time-division-multiplexing the data signal for 24 LDPC codes and the TMCC signal for 1 LDPC code provides a transmission signal made up of slots #1 through #120 shown in FIG. 17.

Figure 18:
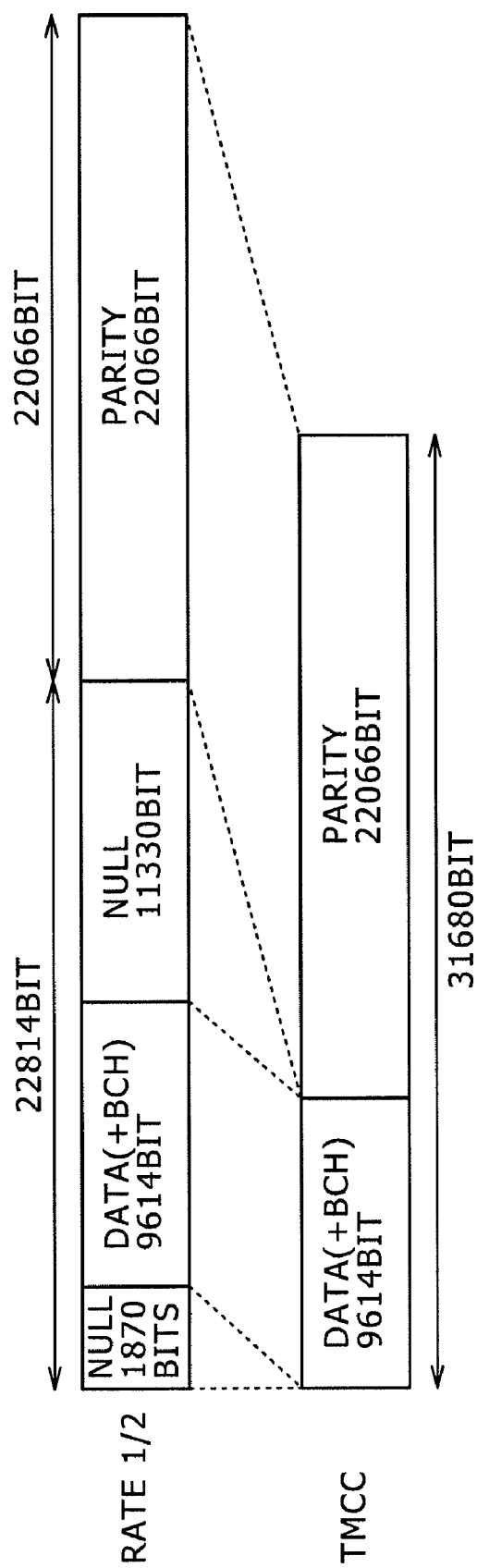
FIG. 18 is a schematic diagram illustrating a technique of LDPC-coding of a TMCC signal.

A data signal at the time of transmission is configured by a code length of 44880 bits, while a TMCC signal at the time of transmission is configured by 31680 bits in the lower side of FIG. 18. To be more specific, as show in the upper side of FIG. 18, at the LDPC coding of a TMCC signal, null data (NULL) with 1870 bits being 0's is added to the beginning of real data (DATA) and null data (NULL) with 11330 bits being 0's is added to the end of the real data (DATA), which provides an information part to be LDPC-coded. It should be noted that, because the transmission of null data is not necessary, the data shown in the lower of FIG. 18, namely, the data of 31680 bits obtained by deleting the null data after the LDPC coding is transmitted to the decoding apparatus as an LDPC-coded TMCC signal. Also, it should be noted that, while a data signal can select two or more coding ratios and two or more modulating schemes, a TMCC signal is fixed in coding ratio and modulating scheme such that the coding ratio is 1/2 and the modulating scheme is BPSK if a known signal (null data, etc.) is put in the length of information, for example.

Figure 19:
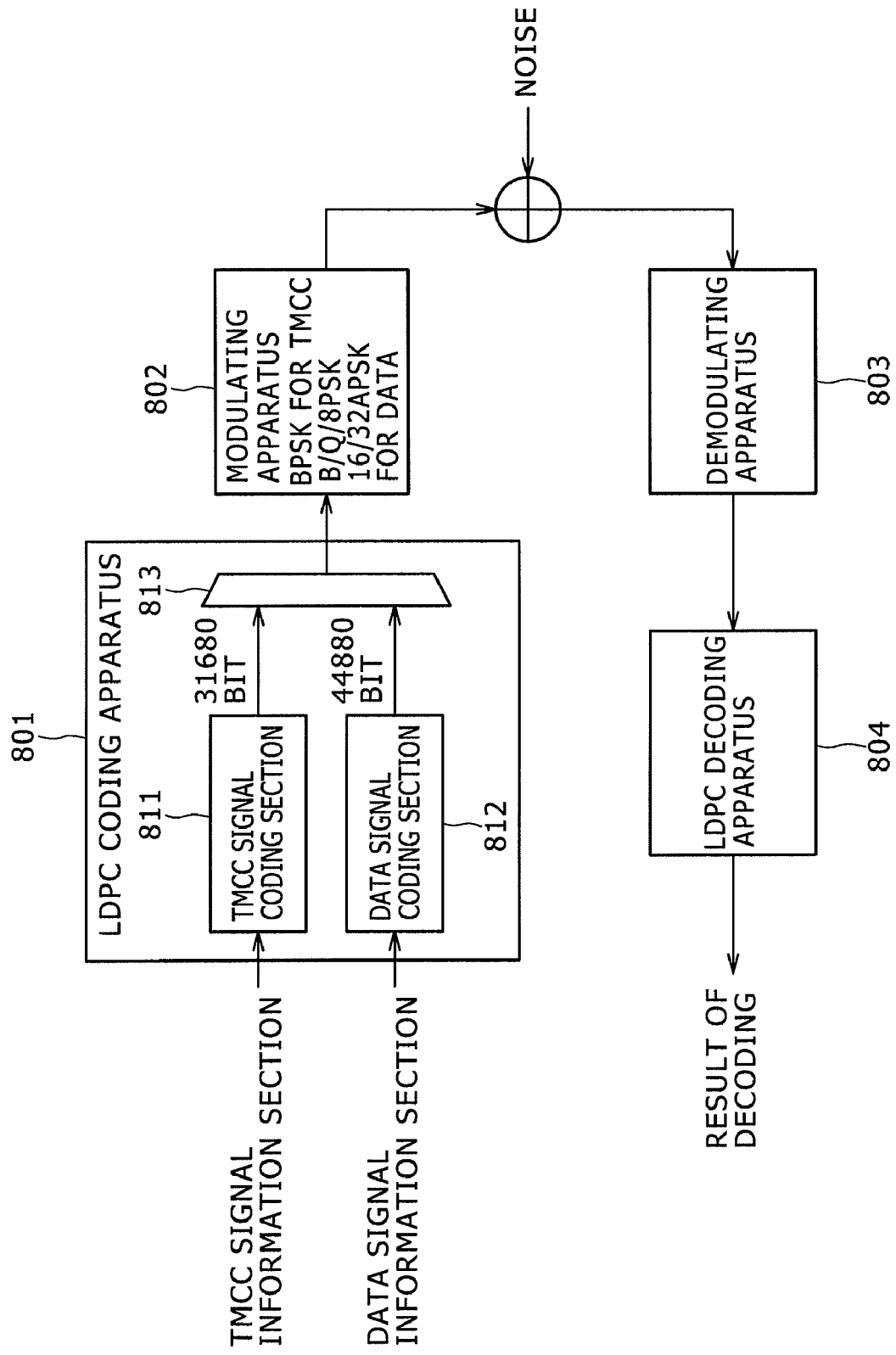
FIG. 19 is a block diagram illustrating an exemplary configuration of a transmission system to which the present invention is applied.

Referring to FIG. 19, there is shown an exemplary configuration of a transmission system by which a transmission signal defined in FIGS. 17 and 18, namely, a transmission signal with a data signal and a TMCC signal time-division multiplexed is transmitted.

In the transmission system shown in FIG. 19, an LDPC coding apparatus 801 and a modulating apparatus 802 are arranged as apparatuses on the transmission side.

The LDPC coding apparatus 801 is configured to contain a TMCC signal coding section 811, a data signal coding section 812, and a selector 813. The LDPC coding apparatus 801 "is configured to contain" because the LDPC coding apparatus 801 also has sections not shown in FIG. 19, such as a control section, for example.

The TMCC signal coding section 811 executes LDPC coding on a TMCC signal information section to generate an LDPC signal having the above-mentioned structure shown in the lower of FIG. 18, namely, an LDPC signal of 31680 bits, outputting the generated signal to the selector 813. It should be noted that the TMCC signal information section at the stage of input into the TMCC signal coding section 811 may have the structure shown in the upper of FIG. 18 that includes null data or a structure having only real data without having null data. In the latter, the TMCC signal coding section 811 may add null data in accordance with the structure shown in the upper of FIG. 18 and then execute LDPC coding on the resultant signal.

On the other hand, the data signal coding section 812 executes LDPC coding on the data signal information section to generate an LDPC signal of 44880 bits, outputting the generated signal to the selector 813.

Under the control of a control section, not shown, the selector 813 properly switches between input and output to realize the time-division multiplexing between the LDPC-coded data signal and LDPC-coded TMCC signal. To be more specific, a transmission signal having the format shown in FIG. 17 is outputted from the LDPC coding apparatus 801 to be modulated by the modulating apparatus 802 and the modulated signal is added with noise along a transmission path to be transmitted to the receiving side.

Apparatuses on the receiving side for receiving such a transmission signal, namely, the receiving apparatuses to which the present invention is applied include a demodulating apparatus 803 and an LDPC decoding apparatus 804.

To be more specific, a transmission signal modulated by the modulating apparatus 802 is demodulated by the demodulating apparatus 803 to be supplied to the LDPC decoding apparatus 804 in the above-mentioned form shown in FIG. 17.

As described above, the demodulating apparatus 803 may be a related-art demodulating apparatus without change.

The LDPC decoding apparatus 804 as at least a part of the receiving apparatus to which the present invention is applied decodes a transmission signal supplied from the demodulating apparatus 803 and outputs a resultant decoded signal.

The transmission signal to be supplied to the LDPC decoding apparatus 804 is a transmission signal having the form shown in FIG. 17, namely, a transmission signal with the LDPC-coded data signal and TMCC signal multiplexed.

Therefore, the LDPC decoding apparatus 804 separates the LDPC-coded data signal from the LDPC-coded TMCC signal and separately decodes the separated signals, outputting a decoded data signal and a decoded TMCC signal.

In other words, it is enough for the LDPC decoding apparatus 804 to have only the capabilities of decoding LDPC-coded data signals and LDPC-coded TMCC signals and the configuration itself of the LDPC decoding apparatus 804 is not especially restricted in any way. To be more specific, the LDPC decoding apparatus 804 may take various embodiments. The following specifically describes each of some embodiments of the LDPC decoding apparatus 804.

Figure 20:
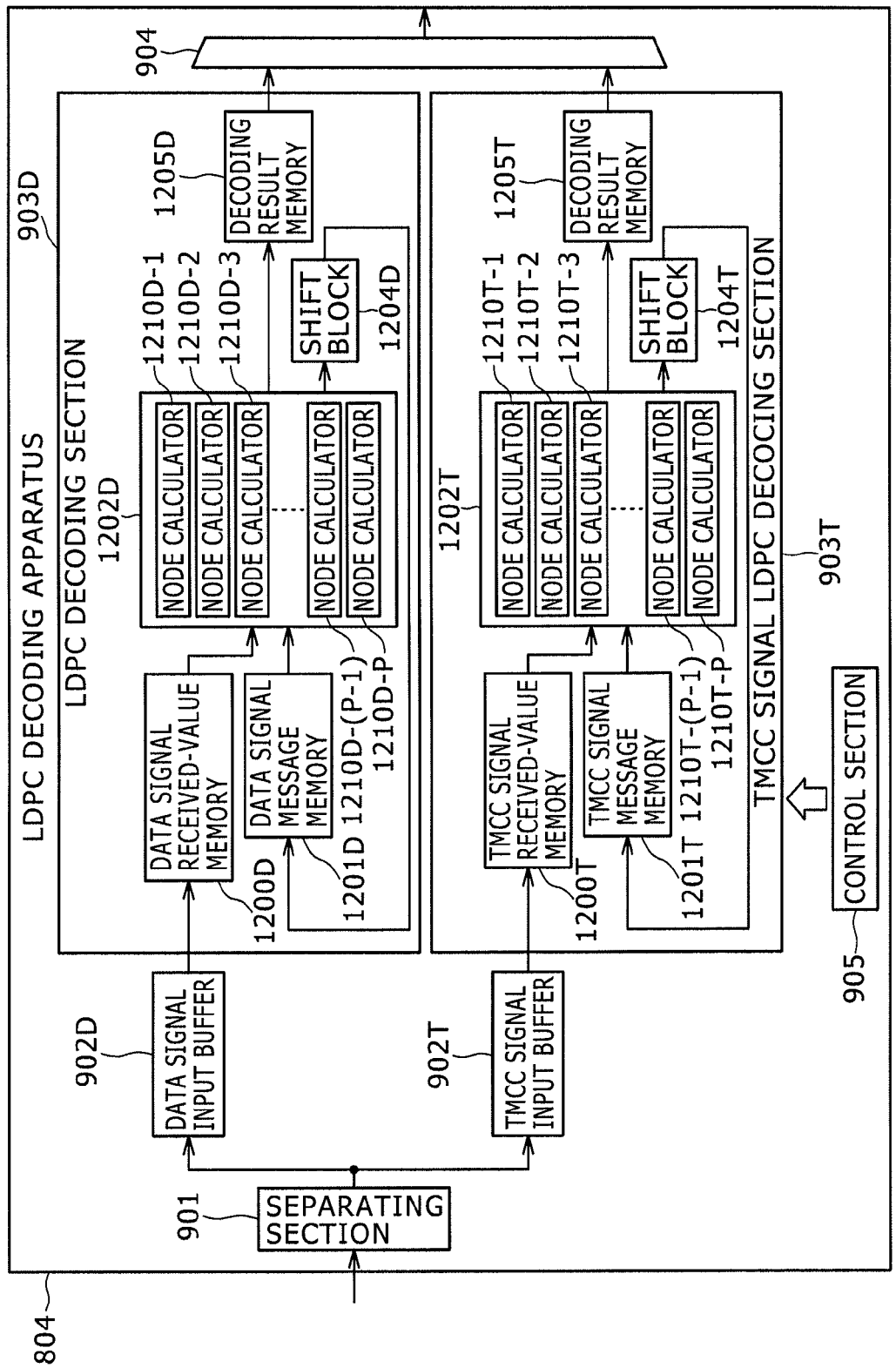
FIG. 20 is a block diagram illustrating a first exemplary configuration of an LDPC decoding apparatus shown in FIG. 19.

Referring to FIG. 20, there is shown an exemplary configuration of the LDPC decoding apparatus 804 practiced as one embodiment of the invention.

The LDPC decoding apparatus 804 shown in FIG. 20 has a separating section 901, a data signal input buffer 902D, a TMCC signal input buffer 902T, a data signal LDPC decoding section 903D, a TMCC signal LDPC decoding section 903T, a selector 904, and a control section 905.

Figure 13:
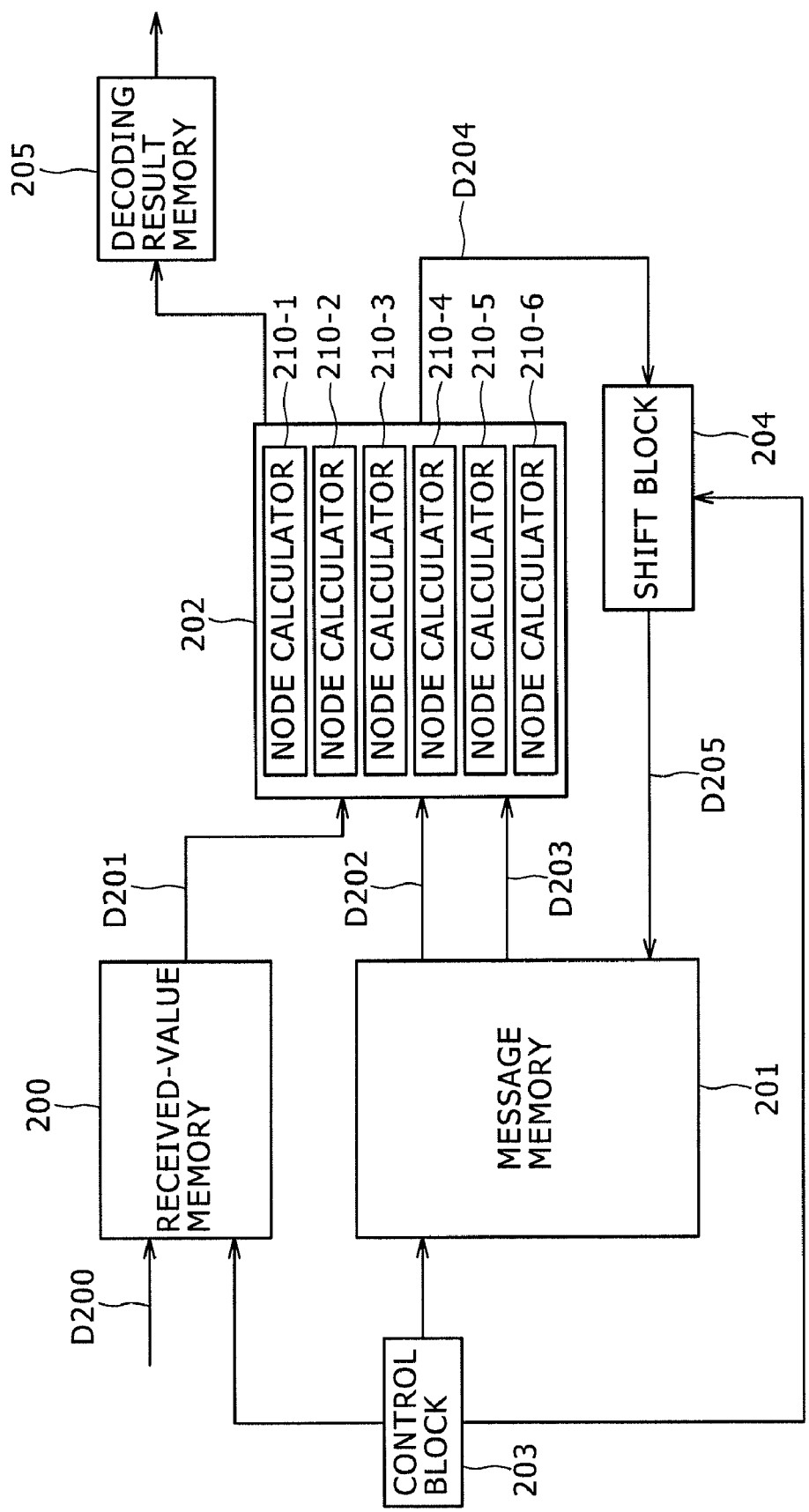
FIG. 13 is a block diagram illustrating an exemplary configuration of a related-art LDPC-code decoding apparatus for executing parity parallel decoding.
Figure 14:
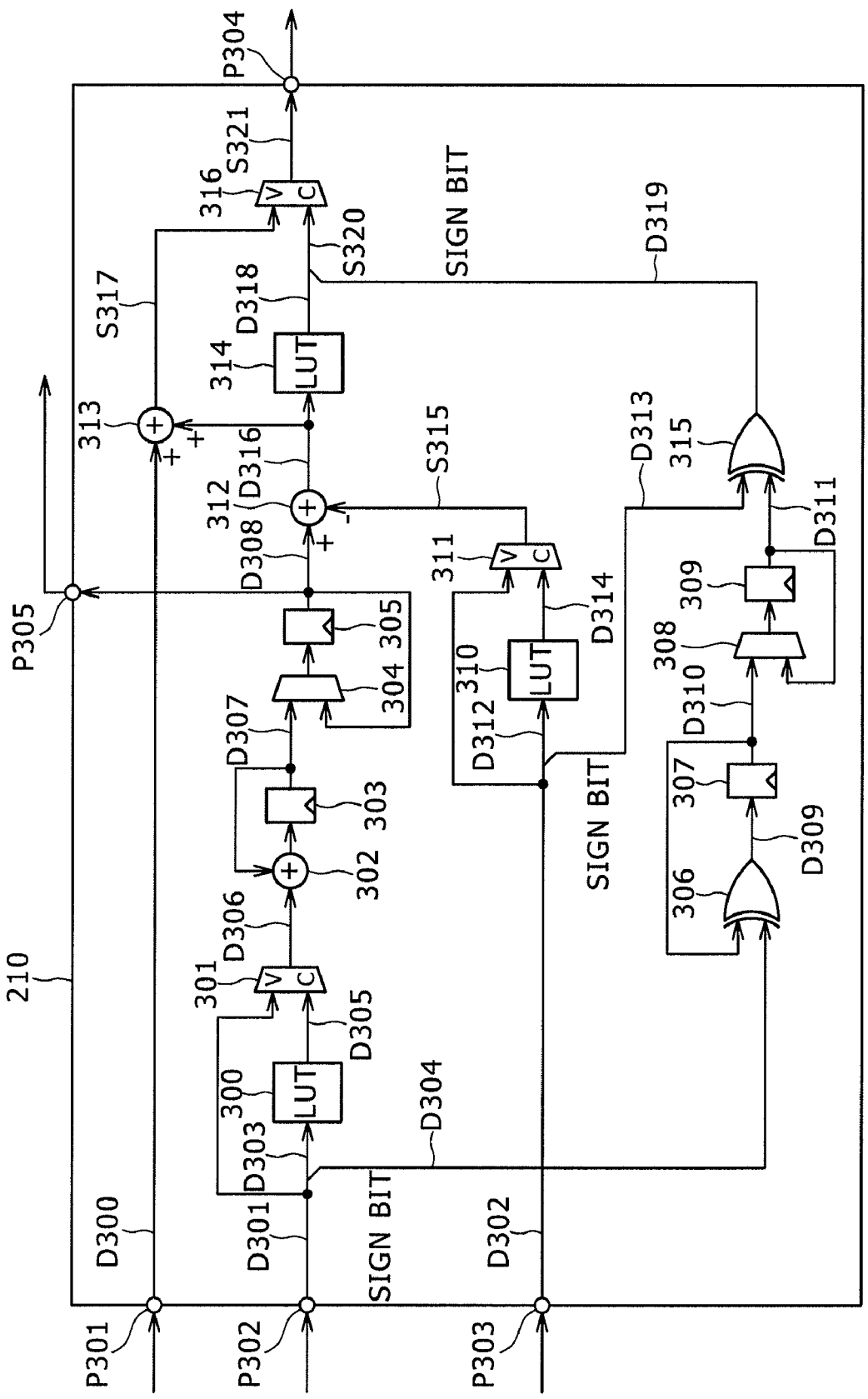
FIG. 14 is a block diagram illustrating a first exemplary configuration of a node calculator.
Figure 15:
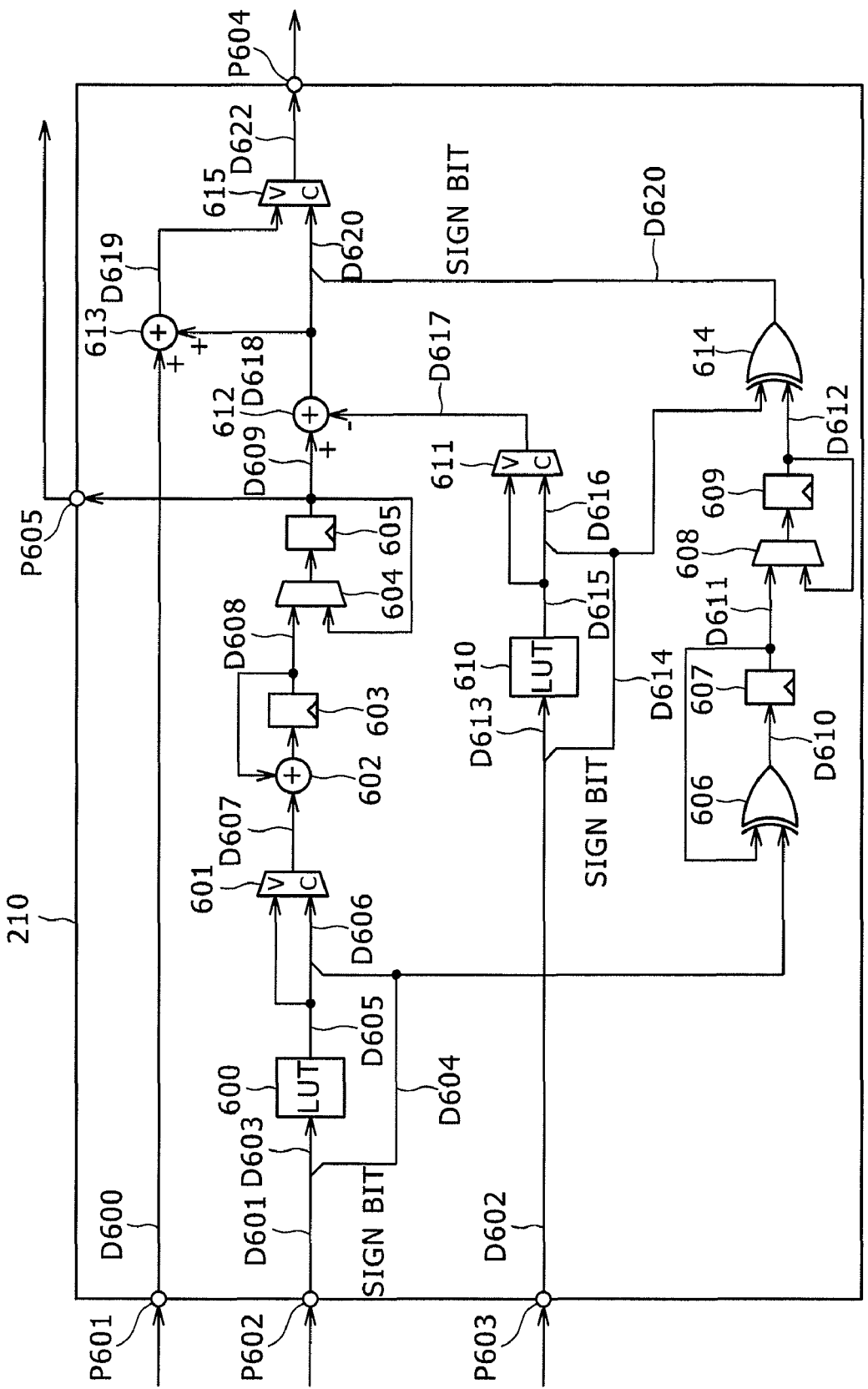
FIG. 15 is a block diagram illustrating a second exemplary configuration of a node calculator.
Figure 16:
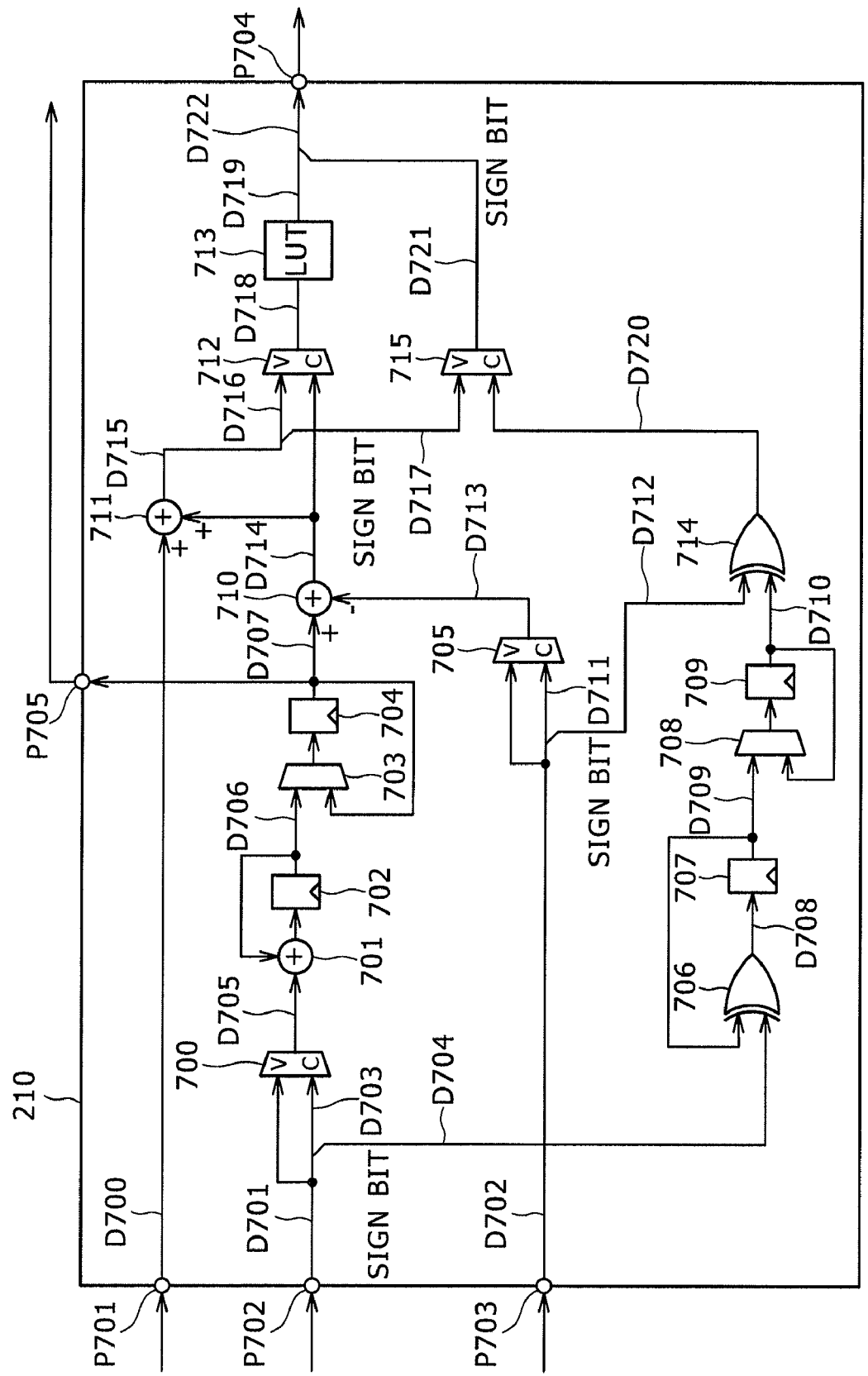
FIG. 16 is a block diagram illustrating a third exemplary configuration of a node calculator.

The data signal LDPC decoding section 903D and the TMCC signal LDPC decoding section 903T each have basically the same function and configuration of the decoding apparatus shown in FIG. 13. "Basically" denotes that, in the decoding apparatus shown in FIG. 13, "P=6 code" is decoded, while, in the LDPC decoding apparatus 804 shown in FIG. 20, "P code," where P is any integer, is decoded. In addition, in the example shown in FIG. 20, no control section is incorporated; instead, the control section 905 is externally arranged.

To be more specific, the data signal LDPC decoding section 903D shown in FIG. 20 has a data signal received-value memory 1200D, a data signal message memory 1201D, a message calculating block 1202D including P node calculators 1210D-1 through 1210D-P, a shift block 1210D, and a decoding result memory 1205D.

Likewise, the TMCC signal LDPC decoding section 903T has a TMCC signal received-value memory 1200T, a TMCC signal message memory 1201T, a message calculating block 1202T including P node calculators 1210T-1 through 1210T-P, a shift block 1204T, and a decoding result memory 1205T.

The following describes an operation of the LDPC decoding apparatus 804.

Namely, a transmission signal (after demodulation) having the form shown in FIG. 17 is supplied to the separating section 901 of the LDPC decoding apparatus 804. Receiving this transmission signal, the separating section 901 separates the received signal into an LDPC-coded data signal (Data) and an LDPC-coded TMCC signal (TMCC), supplying the LDPC-coded data signal to the data signal input buffer 902D and the LDPC-coded TMCC signal to the TMCC signal input buffer 902T as received values.

Each received value once held in the data signal input buffer 902D is kept held in the data signal input buffer 902D until a data signal entered in the preceding slot is transferred to the data signal received-value memory 1200D of the data signal LDPC decoding section 903D to be completely decoded.

The data signal LDPC decoding section 903D decodes the LDPC-decoded data signal and supplies a result of the decoding, namely, a data signal, to the selector 904. It should be noted that the decoding processing itself is substantially the same as the processing of the decoding apparatus shown in FIG. 13 except for the possibility of changing of P, so that the description of the decoding processing will be skipped below.

The completely the same processing as the above-mentioned decoding processing of LDPC-coded data signals is executed in both the TMCC signal input buffer 902T and the TMCC signal LDPC decoding section 903T and a result of the decoding, namely, a TMCC signal, is supplied to the selector 904.

The data signal outputted from the data signal LDPC decoding section 903D or the TMCC signal outputted from the TMCC signal LDPC decoding section 903T is outputted outside through the selector 904 as a final decoding result.

It should be noted that the above-mentioned operation of the entire LDPC decoding apparatus 804 is controlled by the control section 905.

As described above, the LDPC decoding apparatus 804 shown in FIG. 20 has the TMCC signal LDPC decoding section 903T in addition to the data signal LDPC decoding section 903D. Namely, the LDPC decoding apparatus 804 shown in FIG. 20 has the two LDPC decoding sections of the same configuration.

Therefore, if the configuration shown in FIG. 20 is employed as the LDPC decoding apparatus 804, the circuit scale increases by one circuit section, namely, the LDPC decoding section, as compared with a related-art decoding apparatus that involves no TMCC signal decoding. Therefore, if there is a demand for reducing the circuit scale, a configuration shown in FIG. 21, for example, may be employed as the configuration of the LDPC decoding apparatus 804.

Namely, FIG. 21 shows an exemplary configuration of the LDPC decoding apparatus 804 practiced as one embodiment of the invention and therefore shows a different example from that shown in FIG. 20.

The LDPC decoding apparatus 804 shown in FIG. 21 has a separating section 1501, data signal input buffer 1502D, a TMCC signal input buffer 1502T, a selector 1503, an LDPC decoding section 1504, and a control section 1506.

The LDPC decoding section 1504 has a received-value memory 1700, a message memory 1701, a message calculating block 1702 including P node calculators 1710-1 through 1710-P, a shift block 1704, and a decoding result memory 1705.

To be more specific, the LDPC decoding section 1504 has the substantially the same function and configuration as those of the data signal LDPC decoding section 903D and the TMCC signal LDPC decoding section 903T shown in FIG. 20. In other words, while the LDPC decoding apparatus 804 shown in FIG. 20 has two LDPC decoding sections, the LDPC decoding apparatus 804 shown in FIG. 21 has only one LDPC decoding section.

The following describes an operation to be executed by the LDPC decoding apparatus 804 shown in FIG. 21.

A transmission signal (after demodulation) having the form shown in FIG. 17 is supplied to the separating section 1501 of the LDPC decoding apparatus 804. The separating section 1501 separates the received signal into an LDPC-coded data signal (Data) and an LDPC-coded TMCC signal (TMCC) and supplies the LDPC-coded data signal to the data signal input buffer 1502D and the LDPC-coded TMCC signal to the TMCC signal input buffer 1502T, as received values.

To be more specific, while the LDPC-coded data signal is held in the data signal input buffer 1502D as a received value, the LDPC-coded TMCC signal is held in the TMCC signal input buffer 1502T as a received value.

Under the control of the control section 1506, the selector 1503 supplies the received value (the LDPC-coded data signal) held in the data signal input buffer 1502D or the received value (the LDPC-coded TMCC signal) held in the TMCC signal input buffer 1502T to the LDPC decoding section 1504.

The LDPC decoding section 1504 decodes the received value supplied from the selector and outputs the decoded value. Namely, if the LDPC-coded data signal was supplied as a received value, the data signal is outputted as a decoding result. On the other hand, if the LDPC-coded TMCC signal was supplied as a received value, the TMCC signal is outputted as a decoding result.

In other words, on the basis of predetermined scheduling, the control section 1506 manages data signal decoding timing and TMCC signal decoding timing. Specific examples of this scheduling will be described later with reference to FIGS. 29 through 32.

To be more specific, with the decoding timing of a data signal, the input of the selector 1503 is switched to the data signal input buffer 1502D under the control of the control section 1506. Consequently, the received value (the LDPC-coded data signal) is transferred from the data signal input buffer 1502D to the received-value memory 1700 via the selector 1503 to be decoded in the LDPC decoding section 1504.

When the data signal has been decoded and the TMCC signal decoding timing comes, the input of the selector 1503 is switched to the TMCC signal input buffer 1502T under the control of the control section 1506. Consequently, the received value (the LDPC-coded TMCC signal) is transferred from the TMCC signal input buffer 1502T to the received-value memory 1700 via the selector 1503 to be decoded in the LDPC decoding section 1504.

As described above, if the configuration shown in FIG. 21 is employed as the LDPC decoding apparatus 804, as compared with the configuration shown in FIG. 20, the circuit scale can be reduced by one LDPC decoding section. Namely, except for the input buffer, no separate circuits are necessary for the decoding of data signals and decoding of TMCC signals, which can be processed by a common circuit, thereby reducing the circuit scale.

Further, reducing the number of quantized bits of the received value as a LDPC-coded TMCC signal allows the reduction in the size of the TMCC signal input buffer 1502T. Each LDPC-coded TMCC signal has a low coding ratio of 1/2 even if a known signal is included in the information length, for example, and therefore is transmitted in BPSK modulation, so that a required CN is far smaller than that of an LDPC-coded data signal, thereby making it successful to decode with a sufficiently low CN if the number of received value bits is reduced.

However, the LDPC-coded TMCC signal at the stage of being entered in the TMCC signal input buffer 1502T from the separating section 1501 has 31600 bits per code as shown in the lower of FIG. 18. In contrast, the LDPC-coded data signal at the stage of being entered in the data signal input buffer 1502D from the separating section 1501 has 44880 bits per code as described above.

Therefore, if the decoding of a data signal and a TMCC signal is commonly executed in the LDPC decoding section 1504, it is necessary to reconvert the structure of the LDPC-coded TMCC signal into the structure shown in the upper of FIG. 18. Namely, it is necessary to add a value equivalent to 13200-bit null data inserted at the time of LDPC coding to the structure of 31600 bits per code to provide the structure of 44880 bits per code, supplying a conversion result to the LDPC decoding section 1504.

Figure 22:
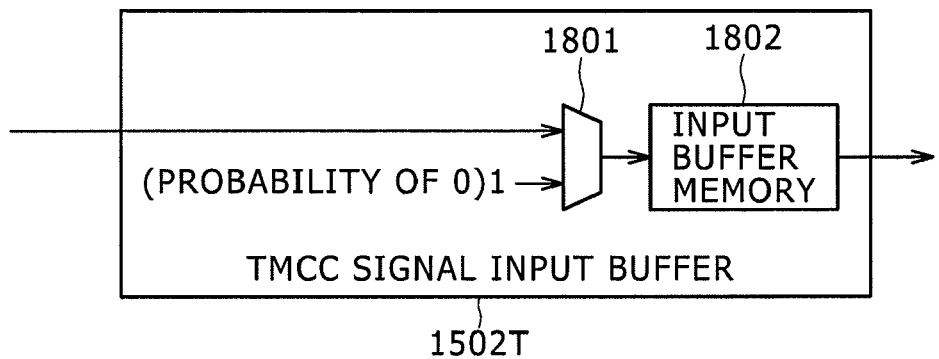

Therefore, the buffer having a structure shown in FIG. 22 may be employed as the TMCC signal input buffer 1502T, for example. Namely, the TMCC signal input buffer 1502T shown in FIG. 22 is made up of a selector 1801 and an input buffer memory 1802.

The TMCC signal input buffer 1502T shown in FIG. 22 operates as follows. Namely, null data inserted when a TMCC signal is LDPC-coded is supplied to the selector 1801 as probability 1 in which the data is all 0's. An LDPC-coded TMCC signal at the stage of being entered in the TMCC signal input buffer 1502T from the separating section 1501, namely, the signal having the structure of 31600 bits per code shown in the lower of FIG. 18, is also supplied to the selector 1801. So, under the control of the control section 1506, a value with probability 1 in which the data is all 0's is supplied to the input buffer memory 1802 via the selector 1801 with the timing corresponding to the null data of the structure shown in the upper of FIG. 18; with other timings, a received value outputted from the separating section 1501 is supplied to the input buffer memory 1802 via the selector 1801. Namely, a value with probability 1 in which the null data inserted when the TMCC signal is LDPC-coded is all 0's is inserted in the input buffer memory 1802. If this is expressed in a logarithmic likelihood ratio of "0," value +∞ is provided and becomes a maximum possible value when installing this on hardware.

Figure 23:
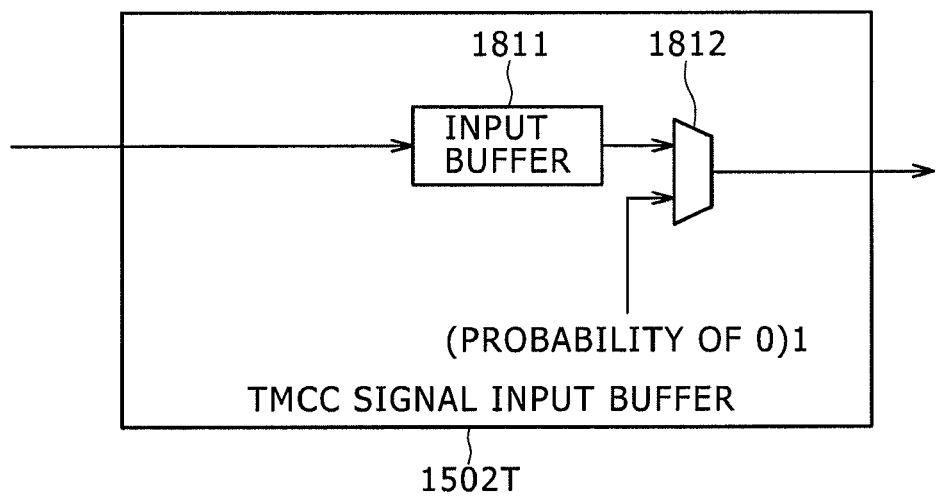

Alternatively, a buffer having a structure shown in FIG. 23 may be employed as the TMCC signal input buffer 1502T, for example. The TMCC signal input buffer 1502T shown in FIG. 23 has an input buffer 1811 and a selector 1812.

The TMCC signal input buffer 1502T shown in FIG. 23 operates as follows. Namely, null data inserted when a TMCC signal is LDPC-coded is supplied to the selector 1812 as probability 1 in which the data is all 0's. An LDPC-coded TMCC signal at the stage of being entered in the TMCC signal input buffer 1502T from the separating section 1501, namely, the signal having the structure of 31600 bits per code shown in the lower of FIG. 18, is buffered in the input buffer 1811 before being supplied to the selector 1812. So, under the control of the control section 1506, a value with probability 1 in which the data is all 0's is outputted from the selector 1812 with the timing corresponding to the null data of the structure shown in the upper of FIG. 18; with other timings, the received value buffered in the input buffer 1811 is outputted from the selector 1812. Namely, the null data inserted when the TMCC signal is coded is inserted in the received value with probability 1 in which the data is all 0's when the received value is transferred to the LDPC decoding section 1504. If this is expressed in a logarithmic likelihood ratio of "0," value +∞ is provided and becomes a maximum possible value when installing this on hardware.

Use of any one of the structures in FIGS. 22 and 23 as the TMCC signal input buffer 1502T makes the LDPC-coded TMCC signal at the stage of being outputted from the TMCC signal input buffer 1502T become a signal having the structure of 44880 bits per code shown in the upper of FIG. 18. Namely, the number of bits per code is common to both data signal and TMCC signal. As a result, the stage subsequent to the selector 1503 shown in FIG. 21, namely, the LDPC decoding section 1504, can also decode TMCC signals in the same manner the decoding of data signals.

Figure 24:
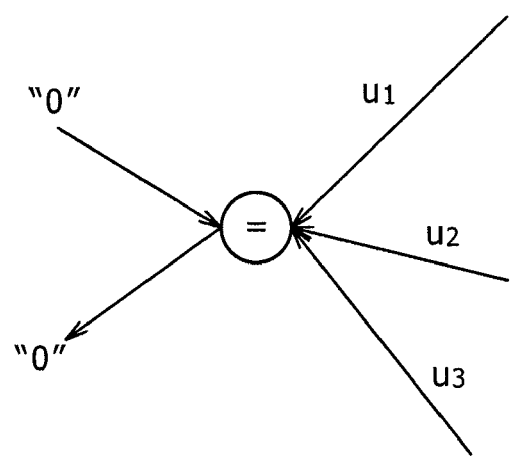
FIG. 24 is a schematic diagram illustrating a decoding result output calculation of null bits in an LDPC-coded TMCC signal.
Figure 25:
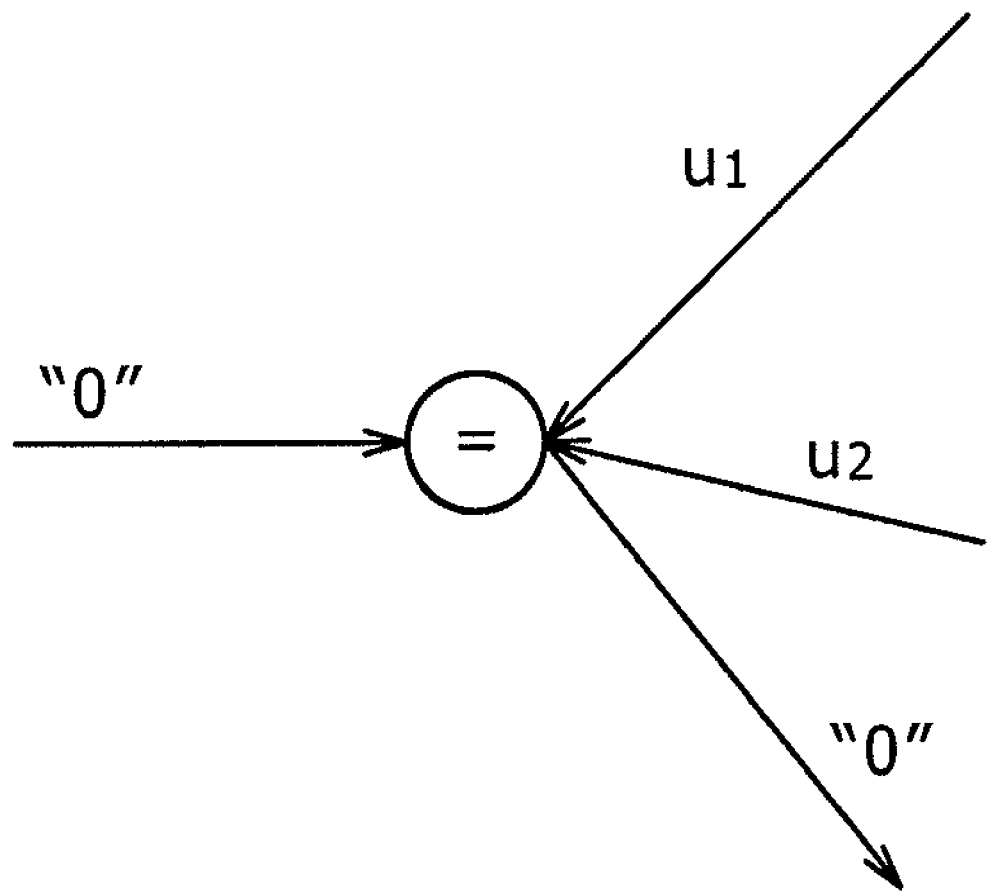
FIG. 25 is a schematic diagram illustrating a message calculation at a variable node for null bits in an LDPC-coded TMCC signal.

It should be noted that LDPC decoding section 1504 can decode the null bits of LDPC-coded TMCC signals (null bits included) in techniques shown in FIGS. 24 and 25.

Referring to FIG. 24, there is shown a null bit decoding result outputting technique.

Figure 8:
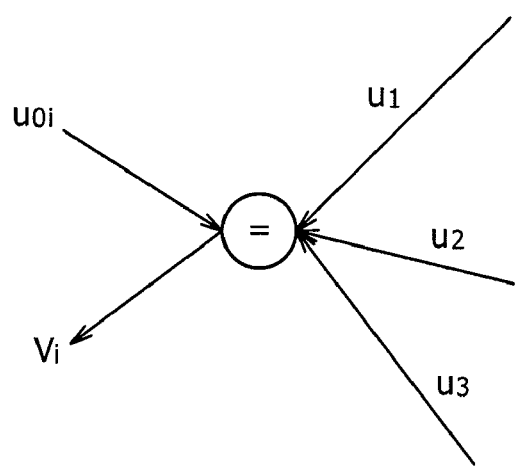
FIG. 8 is a schematic diagram illustrating a decoding result output calculation.
Figure 9:
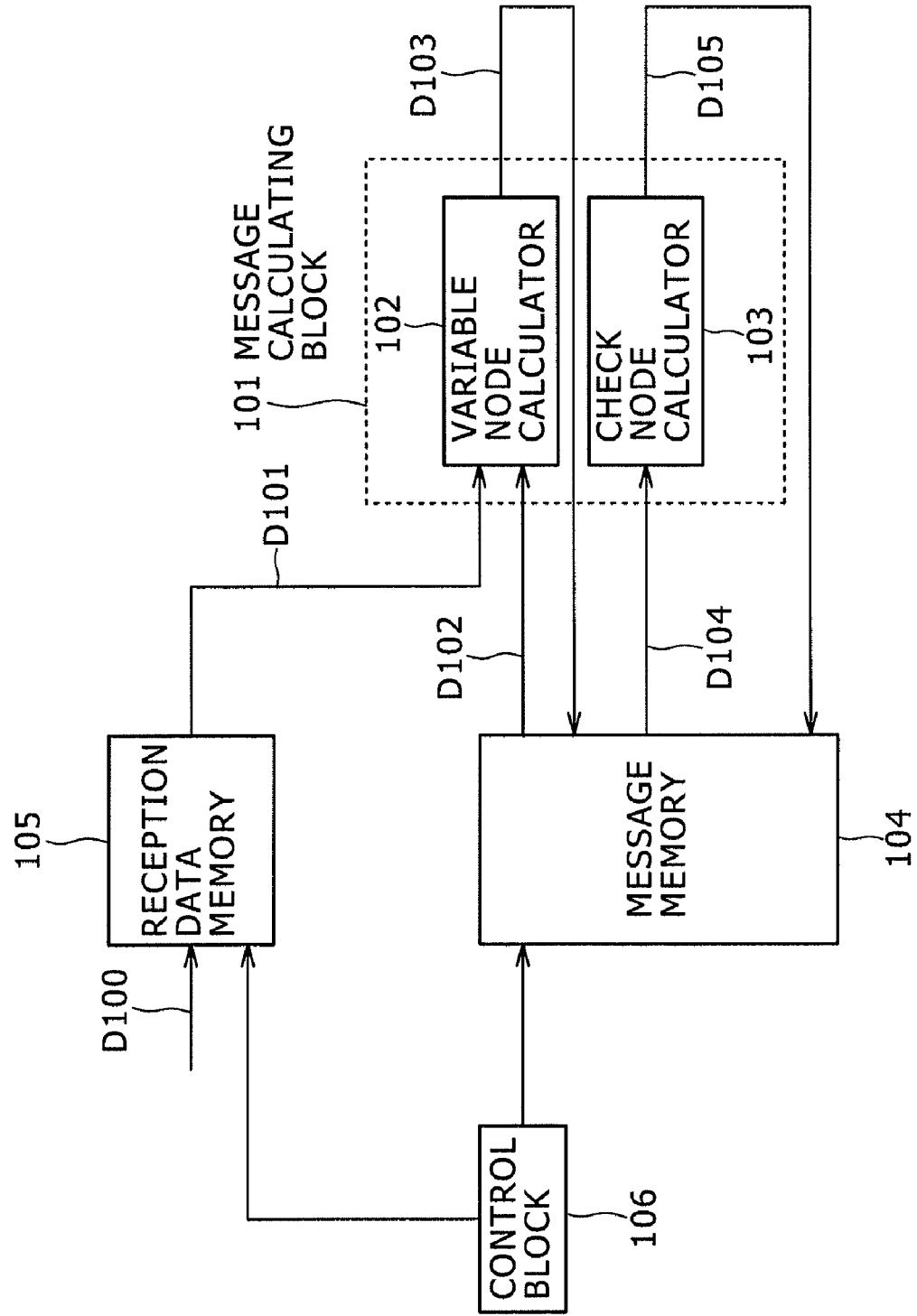
FIG. 9 is a block diagram illustrating an exemplary configuration of a related-art LDPC-code decoding apparatus.
Figure 10:
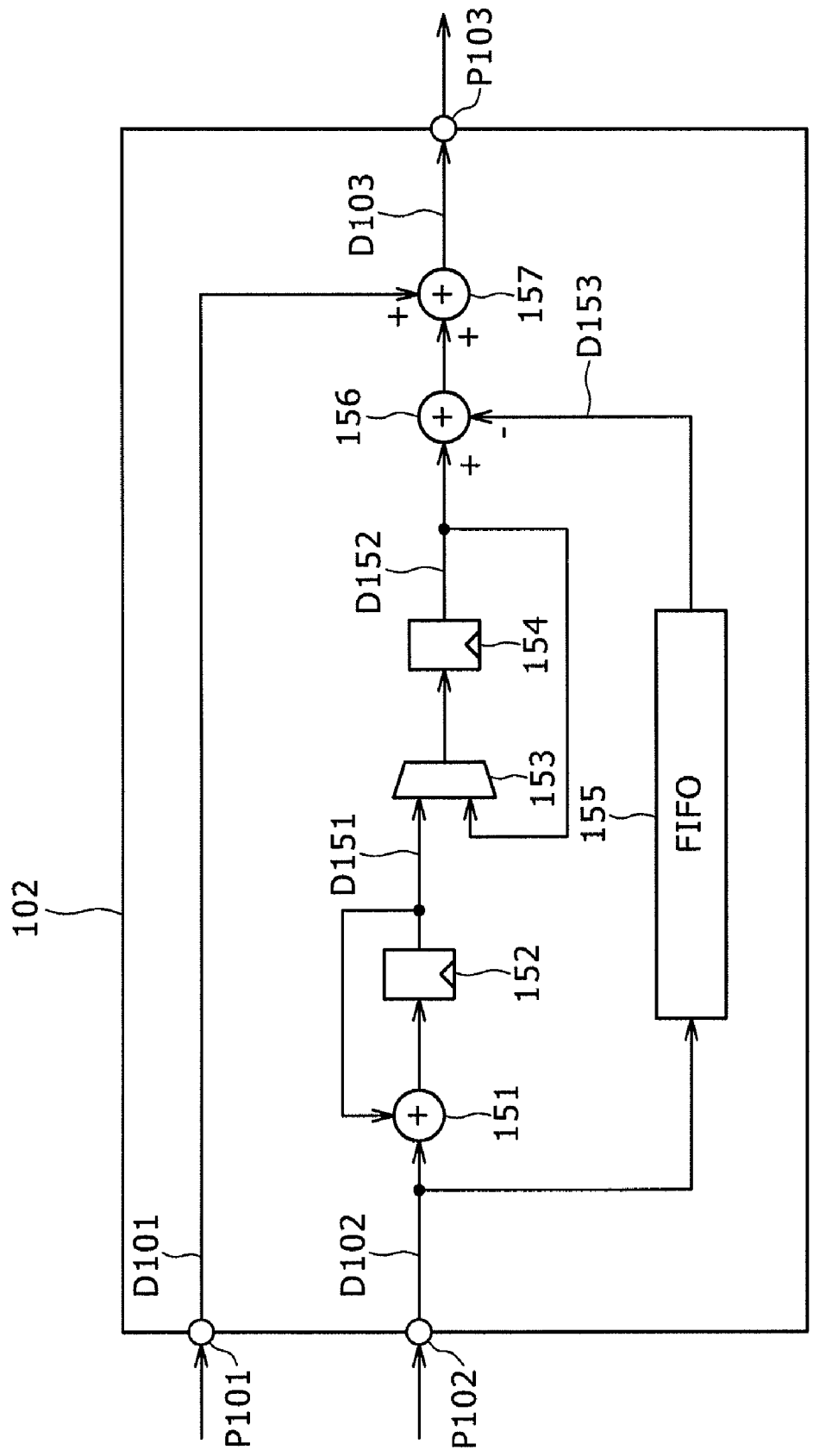
FIG. 10 is a block diagram illustrating an exemplary configuration of a variable node calculator.
Figure 11:
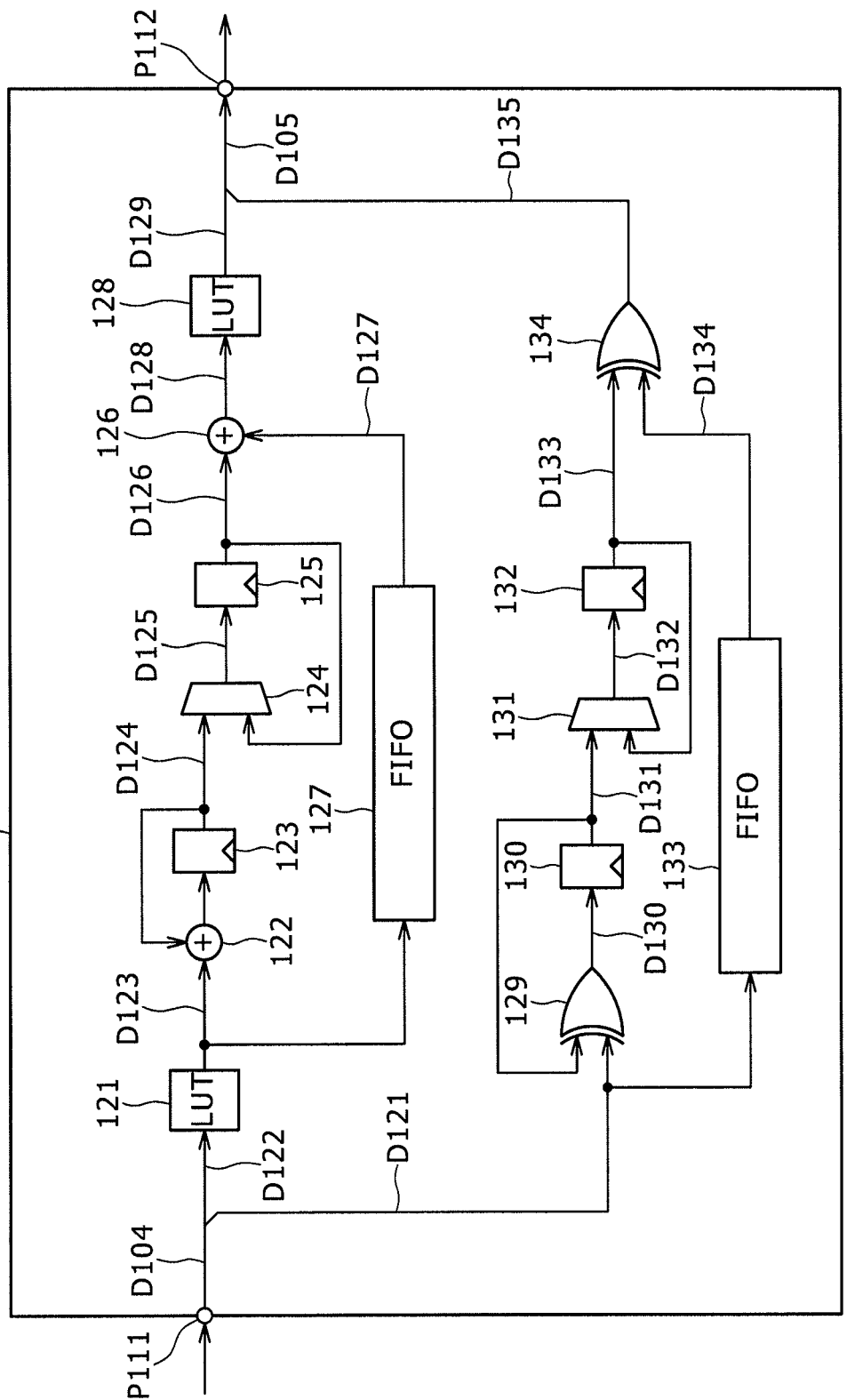
FIG. 11 is a block diagram illustrating an exemplary configuration of a check node calculator.

To be more specific, the data other than null bits, a result of the operation of equation (5) is outputted as a final decoding result as shown in FIG. 8.

On the other hand, for the null bits, probability 1 on which data is 0's is always outputted as a decoding result as shown in FIG. 24. If this is expressed in a logarithmic likelihood ratio of "0," value +∞ is provided and becomes a maximum possible value when installing this on hardware. Thus, if a value with probability 1 in which receive data $u_{0i}$ is 0's is supplied, the LDPC decoding section 1504 determines this data to be null data and may always output probability 1 in which data is 0's as a final decoding result. Namely, the operation for outputting a null bit decoding result becomes unnecessary.

Referring to FIG. 25, there is shown a operation technique for operating null-bit variable nodes.

Figure 1:
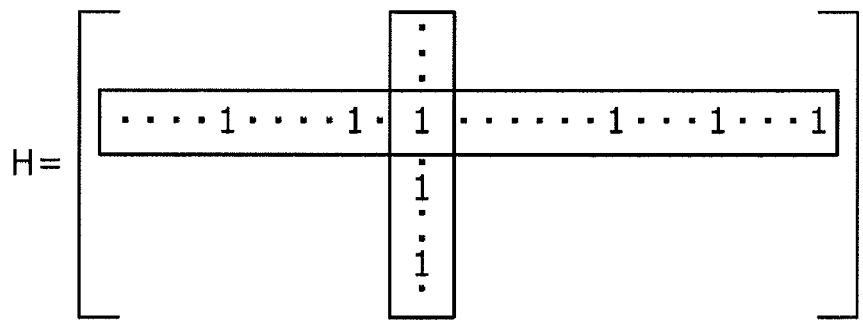
FIG. 1 is a schematic diagram illustrating an example of a LDPC-code parity check matrix.
Figure 2:
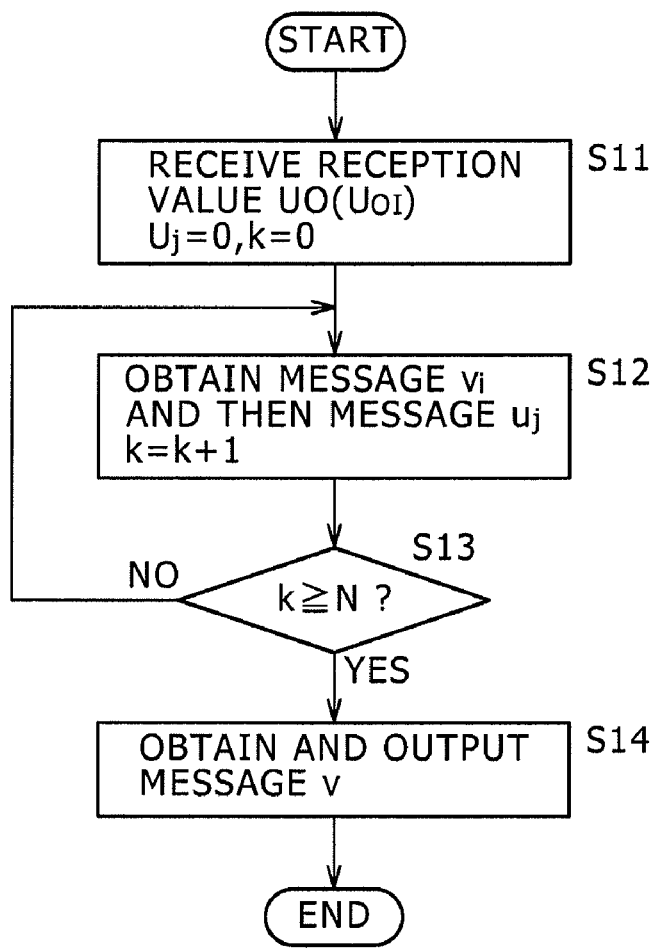
FIG. 2 is a flowchart indicative of a sequence of processes to be executed when decoding LDPC codes.
Figure 5:
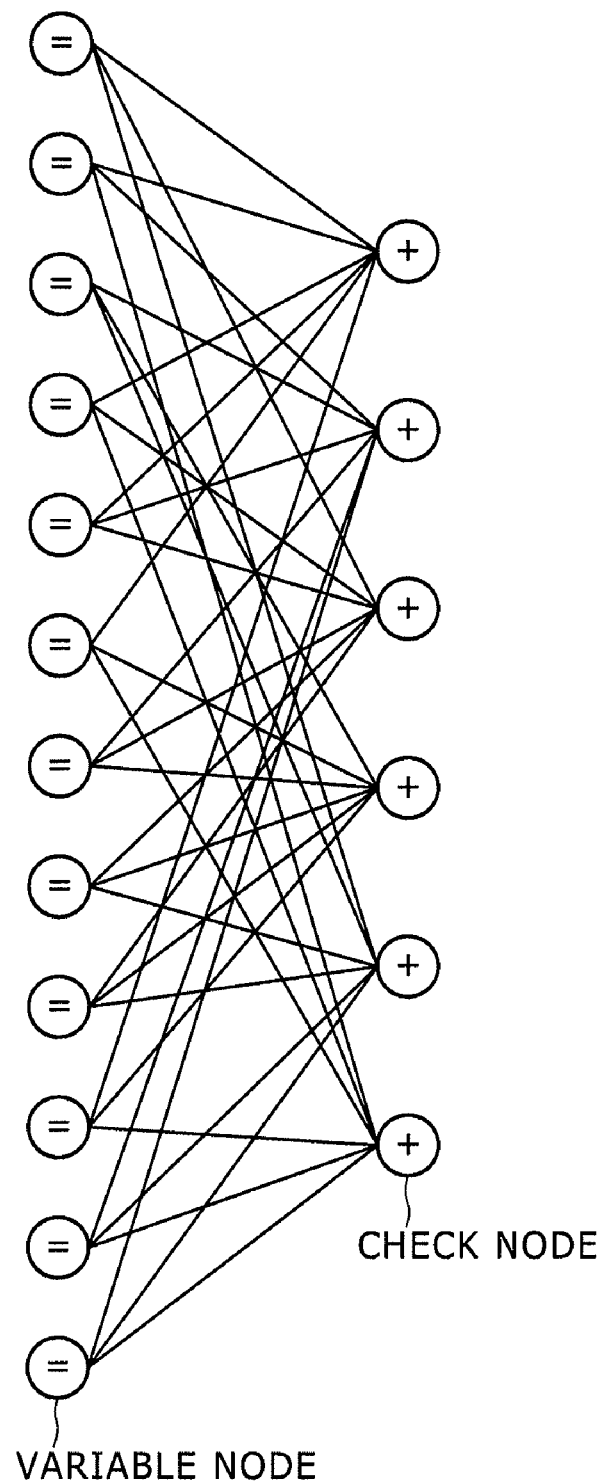
FIG. 5 is a schematic diagram illustrating a Tannar graph of the parity check matrix shown in FIG. 4.
Figure 6:
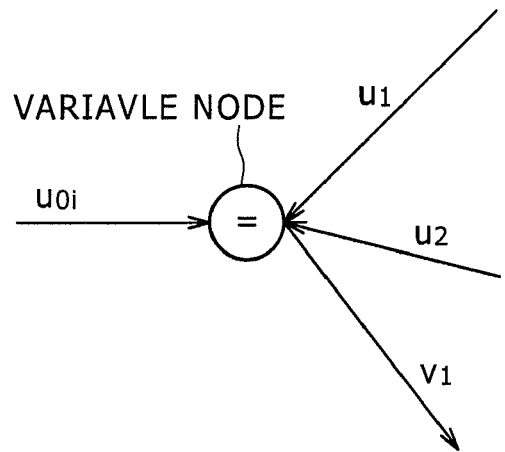
FIG. 6 is a schematic diagram illustrating a message calculation at a variable node.

To be more specific, the data other than null bits, the variable node operation of equation (1) is executed as shown in FIG. 6.

On the other hand, for the null bits, probability 1 in which data is 0's is always outputted as shown in FIG. 25. If this is expressed in a logarithmic likelihood ratio of "0," value +∞ is provided and becomes a maximum possible value when installing this on hardware. Thus, if a value with probability 1 in which receive data $u_{0i}$ is 0's at the time of operating variable nodes, the LDPC decoding section 1504 determines that this value is null data and may always output probability 1 in which data is 0's. Namely, the variable node operation for null bits becomes unnecessary.

Also, because a null-bit received value and messages of the edges linking to null bits take fixed values with probability 1 in which data is always 0's, if a separate LDPC decoding section (the TMCC signal LDPC decoding section 903T shown in FIG. 20 for example) is arranged for TMCC signals, the received-value memory and the message memory for that LDPC decoding section can be deleted.

In the above-mentioned exemplary configurations according to the invention, it is assumed that each TMCC signal is added with null bit for LDPC coding as shown in FIG. 18. However, TMCC signals may not especially be signals based on this assumption.

Namely, TMCC signals may be signals that are an LDPC-coded sequence in which a known signal (null bits in the example shown in FIG. 18) is added to predetermined control information (information equivalent to DATA shown in FIG. 18) for LDPC coding; from this sequence, the known signal is deleted and he resultant TMCC signals are transmitted to the receiving apparatus.

In this case, if the TMCC signal input buffer 1502T takes the configuration shown in FIG. 22, a value meaning probability 1 in which data is 0's if the known signal is 0 or a value meaning the probability 1 in which data is 1's if the known signal 1 may be entered in the selector 1801.

If the TMCC signal input buffer 1502T takes the configuration shown in FIG. 23, a value meaning probability 1 in which data is 0's if the known signal is 0 or a value meaning the probability 1 in which data is 1's if the known signal is 1 may be entered in the selector 1812.

For known signals among the decoded TMCC signals, the LDPC decoding section 1504 may handle messages of the edges linking to the known-signal bits as a value meaning probability 1 in which data is 0 if the known signal is 0 and as a value meaning probability 1 in which data is 1 if the known signal is 1.

Figure 28:
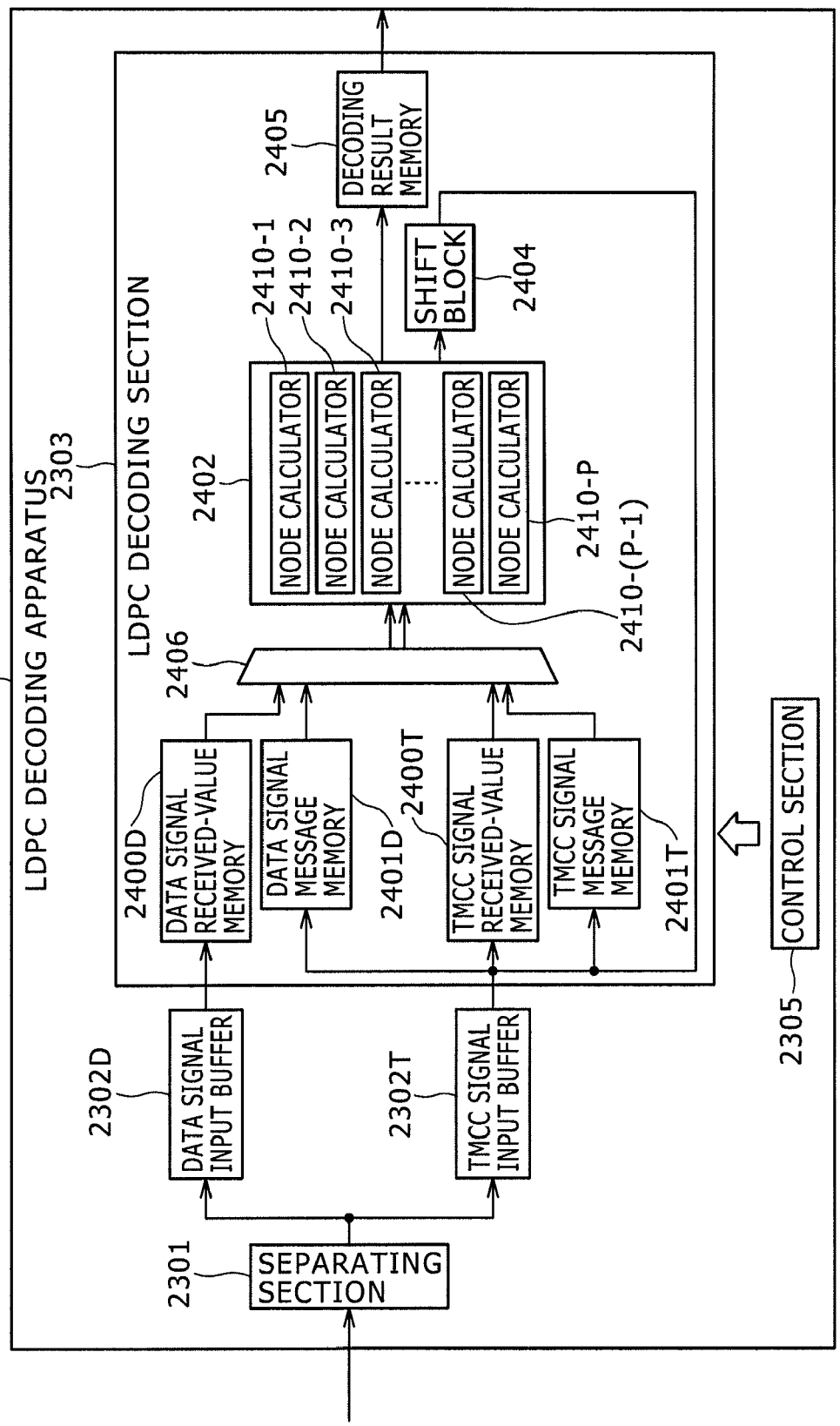
FIG. 28 is a block diagram illustrating a fifth exemplary configuration of the LDPC decoding apparatus shown in FIG. 19.

The following further describes other embodiments of the LDPC decoding apparatus 804 with reference to FIGS. 26 through 28.

Referring to FIG. 26, there is shown an exemplary configuration of an LDPC decoding apparatus 804 practiced as another embodiment of the invention, which is different from the examples shown in FIGS. 20 and 21.

To be more specific, the LDPC decoding apparatus 804 shown in FIG. 26 has a separating section 1901, a data signal input buffer 1902D, a TMCC signal input buffer 1902T, a data signal LDPC decoding section 1903D, a selector 1904, a control section 1905, an LDPC hard decision decoding section 1906, and a decoding result memory 1907.

The data signal LDPC decoding section 1903D shown in FIG. 26 has substantially the same function and configuration as those of the data signal LDPC decoding section 903D shown in FIG. 20. To be more specific, the data signal LDPC decoding section 1903D shown in FIG. 26 has a received-value memory 2000D, a message memory 2001D, a message calculating block 2002D including P node calculators 2020D-1 through 2010-D-P, a shift block 2004D, and a decoding result memory 2005D.

Thus, the configuration for the decoding of data signals shown in FIG. 26 is substantially the same as the configuration shown in FIG. 20. In contrast, the configuration for the decoding of TMCC signals shown in FIG. 26 is different from that shown in FIG. 20 in that the configuration shown in FIG. 26 has an LDPC hard decision decoding section 1906 and a decoding result memory 1907 instead of the TMCC signal LDPC decoding section 903T shown in FIG. 20.

To be more specific, as described above for example, an LDPC-coded TMCC signal has a low coding ratio of 1/2 with a known signal included in information length in the BPSK modulating, so that, as compared with an LDPC-coded data signal, a LDPC-coded TMCC signal has a characteristic that a required CN is small. Having such a characteristic denotes, for an LDPC-coded TMCC signal, it is practicable to decode the signal with a sufficiently low CN if hard-decision decoding is executed. Therefore, the LDPC decoding apparatus 804 shown in FIG. 28 is arranged with the LDPC hard decision decoding section 1906 and the decoding result memory 1907 instead of the TMCC signal LDPC decoding section 903T shown in FIG. 20, for the decoding of TMCC signals.

In summary, when the examples shown in FIG. 20 and FIG. 26 are compared with each other in the configuration of the LDPC decoding apparatus 804, a difference is found in that the TMCC signal LDPC decoding section 903T is used in the example shown in FIG. 20 while the LDPC hard decision decoding section 1906 and the decoding result memory 1907 are used in the example shown in FIG. 26.

Consequently, the operation of the LDPC decoding apparatus 804 is generally the same as the operation of the LDPC decoding apparatus 804 shown in FIG. 20 except for an operation of the LDPC hard decision decoding section 1906. Therefore, the following describes only the operation of the LDPC hard decision decoding section 1906 among the operations of the LDPC decoding apparatus 804 shown in FIG. 26 and omittes the description of the other operations.

When executing the variable node operation shown in FIG. 6, for example, the LDPC hard decision decoding section 1906 can use a majority decision result of the received data and the messages coming from other edges as a variable node message. Namely, operations according to equations (14) through (16) below are executed in the LDPC hard decision decoding section 1906 as variable node operations.

[Equation 14]

$$v_1 = (u_{0i} + u_2 + u_3 > 1)?1:0 \quad (14)$$

[Equation 15]

$$v_2 = (u_{0i} + u_1 + u_2 > 1)?1:0 \quad (15)$$

[Equation 16]

$$v_3 = (u_{0i} + u_2 + u_3 > 1)?1:0 \quad (16)$$

In equations (14) through (16) above, $v_1$ through $v_3$ on the left side are indicative of variable node messages. On the right side, $u_{0i}$ is indicative of received data and $u_1$ through $u_3$ are indicative of messages coming from other edges.

The equations (14) through (16) are equations having so-called ternary operator in programming. Namely, the right side has a form of "<condition>?<1>:<0>" denoting that, if <condition> is true, the value (on the left side) of this equation is <1>; otherwise, the value is <0>.

To be more specific, in equation (14) for example, if condition ($u_{0i}+u_2+u_3>1$) is established, variable node message $v_1$ is operated to be 1; if condition ($u_{0i}+u_2+u_3>1$) is not established, variable node message $v_1$ is operated to be 0.

Figure 7:
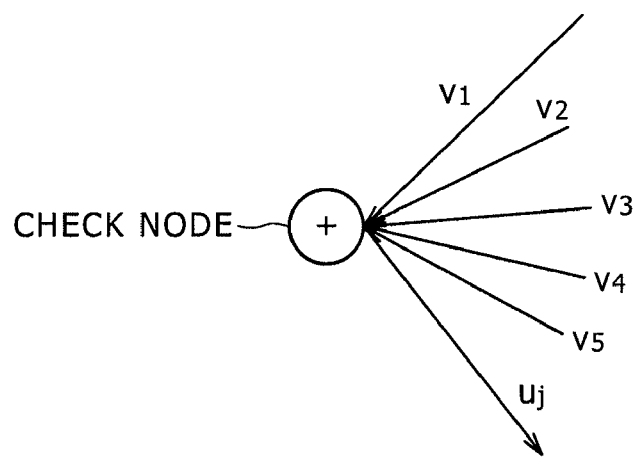
FIG. 7 is a schematic diagram illustrating a message calculation at a check node.

When executing the variable node operation shown in FIG. 7, for example, the LDPC hard decision decoding section 1906 can use an operation result of exclusive OR operation executed on the messages coming from other edges as check node message $u_i$. Namely, operations according to equations (17) through (22) below are executed in the LDPC hard decision decoding section 1906 as check node operations.

[Equation 17]

$$u1 = EXOR(v2,v3,v4,v5,v6) \quad (17)$$

[Equation 18]

$$u2 = EXOR(v1,v3,v4,v5,v6) \quad (18)$$

[Equation 19]

$$u3 = EXOR(v1,v2,v4,v5,v6) \quad (19)$$

[Equation 20]

$$u4 = EXOR(v1,v2,v3,v5,v6) \quad (20)$$

[Equation 21]

$$u5 = EXOR(v1,v2,v3,v4,v6) \quad (21)$$

[Equation 22]

$$u6 = EXOR(v1,v2,v3,v4,v5) \quad (22)$$

In the equations (17) through (22) above, $u_1$ through $u_6$ on the left side are indicative of check node messages. On the right side, $v_1$ through $v_6$ are indicative of the messages coming from other edges.

Because variable node or check node operations can be executed by these simple operations defined by equations (14) through (22), the circuit scales of the LDPC hard decision decoding section 1906 and the decoding result memory 1907 shown in FIG. 26 can be made smaller than that of the TMCC signal LDPC decoding section 903T shown in FIG. 20. Namely, if the configuration shown in FIG. 26 is employed as the LDPC decoding apparatus 804, the scale of the circuit for decoding TMCC signals can be made smaller than that of the configuration shown in FIG. 20, so that the entire circuit scale can be reduced by that amount.

Referring to FIG. 27, there is shown an exemplary configuration of an LDPC decoding apparatus 804 practiced as still another embodiment of the invention, which is different from the examples shown in FIGS. 20, 21, and 26.

To be more specific, the LDPC decoding apparatus 804 shown in FIG. 27 has a separating section 2101, a data signal input buffer 2102D, a TMCC signal input buffer 2102T, a data signal LDPC decoding section 2103D, a TMCC signal LDPC decoding section 2103T, a selector 2104, and a control section 2105.

The data signal LDPC decoding section 2103D shown in FIG. 27 has substantially the same function and configuration as those of the data signal LDPC decoding section 903D shown in FIG. 20. To be more specific, the data signal LDPC decoding section 2103D shown in FIG. 27 has a data signal received-value memory 2200D, a data signal message memory 2201D, a message calculating block 2202D including P node calculators 2220D-1 through 2210D-P, a shift block 2204D, and a decoding result memory 2205D.

Thus, the configuration for the decoding of data signals shown in FIG. 27 is substantially the same as the configuration shown in FIG. 20. In contrast, in the configuration for the decoding of TMCC signals shown in FIG. 27, the TMCC signal LDPC decoding section 2103T is used instead of the TMCC signal LDPC decoding section 903T shown in FIG. 20.

To be more specific, the TMCC signal LDPC decoding section 2103T shown in FIG. 27 has a TMCC signal received-value memory 2200T, a TMCC signal message memory 2201T, a message calculating block 2202T including only one node calculator 2210T, and a decoding result memory 2205T.

In other words, in the example shown in FIG. 20, also in the case of LDPC-coded TMCC signals, the TMCC signal LDPC decoding section 903T containing P node calculators 1210T-1 through 1210T-P is used so as to execute partly parallel decoding, namely, to execute, in parallel, node operations on each configuration matrix having P×P structure making up a parity check matrix indicative of LDPC codes.

In contrast, in the example shown in FIG. 27, in the case of LDPC-coded TMCC signals, the TMCC signal LDPC decoding section 2103T containing one node calculator 2210T is used so as to execute full serial decoding, namely, to sequentially decode the operations of nodes simply one by one.

Thus, in the example shown in FIG. 27, full serial decoding is executed on LDPC-coded TMCC signals, of which reasons are as follows.

Namely, in the present embodiment, a transmission signal having the format shown in FIG. 17 is supplied to the LDPC decoding apparatus 804. In this case, as described above, TMCC signals for only one code come during the coming of data signals for up to 120 codes. This denotes that, in concurrently decoding LDPC-coded data signal and TMCC signal, a maximum of 120 decoding times as many as the decoding of data signal can be provided. Therefore, as shown in FIG. 27, if only one node calculator 2210T is arranged for TMCC signals and P=374, namely, even if the constituent matrix of parity check matrix has a structure of 374×374, the sufficient decoding count can be provided, such as 120/374 times data signal decoding count.

Also, as described above, when LDPC-coded TMCC signals are transmitted, the coding ratio is a low level of 1/2 with a known signal included in information length in BPSK modulating, for example, the required CN of the LDPC-coded TMCC signal is smaller than that of the LDPC-coded data signal. This characteristic of LDPC-coded TMCC signal allows the decoding with a sufficiently low CN if the decoding count is 120/374 times that of the data signal.

It should be noted that the operation of the LDPC decoding apparatus 804 shown in FIG. 27 is generally the same as that of the LDPC decoding apparatus 804 shown in FIG. 20 described above except that full serial decoding is executed on LDPC-coded TMCC signals rather than partly parallel decoding as described above. Consequently, the description of the operation of the LDPC decoding apparatus 804 shown in FIG. 27 will be omitted.

Referring to FIG. 28, there is shown an exemplary configuration of a LDPC decoding apparatus 804 practiced yet another embodiment of the invention, which is different from the examples shown in FIGS. 20, 21, 26, and 27.

To be more specific, the LDPC decoding apparatus 804 shown in FIG. 28 has a separating section 2301, a data signal input buffer 2302D, a TMCC signal input buffer 2302T, an LDPC decoding section 2303, and a control section 2305.

The LDPC decoding section 2303 shown in FIG. 28 has a data signal received-value memory 2400D, a TMCC signal received-value memory 2400T, a data signal message memory 2401D, a TMCC signal message memory 2401T, a message calculating block 2402 including P node calculators 2410-1 through 2410-P, a shift block 2404D, a decoding result memory 2405, and a selector 2406.

The LDPC decoding apparatus 804 shown in FIG. 28 operates as follows.

A transmission signal (after demodulation) having the format shown in FIG. 17 is supplied to the separating section 2301 of the LDPC decoding apparatus 804. The separating section 2301 separates the supplied transmission signal into an LDPC-coded data signal (Data) and an LDPC-coded TMCC signal (TMCC) and supplies the obtained LDPC-coded data signal to the data signal input buffer 2302D as a received value and the obtained LDPC-coded TMCC signal to the TMCC signal input buffer 2302T as a received value.

Namely, while LDPC-coded data signals are held in the data signal input buffer 2302D as a received value, LDPC-coded TMCC signals are held in the TMCC signal input buffer 2302T as a received value.

The control section 2305 manages a data signal decoding timing and a TMCC signal decoding timing on the basis of preset scheduling. Specific examples of this scheduling will be described later with reference to FIGS. 29 through 32.

To be more specific, with the data signal decoding timing, the input of the selector 2406 is switched to the side of the data signal received-value memory 2400D and the side of the data signal message memory 2401D under the control of the control section 2305. At the same time, the received value (a LDPC-coded data signal) held in the data signal input buffer 2302D is transferred to the data signal received-value memory 2400D. Then, the message outputted from the shift block 2404 is stored in the data signal message memory 2401D. The circuit configuration of the LDPC decoding section 2303 in this case is substantially the same as that of the data signal LDPC decoding section 903D shown in FIG. 20. Consequently, the LDPC-coded data signal can be decoded in the LDPC decoding section 2303.

On the other hand, with the TMCC signal decoding timing, the input of the selector 2406 is switched to the side of the TMCC signal received-value memory 2400T and the side of TMCC signal message memory 2401T under the control of the control section 2305. At the same time, the received value (an LDPC-coded TMCC signal) held in the TMCC signal input buffer 2302T is transferred to the TMCC signal received-value memory 2400T. Then, the message outputted from the shift block 2404 is stored in the TMCC signal message memory 2401T. The circuit configuration of the LDPC decoding section 2303 in this case is substantially the same as that of the TMCC signal LDPC decoding section 903T shown in FIG. 20. Consequently, the LDPC-coded TMCC signal can be decoded in the LDPC decoding section 2303.

The above has described the five embodiments of the LDPC decoding apparatus 804 as shown in FIGS. 20, 21, 26, 27, and 28, respectively.

These embodiments can be largely divided into the embodiments in which the decoding of data signal and the decoding of TMCC signal are selectively switched for serial processing (hereafter referred to as serial forms) and the embodiments in which the decoding of data signal and the decoding of TMCC signal are processed in parallel (hereafter referred to as parallel forms). To be specific, the LDPC decoding apparatuses 804 shown in FIGS. 21 and 28 are examples of the serial form, while the LDPC decoding apparatuses 804 shown in FIGS. 20, 26, and 27 are examples of the parallel form.

The following describes examples of the scheduling of TMCC signal decoding timings as classified in the serial form and the parallel form.

The following scheduling examples presupposes that a receive value (after demodulation) be received by the LDPC decoding apparatus 804 in unit of a transmission signal having the format shown in FIG. 17, namely, in unit of 120 slots per frame.

In timing charts indicative of the following scheduling examples, namely, the timing charts shown in FIGS. 29 through 32, the timing chart to the right side of "RECEIVE" is indicative of a timing of the arrival of a transmission signal (after demodulation) having the format shown in FIG. 17 at the LDPC decoding apparatus 804. On the other hand, the timing chart to the right side of "DECODE" is indicative of the decoding by the LDPC decoding apparatus 804.

Figure 29:
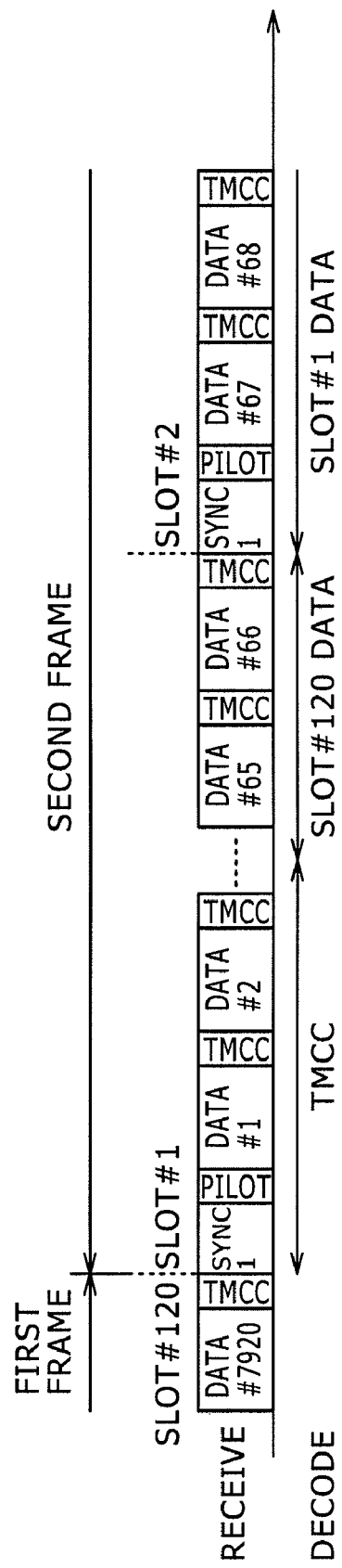
FIG. 29 is a block diagram illustrating a first scheduling example of the decoding of a TMCC signal of the LDPC decoding apparatus shown in FIG. 19.

Referring to FIG. 29, there is shown a timing chart indicative of one example of the scheduling of the decoding of serial-form TMCC signals.

In the example shown in FIG. 29, after having received all of 120 slots per frame, the LDPC decoding apparatus 804 first starts decoding the LDPC-coded TMCC signal (hereafter referred to as a first-frame TMCC signal) time-division multiplexed with the received frame (hereafter referred to as a first frame). Having completed the decoding of the first-frame TMCC signal, the LDPC decoding apparatus 804 returns (or is switched to) the normal decoding of a data signal to decode a LDPC-coded data signal (hereafter referred to as a data signal of slot #120; for other slots, the similar nomenclature is used) included in slot #120 of the first frame. Next, the LDPC decoding apparatus 804 sequentially decodes the data signals of data slots #1 through #119 of a frame (hereafter referred to as a second frame) that is received after the first frame.

For the decoding of TMCC signals, the following two techniques are available, for example.

To be more specific, in a first technique, a decoding repetition count is specified and, if the decoding of the specified repetition count fails, the decoding is forcibly terminated.

In a second technique, the decoding of LDPC-coded TMCC signals is repeated until the decoding is successful. The second technique is used by reason of the following. Namely, because the required CN of an LDPC-coded TMCC signal is fairly smaller than the required CN of an LDPC-coded data signal, if the decoding of a TMCC signal fails, it is highly possible for the decoding of other data signals to fail. Also, if the decoding of a TMCC signal fails, the control signal of a subsequently arriving frame cannot be known. For these reasons, the second technique is used in which the decoding of LDPC-coded TMCC signals is preferentially continued until this decoding is successful.

To be more specific, in the case of the LDPC decoding apparatus 804 shown in FIG. 21 for example, when the TMCC signals of the first frame have all been received, the input of the selector 1503 is switched to the side of the TMCC signal input buffer 1502T under the control of the control section 1506 and the TMCC signals of the first frame held in the TMCC signal input buffer 1502T are transferred to the received-value memory 1700 of the LDPC decoding section 1504, upon which the decoding of the TMCC signals of the first frame starts.

If the first technique is used for the decoding of TMCC signals, a result of the decoding is outputted when the predetermined decoding repetition count has been reached. If the second technique is used, a result of the decoding when the decoding is found successful is outputted.

Then, under the control of the control section 1506, the input of the selector 1503 is switched to the side of the data signal input buffer 1502D, upon which the data signals (received values) of slot #120 of the first frame are transferred from the data signal input buffer 1502D to the received-value memory 1700 of the LDPC decoding section 1504 to start the decoding of the data signals of slot #120. Next, the LDPC decoding section 1504 continues the decoding of the data signals of slot #120 until the decoding is successful or until slot #1 of the second frame has been received.

Decoding the TMCC signals by the LDPC decoding apparatus 804 in accordance with the scheduling of the example shown in FIG. 29 prevents the circuit scale from getting larger and the performance from being deteriorated while reducing the number of times slot #120 of the first frame is decoded.

Figure 30:
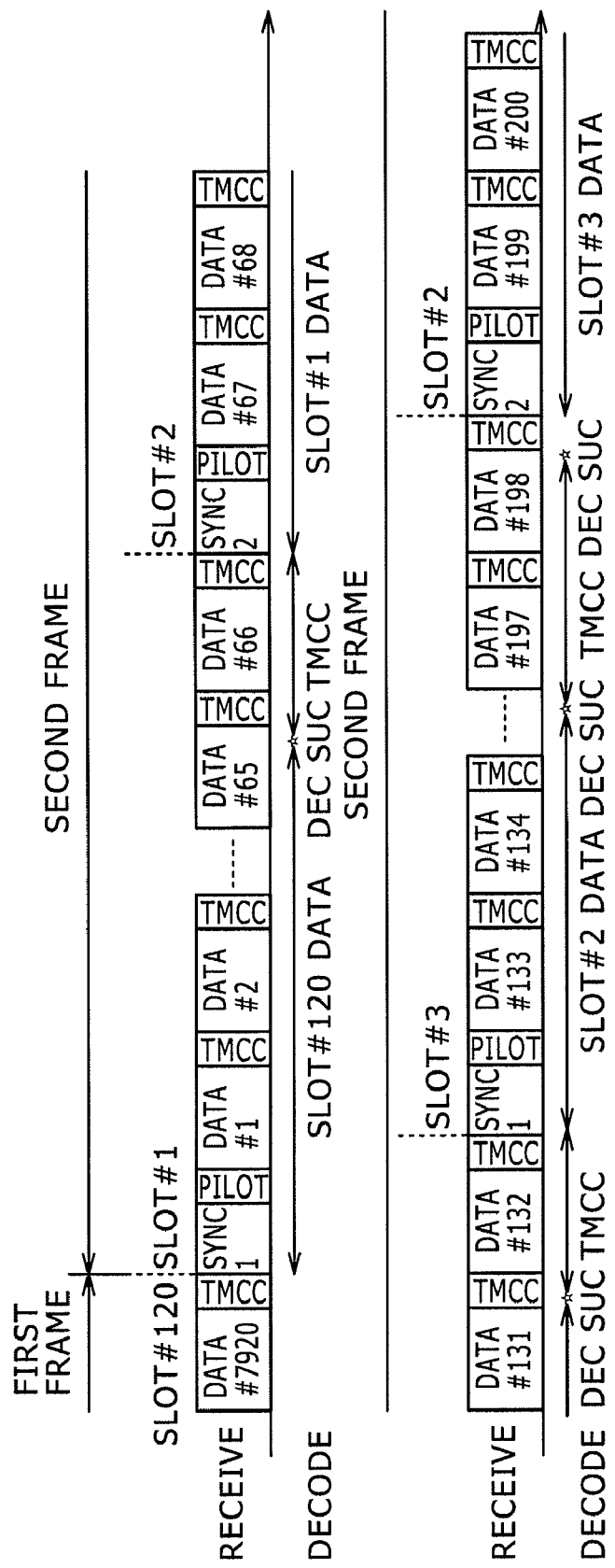
FIG. 30 is a block diagram illustrating a second scheduling example of the decoding of a TMCC signal of the LDPC decoding apparatus shown in FIG. 19.

Referring to FIG. 30, there is shown a timing chart indicative of another example of the scheduling of the decoding of serial-form TMCC signals, which is different from the example shown in FIG. 29.

In the example shown in FIG. 30, when all of 120 slots of the first frame have been received, the LDPC decoding apparatus 804 first starts decoding the data signals of slot #120 of the first frame. If there is a time margin between the timing (indicated by "dec suc" in FIG. 30) at which the decoding of the data signals of slot #120 is successful and the timing at which slot #1 of the second frame has been received and the decoding of the received data signals is started, the LDPC decoding apparatus 804 executes the LDPC-decoding of the TMCC signals of the first frame in that time margin. If the decoding is not successful during that time, the LDPC decoding apparatus 804 holds an intermediate result and, if there is a time margin between the end of the reception of the slots of the next frame after the completion of the decoding of any one of the data signals of next slots #2 through #119 and the start of the decoding of the received data signals, the LDPC decoding apparatus 804 restarts the LDPC-decoding of the TMCC signals of the first frame during that time margin.

Decoding of TMCC signals by the LDPC decoding apparatus 804 in accordance with the scheduling of the example shown in FIG. 30 prevents the data signal decoding performance from being deteriorated more than that of usual decoding.

It should be noted that, if the scheduling of the example shown in FIG. 30 is used, it is necessary to hold the received value and message of the TMCC signal halfway in decoding also during the decoding of data signals. Therefore, the LDPC decoding apparatus 804 needs to take a configuration that has a received-value memory and a message memory for TMCC signals, as described above. To be more specific, if the scheduling of the example shown in FIG. 30 is used, the above-mentioned embodiment needs to use the LDPC decoding apparatus 804 having the TMCC signal received-value memory 2400T and the TMCC signal message memory 2401T.

Figure 31:
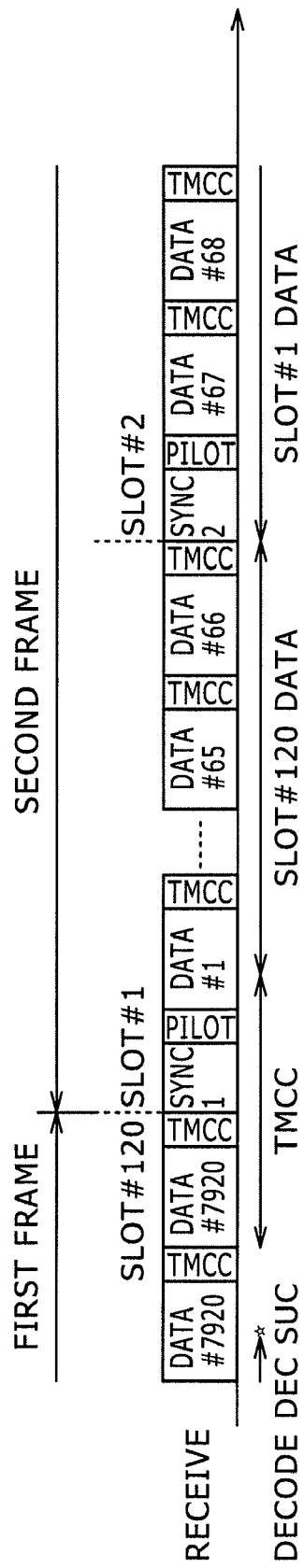
FIG. 31 is a block diagram illustrating a third scheduling example of the decoding of a TMCC signal of the LDPC decoding apparatus shown in FIG. 19.

Referring to FIG. 31, there is shown a timing chart indicative of another example of the scheduling of the decoding of serial-form TMCC signals, which is different from the examples shown in FIGS. 29 and 30.

As described above, LDPC-coded TMCC signals are time-division multiplexed and divided into two or more unit data to be intermittently inserted in 120 slots per frame. To be more specific, as shown in FIG. 17, the unit data of TMCC signals (the data indicated by TMCC in FIG. 31) is transmitted in an intermittent manner. Therefore, as shown in FIG. 31 for example, the LDPC decoding apparatus 804 starts the decoding of the TMCC signals of the first frame before the last TMCC signal unit data of the first frame comes. Consequently, the decoding of the TMCC signals of the first frame can be started earlier by a total of 140 symbols of 4 symbols for the TMCC signal unit data plus 136 symbols for the data signal unit data (the data indicated by Data#7920 in FIG. 31) that are transmitted before the TMCC signal unit data.

It should be noted that, in the example shown in FIG. 31, the timing for starting the decoding of the TMCC signals of the first frame is the last TMCC signal unit data in the frame (to be more precise, the preceding data signal unit data); it is also practicable to bring this timing earlier.

Anyhow, when the decoding of the TMCC signals of the first frame starts, last several symbols of the first frame have not yet been received. Therefore, for the bits not yet received, a technique may be employed in which the decoding is started by setting an appropriate reception value, a value in which the probability of "0" is 0.5, for example. In this case, because no true reception value is used, the TMCC signal decoding performance is deteriorated, which, however, will not present any practicable problem.

Decoding of TMCC signals by the LDPC decoding apparatus 804 in accordance with the scheduling of the example shown in FIG. 31 allows the TMCC signal decoding start time to be set earlier.

It should be noted that the scheduling shown in FIG. 31 is one example of the scheduling of the decoding timing of TMCC signals in the serial form. However, the technical concept that the decoding of TMCC signals before the completion of TMCC signal reception is also applicable as the scheduling of the decoding timing of TMCC signals in the parallel form as well.

As described above, FIGS. 29 through 31 show the timing charts indicative of the exemplary scheduling of the decoding timings of TMCC signals in the serial form.

Figure 32:
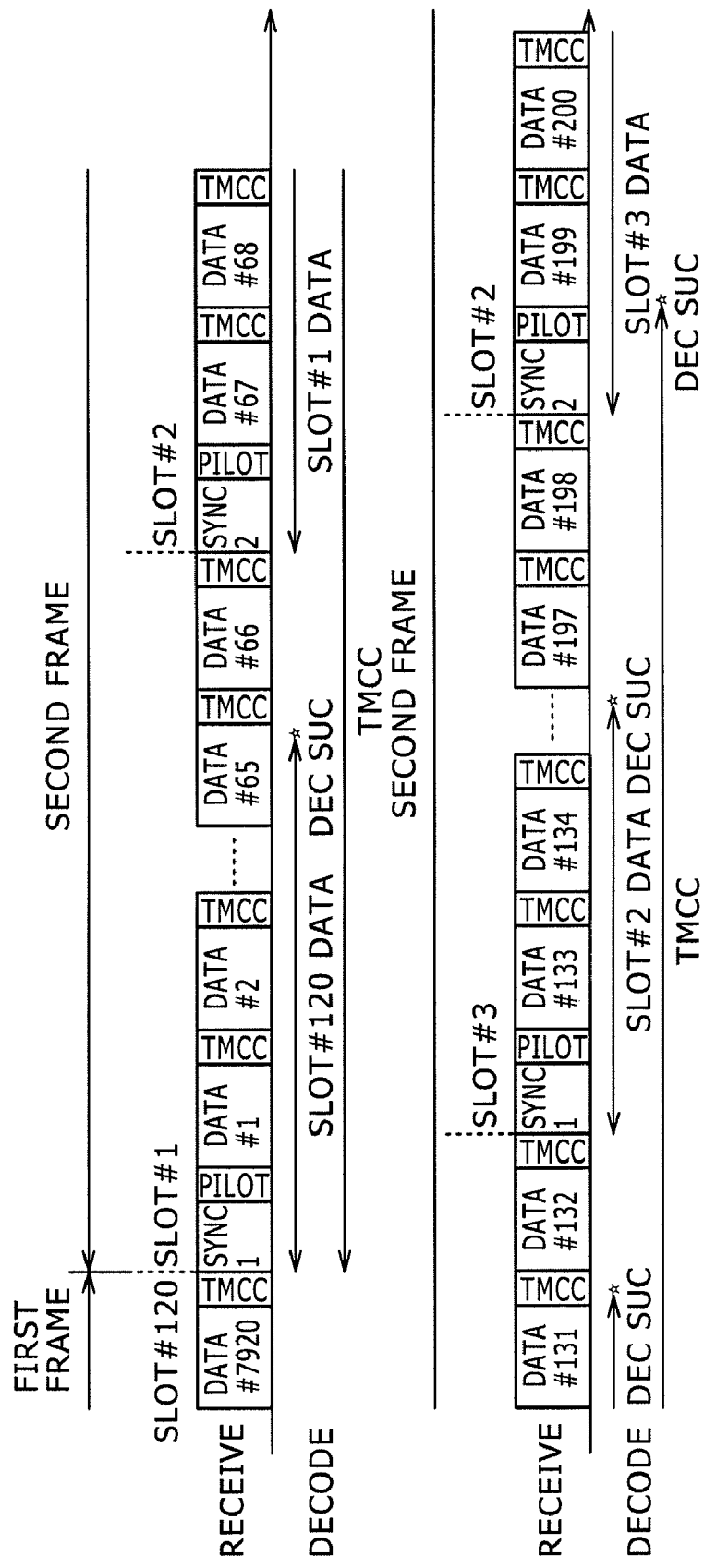
FIG. 32 is a block diagram illustrating a fourth scheduling example of the decoding of a TMCC signal of the LDPC decoding apparatus shown in FIG. 19.

Referring to FIG. 32, there is shown a timing chart indicative of one example of the scheduling of decoding timings of TMCC signals in the parallel form.

To be more specific, by following the scheduling of the example shown in FIG. 32, the LDPC decoding apparatus 804 can decode both LDPC-coded data signals and LDPC-coded TMCC signals in parallel.

In the example shown in FIG. 32, there is a condition that, in the decoding of the data signals of the first frame, the decoding of last slot #120 should have been completed before the end of the reception of slot #1 of the second frame. However, for the decoding of the TMCC signals of the first frame, the decoding can be continued until the reception of the second frame ends. This is one of the reasons why the configuration of full serial decoding can be employed as a TMCC signal LDPC decoding section as with the example shown in FIG. 27.

As described above, use of the LDPC decoding apparatuses 804 of the configurations described so far allows the realization of a system in which not only data signals but also TMCC signals are LDPC coded and time-division multiplexed. Namely, use of the exemplary configuration shown in FIG. 20 as the LDPC decoding apparatus 804 allows the realization of a decoding system capable of decoding both LDPC-coded data signals and LDPC-coded TMCC signals. Further, use of any one of the exemplary configurations shown in FIGS. 21, 26, 27, and 28 as the LDPC decoding apparatus 804 allows the realization of a decoding system capable of decoding both LDPC-coded data signals and LDPC-coded TMCC signals while minimizing the increase in circuit scale as compared with the use of the exemplary configuration shown in FIG. 20.

Obviously, the LDPC decoding apparatus 804 can be embodied in other ways than the above-described examples.

For example, a TMCC signal is a signal that transmits a transmission parameter indicative of the type of modulation. To be more specific, if modulating is expressed in 4 bits, 16 types of modulating can be expressed. So, if the present invention is applied to a system in which only 10 types of modulating are used, TMCC signals may contain values that are not used. In such a case, a LDPC decoding apparatus 804 that has a function of executing the following processing, for example. To be more specific, if such a LDPC decoding apparatus 804 outputs a value of no use as a result of the decoding TMCC signals, the LDPC decoding apparatus 804 executes processing, such as executing the decoding again, outputting received-values as they are, or replacing the value of no use by some value in use by regarding the decoding as failed even if syndrome check has been successful. This processing can at least prevent any values not to be used from being outputted.

Although not described, the above-mentioned techniques to which the present invention is applied are also applicable in the same manner if other types of modulating or other coding ratios are used. To be more specific, preferred embodiments of the present invention have been described using specific terms, such description is for illustrative purpose only, and it is to be understood that changes and variations may be made without departing from the spirit or scope of the following claims.

Further, the present invention is applicable to any systems in which a first signal LDPC-coded by use of a predetermined parity check matrix for defining LDPC codes and a second signal LDPC-coded by use of a parity check matrix substantially the same as or different from the first signal are multiplexed with each other for transmission. To be more specific, in this case, each of the receiving apparatuses practiced as embodiments of the present invention may only have capabilities of separating the first signal and the second signal from each other and decoding the separated first and second signals; therefore, the configurations of the receiving apparatuses according to the present invention are not restricted to particular ones.

It should be noted that the above-mentioned sequence of processing operations including the list display processing may be executed by software as well as hardware.

If the above-mentioned sequence of processing operations is executed by software, each of the decoding apparatuses to which the present invention is applied can be configured by a computer shown in FIG. 33.

Referring to FIG. 33, a CPU (Central Processing Unit) 3001 executes various processing operations as instructed by programs recorded to a ROM (Read Only Memory) or loaded from a storage section 3008 into a RAM (Random Access Memory) 3003. The RAM 3003 also stores data necessary for the CPU 3001 to execute various processing operations.

The CPU 3001, the ROM 3002, and the RAM 3003 are interconnected with a bus 3004. This bus 3004 is also connected to an input/output interface 3005.

The input/output interface 3005 is connected to an input section 3006 made up of a keyboard and a mouse, for example, an output section 3007 made up of a display monitor for example, a storage section 3008 made up of a hard disk for example, and a communication section 3009 made up of a modem and a terminal adaptor, for example. The communication section 3009 is configured to make communication with other devices, not shown, via a network including the Internet, for example.

The input/output interface 3005 is also connected to a drive 3010, on which a removable media 3011 such as a magnetic disk, an optical disk, a magneto-optical disk, or a semiconductor memory, for example, is loaded. From the loaded removable media, computer programs are read to be installed in the storage section 3008 as required.

When the above-mentioned sequence of processing operations is executed by software, the programs constituting the software are installed in a computer which is built in dedicated hardware equipment or installed, from a network or recording media, into a general-purpose personal computer for example in which various programs may be installed for the execution of various functions.

As shown in FIG. 33, these recording media are constituted by not only the removable media (or a package media) 3011 made up of the magnetic disk (including flexible disks), the optical disk (including CD-ROM (Compact Disk Read Only Memory) and DVD (Digital Versatile Disk), the magneto-optical disk (including MD (Mini Disk) (trademark)), or the semiconductor memory which is distributed separately from the apparatus itself, but also the ROM 3002 or the storage section 3008 which stores programs and is provided to users as incorporated in the apparatus itself.

It should be noted herein that the steps for describing each program recorded in recording media include not only the processing operations which are sequentially executed in a time-dependent manner but also the processing operations which are executed concurrently or discretely.

It should also be noted that term "system" as used herein denotes a logical set of a plurality of component units and these component units are not necessary accommodated in a same housing.

What is claimed is:

1. A receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal, comprising:

an LDPC decoder configured to decode both of said data signal and said transmission control signal;

a data signal input buffer arranged before said LDPC decoder and configured to hold said received data signal and a transmission control signal input buffer arranged before said LDPC decoder and configured to hold said received transmission control signal; and a controller configured to select one of said data signal held in said data signal input buffer and said transmission control signal held in said transmission control signal input buffer as a signal subject to decoding and transmit the selected signal to said LDPC decoder to make said LDPC decoder decode said signal subject to decoding, wherein said LDPC decoder determines that the decoding has failed if a sequence obtained by decoding said transmission control signal is a value that is not used in a system where said transmission control signal is transmitted.

2. The receiving apparatus according to claim 1, wherein a received value of said transmission control signal is reduced in the number of quantized bits as compared with said data signal and a resultant value is held in said transmission control signal input buffer.

3. The receiving apparatus according to claim 1, wherein said transmission control signal is an LDPC-coded sequence in which a known signal is added to predetermined control information and is transmitted to said receiving apparatus as a signal with said known signal deleted and said transmission control signal is added with a value denoting that, relative to said signal received by said receiving apparatus, if said known signal is 0, a probability of being 0 is 1 and, if said known signal is 1, a probability of 1 is 1, the resultant transmission control signal being held in said transmission control signal input buffer.

4. The receiving apparatus according to claim 1, wherein said transmission control signal is an LDPC-coded sequence in which a known signal is added to predetermined control information and is transmitted to said receiving apparatus as a signal with said known signal deleted, said transmitted signal is received by said receiving apparatus to be held in said transmission control signal input buffer, and, if said transmission control signal is selected as said signal subject to decoding, a signal obtained by adding a value denoting that, if said known signal 0, a probability being 0 is 1 and, if said known signal is 1, a probability being 1 is 1 to said signal held in said transmission control signal input buffer is transmitted to said LDPC decoder as said transmission control signal.

5. The receiving apparatus according to claim 1, wherein said transmission control signal is of a series LDPC-coded with a known signal added to predetermined control information and said LDPC decoder handles said known signal of the decoding of said transmission control signal as a value denoting that, if a known signal is 0, a probability being 0 is 1 and, if a known signal is 1, a probability being 1 is 1 with a message of an edge linking to a bit of said known signal.

6. The receiving apparatus according to claim 5, wherein said transmission control signal has a form in which all of said known signals are made up of 0's and said LDPC decoder omits an operation of one of a variable node and a check node of an edge linking to a bit of said known signal with said known signal of the decoding of said transmission control signal.

7. The receiving apparatus according to claim 1, wherein said controller executes control such that said LDPC decoder decodes said transmission control signal during a period of time in which the decoding of said transmission control signal is executed after the completion of the decoding of a first data signal of said data signal and before the decoding of a second data signal.

8. The receiving apparatus according to claim 7, wherein said data signal and said transmission control signal are multiplexed with each other in a predetermined unit for transmission and said controller executes control such that said LDPC decoder decodes said transmission control signal before said second data signal when said receiving apparatus has received said predetermined unit multiplexed with at least said first data signal, said second data signal, and said transmission control signal.

9. The receiving apparatus according to claim 7, wherein said controller executes control such that, if the decoding of a first data signal of said data signal is successful, said LDPC decoder decodes said transmission control signal during a period after the completion of the decoding of said first data signal and before the start of the decoding of a second data signal.

10. The receiving apparatus according to claim 1, wherein said controller causes said LDPC decoder to decode said transmission control signal before the completion of the reception thereof and said LDPC decoder decodes said transmission control signal by setting an unreceived bit of said transmission control signal to a value denoting that a probability being 0 and a probability being 1 is 0.5.

11. A receiving method for a receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal, said receiving apparatus having an LDPC decoder configured to decode both of said data signal and said transmission control signal; and
a data signal input buffer arranged before said LDPC decoder and configured to hold said received data signal and a transmission control signal input buffer arranged before said LDPC decoder and configured to hold said received transmission control signal, said receiving method comprising the step of:
selecting at least one of said data signal held in said data signal input buffer and said transmission control signal held in said transmission control signal input buffer as a signal subject to decoding and transmitting the selected signal to said LDPC decoder to decode said selected signal,
wherein said LDPC decoder determines that the decoding has failed if a sequence obtained by decoding said transmission control signal is a value that is not used in a system where said transmission control signal is transmitted.

12. The receiving apparatus according to claim 11, wherein said transmission control signal LDPC decoder is configured as a hard-decision decoder.

13. The receiving apparatus according to claim 11, wherein said transmission control signal LDPC decoder is configured so as to execute operations of a variable node and a check node in serial for every bit.

14. A program stored on a non-transitory computer-readable storage medium for making a computer control a receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal, said receiving apparatus having an LDPC decoder configured to decode both of said data signal and said transmission control signal; and
a data signal input buffer arranged before said LDPC decoder and configured to hold said received data signal and a transmission control signal input buffer arranged before said LDPC decoder and configured to hold said received transmission control signal, said program comprising the step of:
selecting at least one of said data signal held in said data signal input buffer and said transmission control signal held in said transmission control signal input buffer as a signal subject to decoding and transmitting the selected signal to said LDPC decoder to decode said selected signal,
wherein said LDPC decoder determines that the decoding has failed if a sequence obtained by decoding said transmission control signal is a value that is not used in a system where said transmission control signal is transmitted.

15. A receiving apparatus configured to receive, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal, comprising:

a data signal LDPC decoder dedicated to the decoding of said data signal; and
a transmission control signal LDPC decoder dedicated to said transmission control signal,
wherein said transmission control signal LDPC decoder determines that the decoding has failed if a sequence obtained by decoding said transmission control signal is a value that is not used in a system where said transmission control signal is transmitted.

16. The receiving apparatus according to claim 15, wherein said data signal LDPC decoder and said transmission control signal LDPC decoder are configured as a substantially same decoder.

17. The receiving apparatus according to claim 15, further comprising:

a transmission control signal input buffer that is arranged before said transmission control signal LDPC decoder and holds said received transmission control signal.

18. The receiving apparatus according to claim 17, wherein a received value of said transmission control signal is reduced in the number of quantized bits as compared with said data signal and the resultant received value is held in said transmission control signal input buffer.

19. The receiving apparatus according to claim 17, wherein said transmission control signal is an LDPC-coded sequence in which a known signal is added to predetermined control information and is transmitted to said receiving apparatus as a signal with said known signal deleted and said transmission control signal is added with a value denoting that, relative to said signal received by said receiving apparatus, if said known signal is 0, a probability of being 0 is 1 and, if said known signal is 1, a probability of 1 is 1, the resultant transmission control signal being held in said transmission control signal input buffer.

20. The receiving apparatus according to claim 17, wherein said transmission control signal is an LDPC-coded sequence in which a known signal is added to predetermined control information and is transmitted to said receiving apparatus as a signal with said known signal deleted, said transmitted signal is received by said receiving apparatus to be held in said transmission control signal input buffer, and,
if said transmission control signal is selected as said signal subject to decoding, a signal obtained by adding a value denoting that, if said known signal 0, a probability being 0 is 1 and, if said known signal is 1, a probability being 1 is 1 to said signal held in said transmission control signal input buffer is transmitted to said transmission control signal LDPC decoder as said transmission control signal.

21. The receiving apparatus according to claim 17, wherein said transmission control signal is of a series LDPC-coded with a known signal added to predetermined control information and said transmission control signal LDPC decoder handles said known signal of the decoding of said transmission control signal as a value denoting that, if a known signal is 0, a probability being 0 is 1 and, if a known signal is 1, a probability being 1 is 1 with a message of an edge linking to a bit of said known signal.

22. The receiving apparatus according to claim 21, wherein said transmission control signal has a form in which all of said known signals are made up of 0's and said transmission control signal LDPC decoder omits an operation of one of a variable node or a check node of an edge linking to a bit of said known signal with said known signal of the decoding of said transmission control signal.

23. The receiving apparatus according to claim 15, wherein said transmission control signal LDPC decoder starts the decoding of said transmission control signal before the completion of the reception thereof and said transmission control signal LDPC decoder decodes said transmission control signal by setting an unreceived bit of said transmission control signal to a value denoting that a probability being 0 and a probability being 1 is 0.5.

24. A receiving method for a receiving apparatus configured to receive an LDPC (Low Density Parity Check) code for decoding, comprising the step of:

receiving, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal and decoding said received data signal and said received transmission control signal, determining that the decoding has failed if a sequence obtained by decoding said transmission control signal is a value that is not used in a system where said transmission control signal is transmitted.

25. A program stored on a non-transitory computer-readable storage medium for making a computer control a receiving apparatus configured to receive an LDPC (Low Density Parity Check) code for decoding, comprising the step of:

receiving, if a data signal LDPC (Low Density Parity Check)-coded by use of a predetermined parity check matrix for defining an LDPC code and a transmission control signal LDPC-coded by use of a parity check matrix that is one of states of being the same as said predetermined parity check matrix or different from said predetermined parity check matrix come as multiplexed, both of said data signal and said transmission control signal and decode said received data signal and said received transmission control signal and decoding said received data signal and said received transmission control signal, determining that the decoding has failed if a sequence obtained by decoding said transmission control signal is a value that is not used in a system where said transmission control signal is transmitted.

26. A receiving apparatus configured to receive and decode an LDPC (Low Density Parity Check) code, comprising:

a separator configured, if a first signal LDPC-coded by use of a predetermined parity check matrix for defining said LDPC code and a second signal LDPC-coded by use of a parity check matrix that is one of states of being the same as said predetermined parity check matrix or different from said predetermined parity check matrix come as multiplexed with each other, to separate said first signal from said second signal; and an LDPC decoder configured to decode said first signal and said second signal separated from each other by said separator, wherein said LDPC decoder determines that decoding has failed if a sequence obtained by decoding said second signal is a value that is not used in a system where said second signal is transmitted.

27. A receiving method for a receiving apparatus configured to receive and decode an LDPC (Low Density Parity Check) code, comprising the steps of:

separating, if a first signal LDPC-coded by use of a predetermined parity check matrix for defining said LDPC code and a second signal LDPC-coded by use of a parity check matrix that is one of states of being the same as said predetermined parity check matrix or different from said predetermined parity check matrix come as multiplexed with each other, said first signal from said second signal; and decoding said first signal and said second signal separated from each other by said separator determining that decoding has failed if a sequence obtained by decoding said second signal is a value that is not used in a system where said second signal is transmitted.

28. A program stored on a non-transitory computer-readable storage medium for making a computer control a receiving apparatus configured to receive and decode an LDPC (Low Density Parity Check) code, comprising the steps of:

separating, if a first signal LDPC-coded by use of a predetermined parity check matrix for defining said LDPC code and a second signal LDPC-coded by use of a parity check matrix that is one of states of being the same as said predetermined parity check matrix or different from said predetermined parity check matrix come as multiplexed with each other, said first signal from said second signal; and decoding said first signal and said second signal separated from each other by said separator, determining that decoding has failed if a sequence obtained by decoding said second signal is a value that is not used in a system where said second signal is transmitted.

* * * * *